(12) United States Patent
Shinohara et al.

(10) Patent No.: US 9,026,884 B2
(45) Date of Patent: May 5, 2015

(54) DATA PROCESSING DEVICE AND DATA PROCESSING METHOD

(75) Inventors: Yuji Shinohara, Kanagawa (JP); Makiko Yamamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 30 days.

(21) Appl. No.: 14/112,972

(22) PCT Filed: May 17, 2012

(86) PCT No.: PCT/JP2012/062640
§ 371 (c)(1),
(2), (4) Date: Oct. 21, 2013

(87) PCT Pub. No.: WO2012/165161
PCT Pub. Date: Dec. 6, 2012

(65) Prior Publication Data
US 2014/0047295 A1 Feb. 13, 2014

(30) Foreign Application Priority Data
May 27, 2011 (JP) ................. 2011-118755

(51) Int. Cl.
*H03M 13/11* (2006.01)
*H03M 13/25* (2006.01)
(Continued)

(52) U.S. Cl.
CPC ...... *H03M 13/1148* (2013.01); *H03M 13/1165* (2013.01); *H03M 13/1168* (2013.01);
(Continued)

(58) Field of Classification Search
CPC ..................... H03M 13/1102; H03M 13/1165; H03M 13/1148; H03M 13/255
See application file for complete search history.

(56) References Cited

U.S. PATENT DOCUMENTS

2007/0143654 A1* 6/2007 Joyce et al. .................... 714/752
2009/0063929 A1* 3/2009 Jeong et al. .................... 714/752
(Continued)

FOREIGN PATENT DOCUMENTS

EP           2 216 908 A1    8/2010
WO    WO 2009/104319 A1     8/2009
(Continued)

OTHER PUBLICATIONS

Minhan Zheng; Lin Wang; Yuliang Tang, "Shaping gain of LDPC coded-QAM transmitting systems with non-uniform constellation," Communications, Circuits and Systems, 2007. ICCCAS 2007. International Conference on , vol., No., pp. 6,9, Jul. 11-13, 2007.*

(Continued)

*Primary Examiner* — Steve Nguyen
(74) *Attorney, Agent, or Firm* — Oblon, McClelland, Maier & Neustadt, L.L.P.

(57) ABSTRACT

The present technique relates to data processing devices and data processing methods that can increase tolerance for data errors.
In a case where a predetermined LDPC code having a code length of 16200 bits and a code rate of 8/15 is mapped on 256 signal points, and the (#i+1)th bit counted from the uppermost bit among 8×1 sign bits and the (#i+1)th bit counted from the uppermost bit among 8×1 symbol bits of one symbol are expressed as a bit b#i and a bit y#i, respectively, a demultiplexer performs shuffling to assign a bit b0 to a bit y2, a bit b1 to a bit y6, a bit b2 to a bit y1, a bit b3 to a bit y0, a bit y4 to a bit y7, a bit b5 to a bit y5, a bit b6 to a bit y3, and a bit b7 to a bit y4. The present technique can be applied to transmission systems that transmit LDPC codes, for example.

4 Claims, 69 Drawing Sheets

(51) Int. Cl.
*H03M 13/27* (2006.01)
*H03M 13/29* (2006.01)
*H03M 13/35* (2006.01)
*H03M 13/15* (2006.01)

(52) U.S. Cl.
CPC .......... *H03M13/152* (2013.01); *H03M 13/255* (2013.01); *H03M 13/2707* (2013.01); *H03M 13/271* (2013.01); *H03M 13/2906* (2013.01); *H03M 13/356* (2013.01)

(56) References Cited

U.S. PATENT DOCUMENTS

| | | | |
|---|---|---|---|
| 2009/0103649 A1* | 4/2009 | Vare et al. | 375/295 |
| 2009/0217129 A1* | 8/2009 | Myung et al. | 714/752 |
| 2010/0257426 A1* | 10/2010 | Yokokawa et al. | 714/752 |
| 2010/0275101 A1 | 10/2010 | Yokokawa et al. | |
| 2010/0290561 A1* | 11/2010 | Ko et al. | 375/298 |
| 2011/0103502 A1* | 5/2011 | Vitale et al. | 375/261 |
| 2013/0166992 A1 | 6/2013 | Shinohara et al. | |
| 2013/0227378 A1 | 8/2013 | Yamamoto et al. | |
| 2013/0254617 A1 | 9/2013 | Shinohara et al. | |
| 2013/0290816 A1 | 10/2013 | Shinohara et al. | |
| 2013/0297992 A1 | 11/2013 | Yamamoto et al. | |
| 2013/0305113 A1 | 11/2013 | Shinohara et al. | |

FOREIGN PATENT DOCUMENTS

| | | |
|---|---|---|
| WO | WO 2009/107990 A2 | 9/2009 |
| WO | WO 2009/116204 A1 | 9/2009 |

OTHER PUBLICATIONS

U.S. Appl. No. 14/111,045, filed Oct. 10, 2013, Shinohara, et al.
International Search Report issued Jun. 12, 2012 in PCT/JP2012/062640.
U.S. Appl. No. 14/386,830, filed Sep. 22, 2014, Shinohara, et al.
U.S. Appl. No. 14/386,868, filed Sep. 22, 2014, Shinohara, et al.
Extended European Search Report issued Aug. 26, 2014 in Patent Application No. 12794002.1.
DVB Organization: "Updated Data for New 16k LDPC Codes" Digital Video Broadcasting, XP017834323, Feb. 2011, 6 pages.
DVB Organization: "Demux Proposal for NGH" Digital Video Broadcasting, XP017836633, Jul. 2011, 17 pages.
DVB Organization: "New Demux Parameters" Digital Video Broadcasting, XP017836613, Jul. 2011, 19 pages.
DVB Organization: "European Standard" Digital Video Broadcasting, Draft ETSI EN 302 755 V1.3.1, XP17839127, 2011.
"Digital Video Broadcasting (DVB): Frame structure channel coding and modulation for a second generation digital terrestrial television broadcasting system (DVB-T2)" European Standards, European Telecommunications Standards Institute (ETSI), ETSI EN 302 755 V1.2.1, XP014061784, Feb. 2011, 177 pages.

* cited by examiner

FIG. 3

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

CHECK NODE

VARIABLE NODE

PARITY MATRIX $H_T$

FIG. 13

| Nominal CODING RATE | N=64800 | | | | N=16200 | | | |
|---|---|---|---|---|---|---|---|---|
| | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | — | — | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | — | — | — | — |

COLUMN NUMBERS OF RESPECTIVE COLUMN WEIGHTS

FIG. 25

| NECESSARY MEMORY COLUMN NUMBER mb | b=1 (FIRST THROUGH THIRD SHUFFLING METHODS) | b=2 (FOURTH SHUFFLING METHOD) | WRITE START POSITION IN EACH OF mb COLUMNS | | | | | | | | | | | | | | | | | | | | | | |
|---|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 0 | 2 | 2 | 3 | 4 | 4 | 5 | 5 | 7 | 8 | 9 | | | | | | | | | | | | |
| 16 | | 256QAM | 0 | 2 | 2 | 2 | 2 | 3 | 7 | 15 | 16 | 20 | 22 | 22 | 27 | 27 | 28 | 32 | | | | | | | | |
| 20 | | 1024QAM | 0 | 1 | 3 | 4 | 5 | 6 | 6 | 9 | 13 | 14 | 14 | 16 | 21 | 21 | 23 | 25 | 25 | 26 | 28 | 30 | | | | |
| 24 | | 4096QAM | 0 | 5 | 8 | 8 | 8 | 8 | 10 | 10 | 10 | 12 | 13 | 16 | 17 | 19 | 21 | 22 | 23 | 26 | 37 | 39 | 40 | 41 | 41 | 41 |

FIG. 26

| NECESSARY MEMORY COLUMN NUMBER mb | b=1 (FIRST THROUGH THIRD SHUFFLING METHODS) | b=2 (FOURTH SHUFFLING METHOD) | WRITE START POSITION IN EACH OF mb COLUMNS | | | | | | | | | | | | | | | | | | | | | | |
|---|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 0 | | | | | | | | | | | | | | | | | | | | | | | |
| 4 | 16QAM | QPSK | 0 | 2 | 3 | 3 | | | | | | | | | | | | | | | | | | | | | |
| 6 | 64QAM | | 0 | 0 | 2 | 3 | 7 | 7 | | | | | | | | | | | | | | | | | | | |
| 8 | 256QAM | 16QAM | 0 | 0 | 0 | 1 | 7 | 20 | 20 | 21 | | | | | | | | | | | | | | | | | |
| 10 | 1024QAM | | 0 | 1 | 2 | 2 | 3 | 3 | 4 | 4 | 5 | 7 | | | | | | | | | | | | | | | |
| 12 | 4096QAM | 64QAM | 0 | 0 | 0 | 2 | 2 | 2 | 3 | 3 | 3 | 6 | 7 | 7 | | | | | | | | | | | | | |
| 20 | | 1024QAM | 0 | 0 | 0 | 2 | 2 | 2 | 2 | 2 | 5 | 5 | 5 | 5 | 5 | 7 | 7 | 7 | 7 | 8 | 8 | 10 | | | | | |
| 24 | | 4096QAM | 0 | 0 | 0 | 0 | 0 | 0 | 0 | 1 | 1 | 1 | 2 | 2 | 2 | 3 | 7 | 7 | 9 | 9 | 10 | 10 | 10 | 10 | 10 | 10 | 11 |

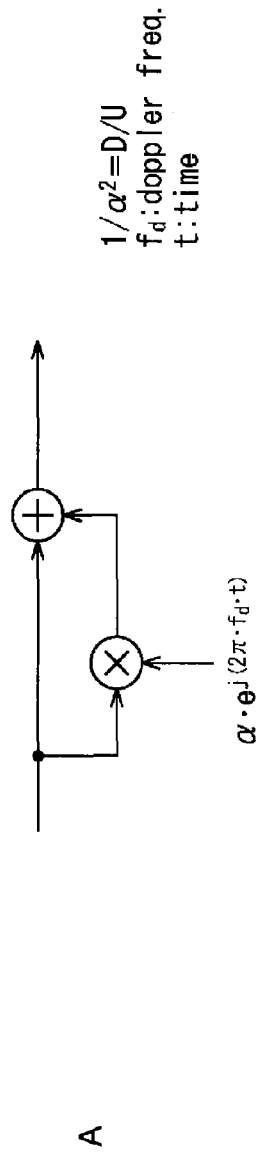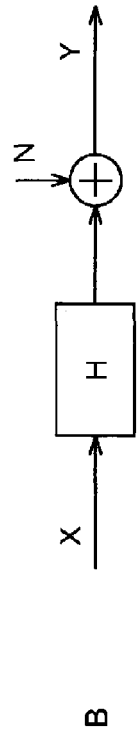
FIG. 28

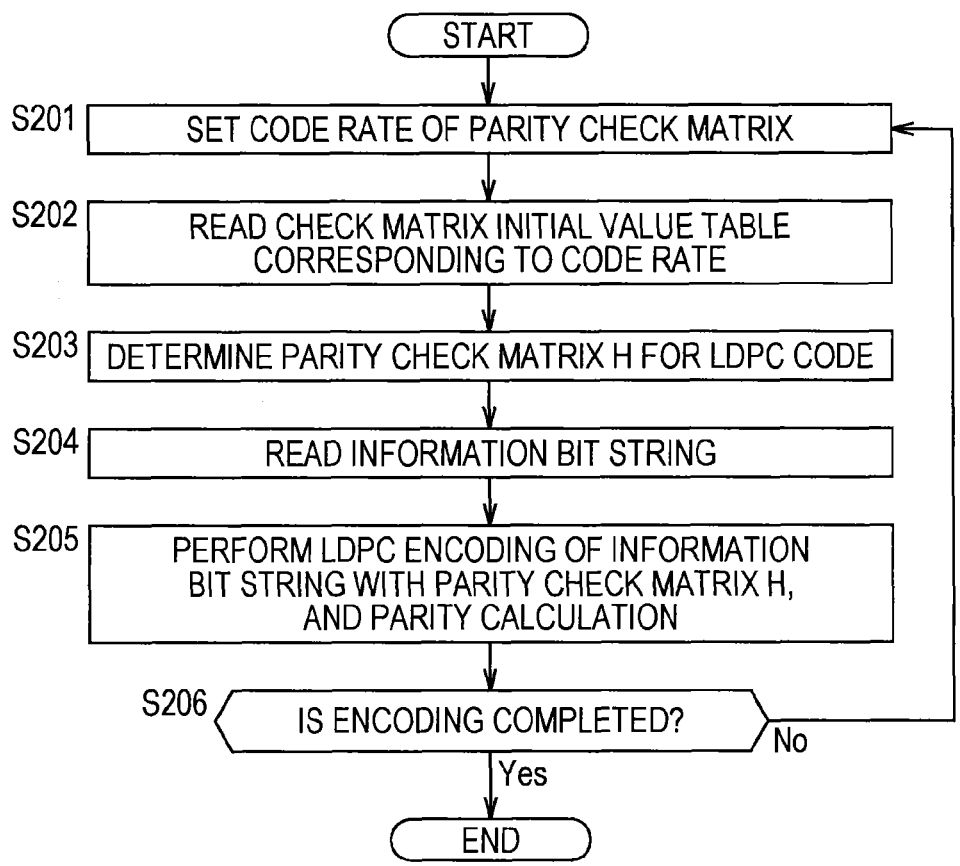

FIG. 35

CHECK MATRIX INITIAL VALUE TABLE FOR N=16200 AND r=1/5

CHECK MATRIX INITIAL VALUE TABLE FOR N=16200 AND r=4/15

```
CHECK MATRIX INITIAL VALUE TABLE FOR N=16200 AND r=1/3
 77  182   354   816   916   958  1055  1261  1553  1874  2211  2490  2999  3267  3975  5018  5952  6198  6343  7027  7045  7751  7923  8649  9010  9022
9380 9956 10204 10339
   5  612  1724  1737  1911  1914  2108  2496  2809  4037  5838  6950  8049  8081  9480  9512  9724  9745  9952 10203 10207 10270 10463 10486
10499 10515 10663 10678 10706 10741
  22  345  1938  3636  4016  5293  6424  6589  7426  7547  8102  9038  9095  9127  9174  9239  9279  9810 10347 10403 10408 10591 10610 10632
10660 10721 10754 10765 10773 10791
  17 3435 7278 9952
1442 2518 3132 7541
5464 9226 10615 10658
 426 2473 8459 10750
1862 2111 6236 10546
1010 9922 10591 10735
  29 2663 6553 10749
5652 7265 7789 10708
4534 5497 10784
 345 3027 10761
2823 4127 10668
  84 4800 9068
```

FIG. 38

CHECK MATRIX INITIAL VALUE TABLE FOR N=16200 AND r=2/5

CHECK MATRIX INITIAL VALUE TABLE FOR N=16200 AND r=4/9

CHECK MATRIX INITIAL VALUE TABLE FOR N=16200 AND r=7/15

CHECK MATRIX INITIAL VALUE TABLE FOR N=16200 AND r=8/15

```
┌─ CHECK MATRIX INITIAL VALUE TABLE FOR N=16200 AND r=3/5 ──────────┐
│                                                                    │
│  41  588 1367 1831 1964 3424 3732 4590 4677 5455 5542 5627 6415   │
│  904 1706 2800 3732 3783 4217 4507 4999 6010 6218 6282 6363 6456  │
│  356 1871 2216 2629 2994 3719 5194 5585 6012 6273 6393 6457 6474  │
│  1676 2419 2604 3939 4186 5080 5400 5552 5971 6023 6324 6442 6445 │
│  3 770 2770 3457 3815 4253 4512 4671 5390 5393 5818 5978 6441     │
│  491 548 1033 1042 1187 3816 4378 4956 5049 5649 5684 6177 6475   │
│  1489 2817 3377 3716 4229 4512 4664 5065 5257 5477 5550 5950 6447 │
│  1546 2444 4684                                                    │
│  15 3546 6220                                                      │
│  1427 6199 6430                                                    │
│  103 3629 5526                                                     │
│  1330 6150 6255                                                    │
│  363 5660 6422                                                     │
│  4069 5586 5885                                                    │
│  722 820 2823                                                      │
│  204 2820 6181                                                     │
│  3710 6077 6106                                                    │
│  2655 5428 6264                                                    │
│  1850 5989 6245                                                    │
│  2701 5315 6477                                                    │
│  1286 4462 6159                                                    │
│  3356 4359 4805                                                    │
│  13 4416 4800                                                      │
│  3103 4357 4685                                                    │
│  1163 5127 6435                                                    │
│  164 3202 3934                                                     │
│  36 230 3514                                                       │
│                                                                    │
└────────────────────────────────────────────────────────────────────┘
```

FIG. 43 — CHECK MATRIX INITIAL VALUE TABLE FOR N=16200 AND r=2/3

```
76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742
```

| CODE RATE | MINIMUM CYCLE LENGTH | PERFORMANCE THRESHOLD VALUE (Eb/No) |
|---|---|---|
| 1/5 | 8 | 0.15 |
| 4/15 | 8 | −0.21 |
| 1/3 | 6 | −0.01 |
| 2/5 | 6 | 0.01 |
| 4/9 | 6 | 0.17 |
| 7/15 | 6 | 0.36 |
| 8/15 | 6 | 0.64 |
| 3/5 | 8 | 1.00 |
| 2/3 | 6 | 1.35 |

FIG. 48

| rate | X | KX | Y1 | KY1 | Y2 | KY2 | M |
|---|---|---|---|---|---|---|---|
| 1/5 | 36 | 720 | 5 | 360 | 4 | 2160 | 12960 |
| 4/15 | 21 | 1080 | 4 | 2160 | 3 | 1080 | 11880 |
| 1/3 | 30 | 1080 | 4 | 2880 | 3 | 1440 | 10800 |
| 2/5 | 32 | 1080 | 4 | 3240 | 3 | 2160 | 9720 |
| 4/9 | 25 | 1440 | 4 | 1440 | 3 | 4320 | 9000 |
| 7/15 | 24 | 1440 | 4 | 2880 | 3 | 3240 | 8640 |
| 8/15 | 21 | 1800 | 4 | 1800 | 3 | 5040 | 7560 |
| 3/5 | 13 | 2520 | 3 | 7200 | — | 0 | 6480 |
| 2/3 | 18 | 1440 | 4 | 5400 | 3 | 3960 | 5400 |

FIG. 64

DATA PROCESSING DEVICE AND DATA PROCESSING METHOD

TECHNICAL FIELD

The present technique relates to data processing devices and data processing methods, and more particularly, to a data processing device and a data processing method that can improve tolerance for data errors, for example.

BACKGROUND ART

LDPC (Low Density Parity Check) codes have high error correction capabilities, and are now beginning to be widely used in transmission systems including digital satellite broadcasting such as DVB (Digital Video Broadcasting)-S.2, which is implemented in Europe, for example (see Non-Patent Document 1, for example). Also, the use of LDPC codes in next-generation digital terrestrial broadcasting is being considered.

Recent studies are making it clearer that LDPC codes having longer code lengths have capabilities closer to the Shannon limit, like turbo codes and the like. Also, an LDPC code is characterized in that the minimum distance is proportional to its code length. In view of this, features of an LDPC code have the advantages that a block error probability is high, and so-called error floor phenomena hardly occur, which are observed in decoding characteristics of turbo codes and the like.

In the following, such LDPC codes are described in detail. LDPC codes are linear codes, and are not necessarily binary codes. In this description, however, LDPC codes are described as binary codes.

The most significant feature of an LDPC code is that the parity check matrix defining the LDPC code is sparse. Here, a sparse matrix is a matrix that has a very small number of matrix elements "1" (or a matrix in which most elements are "0").

FIG. 1 shows an example of a parity check matrix H of an LDPC code.

In the parity check matrix H shown in FIG. 1, the weight in each column (the column weight) (the number of elements "1") is "3", and the weight in each row (the row weight) is "6".

In encoding with the use of an LDPC code (LDPC encoding), a generator matrix G is generated based on the parity check matrix H, for example, and the generator matrix G is multiplied binary information bits, to generate a code word (an LDPC code).

Specifically, an encoding device that performs LDPC encoding first calculates such a generator matrix G as to satisfy the equation, $GH^T=0$, with respect to a transposed matrix $H^T$ of the parity check matrix H. Here, if the generator matrix G is a K×N matrix, the encoding device multiplies the generator matrix G by a bit string (a vector u) of information bits consisting of K bits, to generate a code word c (=uG) consisting of N bits. The code word (an LDPC code) generated by the encoding device is received on a receiving side via a predetermined channel.

Decoding of an LDPC code can be performed by using a message passing algorithm that is an algorithm suggested as Probabilistic Decoding by Gallager and is based on the belief propagation in a so-called Tanner graph formed with variable nodes (also referred to as message nodes) and check nodes. Hereinafter, the variable nodes and the check nodes will also be appropriately referred to simply as nodes.

FIG. 2 shows the procedures for decoding an LDPC code.

It should be noted that a real value (reception LLR) representing the log likelihood ratio indicating the likelihood that the value of the ith sign bit in an LDPC code (one code word) received on the receiving side is "0" will be also referred to as a received value $u_{0i}$, where appropriate. Also, a message that is output from a check node is represented by $u_j$, and a message that is output from a variable node is represented by $v_i$.

First, in decoding of an LDPC code, as shown in FIG. 2, the LDPC code is received in step S11. A message (a check node message) $u_j$ is initialized to "0", and a variable k that is an integer as a repetitive processing counter is initialized to "0". The operation then moves on to step S12. In step S12, based on the received value $u_{0i}$ obtained by receiving the LDPC code, the calculation shown in the equation (1) (a variable node calculation) is performed, to determine a message (a variable node message) $v_i$. Further, based on the message $v_i$, a calculation (a check node calculation) shown in the equation (2) is performed, to determine a message $u_j$.

[Mathematical Formula 1]

$$v_i = u_{0i} + \sum_{i=1}^{d_v-1} u_j \quad (1)$$

[Mathematical Formula 2]

$$\tanh\left(\frac{u_j}{2}\right) = \prod_{i=1}^{d_c-1} \tanh\left(\frac{v_i}{2}\right) \quad (2)$$

In the equation (1) and the equation (2), $d_v$ and $d_c$ represent parameters that can be arbitrarily selected and represent the numbers of elements "1" in the vertical direction (column) and the horizontal direction (row) in the parity check matrix H, respectively. In the case of a (3, 6) code, for example, $d_v$ is 3, and $d_c$ is 6.

In the variable node calculation shown in the equation (1) and the check node calculation shown in the equation (2), messages that are input from the edges (the lines each connecting a variable node and a check node) that are about to output messages are not subjected to the calculations. Therefore, the range of calculation is 1 to $d_v-1$ or 1 to $d_c-1$. In practice, the check node calculation shown in the equation (2) is performed by preparing beforehand a table of a function R($v_1$, $v_2$) shown in the equation (3) defined by one output for the two inputs $v_1$ and $v_2$, and continuously (recursively) using the table as shown in the equation (4).

[Mathematical Formula 3]

$$x = 2\tanh^{-1}[\tanh(v_1/2)\tanh(v_2/2)] = R(v_1, v_2) \quad (3)$$

[Mathematical Formula 4]

$$u_j = R(v_1, R(v_2 R(v_3, \ldots R(v_{d_0-2}, v_{d_0-1})))) \quad (4)$$

Further, in step S12, the variable k is incremented only by "1", and the operation then moves on to step S13. In step S13, a check is made to determine whether the variable k is larger than a predetermined number C of repetitions of decoding. If the variable k is determined not to be larger than C in step S13, the operation returns to step S12, and the same procedures as above are repeated.

If the variable k is determined to be larger than C in step S13, the operation moves on to step S14, and the calculation shown in the equation (5) is performed to determine the message $v_i$ as a decoding result to be output eventually. The message $v_i$ is then output, and the LDPC code decoding operation comes to an end.

[Mathematical Formula 5]

$$v_i = u_{0i} + \sum_{j=1}^{d_v} u_j \qquad (5)$$

Here, the calculation shown in the equation (5) is performed by using the messages $u_j$ from all the edges connected to the variable nodes, unlike the variable node calculation shown in the equation (1).

FIG. 3 shows an example of the parity check matrix H of a (3, 6) LDPC code (a code rate of 1/2, a code length of 12).

In the parity check matrix H shown in FIG. 3, the column weight is 3, and the row weight is 6, as in the case illustrated in FIG. 1.

FIG. 4 shows a Tanner graph of the parity check matrix H shown in FIG. 3.

In FIG. 4, each "+" represents a check node, and each "=" represents a variable node. The check nodes and the variable nodes correspond to the rows and the columns, respectively, of the parity check matrix H. The connecting lines between the check nodes and the variable nodes are the edges, and are equivalent to the elements "1" of the parity check matrix.

Specifically, when the element in the jth row and the ith column in the parity check matrix is 1, the variable node (represented by "=") that is the ith from the top, and the check node (represented by "+") that is the jth from the top are connected by an edge in FIG. 4. The edge indicates that the sign bit corresponding to the variable node has a constraint corresponding to the check node.

According to Sum Product Algorithm, which is a method of decoding LDPC codes, a variable node calculation and a check node calculation are repeatedly performed.

FIG. 5 shows a variable node calculation to be performed at a variable node.

At the variable node, the message $v_i$ corresponding to the edge to be calculated can be determined through the variable node calculation shown in the equation (1) using the messages $u_1$ and $u_2$ from the rest of the edges connected to the variable node, and the received value $u_{0i}$. The message corresponding to any of the other edges can be determined in the same manner as above.

FIG. 6 shows a check node calculation to be performed at a check node.

The check node calculation shown in the equation (2) can also be expressed by the equation (6) using the relationship expressed by the equation, $a \times b = \exp\{\ln(|a|)+\ln(|b|)\} \times \text{sign}(a) \times \text{sign}(b)$. Here, $\text{sign}(x)$ is 1 when $x \geq 0$, and is $-1$ when $x<0$.

[Mathematical Formula 6]

$$\begin{aligned} u_j &= 2\tanh^{-1}\left(\prod_{i=1}^{d_c-1} \tanh\left(\frac{v_i}{2}\right)\right) \\ &= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right] \\ &= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right] \end{aligned} \qquad (6)$$

When $x \geq 0$, the equation, $\phi^{-1}(x) = 2\tan h^{-1}(e^{-x})$, is satisfied where the function $\phi(x)$ is defined as $\phi(x) = \ln(\tan h(x/2))$. Accordingly, the equation (6) can be transformed into the equation (7).

[Mathematical Formula 7]

$$u_j = \phi^{-1}\left(\sum_{i=1}^{d_c-1} \phi(|v_i|)\right) \times \prod_{i=1}^{d_c-1} \text{sign}(v_i) \qquad (7)$$

At the check node, the check node calculation shown in the equation (2) is performed according to the equation (7).

Specifically, at the check node, the message $u_j$ corresponding to the edge to be calculated can be determined through the check node calculation shown in the equation (7) using the messages $v_1$, $v_2$, $v_3$, $v_4$, and $v_5$ from the other edges connected to the check node, as shown in FIG. 6. The message corresponding to any of the other edges can be determined in the same manner as above.

It should be noted that the function $\phi(x)$ in the equation (7) can be expressed by the equation, $\phi(x) = \ln((e^x+1)/(e^x-1))$, and $\phi(x) = \phi^{-1}(x)$ is satisfied when $x>0$. When the functions $\phi(x)$ and $\phi^{-1}(x)$ are implemented in hardware, LUTs (Look Up Tables) may be used, but both tables are identical LUTs.

CITATION LIST

Non-Patent Document

NON-PATENT DOCUMENT 1: DVB-S.2: ETSI EN 302 307 V1.1.2 (2006-06)

SUMMARY OF THE INVENTION

Problems to be Solved by the Invention

LDPC codes are used in DVB-S.2, which is the standards for digital satellite broadcasting, and in DVB-T.2, which is the standards for digital terrestrial broadcasting. LDPC codes are also planned to be used in DVB-C.2, which is the standards for next-generation CATV (Cable Television) digital broadcasting.

In digital broadcasting compliant with DVB standards such as DVB-S.2, an LDPC code is turned (symbolized) into symbols of orthogonal modulation (digital modulation) such as QPSK (Quadrature Phase Shift Keying), and the symbols mapped on signal points are transmitted.

In the symbolization of an LDPC code, the sign bits of the LDPC code are shuffled two or more sign bits at a time, and the shuffled sign bits serve as symbol bits.

There are various kinds of methods suggested as methods of shuffling sign bits to symbolize LDPC codes, and some of them are specified in DVB-T.2, for example.

Meanwhile, DVB-T.2 is the standards for digital broadcasting intended for fixed terminals such as television receivers placed in houses, and might not be suitable for digital broadcasting intended for portable terminals.

Specifically, portable terminals need to have smaller circuit sizes than fixed terminals, and need to be designed to consume less power. Therefore, to reduce the load required in operations such as decoding of LDPC codes in each portable terminal in the digital broadcasting for portable terminals, the number of repetitions of decoding (the number C of repetitions of decoding) of each LDPC code, the code length of each LDPC code, and the like might be restricted to smaller values than those in the case of the digital broadcasting for fixed terminals.

Under such restrictions, a certain level of tolerance for errors still needs to be maintained.

The present technique has been made in view of such circumstances, and is to enable data such as LDPC codes to have a higher tolerance for errors.

Solutions to Problems

A data processing device/method of a first aspect of the present technique includes: an encoding unit/step that performs LDPC encoding to generate an LDPC code having a code length of 16200 bits and a code rate of 8/15 based on a parity check matrix for LDPC codes; and a shuffling unit/step that replaces sign bits of the LDPC code encoded by the encoding unit/step with symbol bits of a symbol corresponding to one of 256 signal points defined by 256QAM. The LDPC code encoded by the encoding unit/step includes information bits and parity bits, and the parity check matrix includes an information matrix portion corresponding to the information bits and a parity matrix portion corresponding to the parity bits. The information matrix portion is represented by a check matrix initial value table, and the check matrix initial value table is a table that shows positions of elements "1" of the information matrix portion at intervals of 360 columns, and contains 32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464

The shuffling unit/step replaces a bit b0 with a bit y2, a bit b1 with a bit y6, a bit b2 with a bit y1, a bit b3 with a bit y0, a bit b4 with a bit y7, a bit b5 with a bit y5, a bit b6 with a bit y3, and a bit b7 with a bit y4, where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i.

In the above described first aspect, LDPC encoding to generate an LDPC code having a code length of 16200 bits and a code rate of 8/15 is performed based on a parity check matrix for LDPC codes, and sign bits of the LDPC code are replaced with symbol bits of a symbol corresponding to one of 256 signal points defined by 256QAM. The LDPC code includes information bits and parity bits, and the parity check matrix includes an information matrix portion corresponding to the information bits and a parity matrix portion corresponding to the parity bits. The information matrix portion is represented by a check matrix initial value table, and the check matrix initial value table is a table that shows positions of elements "1" of the information matrix portion at intervals of 360 columns, and contains 32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464

In a case where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i, a bit b0 is replaced with a bit y2, a bit b1 is replaced with a bit y6, a bit b2 is replaced with a bit y1, a bit b3 is replaced with a bit y0, a bit b4 is replaced with a bit y7, a bit b5 is replaced with a bit y5, a bit b6 is replaced with a bit y3, and a bit b7 is replaced with a bit y4.

A data processing device/method of a second aspect of the present technique includes: an inverse shuffling unit/step that replaces symbol bits of a symbol corresponding to one of 256 signal points defined by 256QAM with sign bits of an LDPC code having a code length of 16200 bits and a code rate of 8/15; and a decoding unit/step that decodes the LDPC code based on a parity check matrix for LDPC codes after the LDPC code is shuffled by the inverse shuffling unit/step. The inverse shuffling unit/step replaces a bit y2 with a bit b0, a bit y6 with a bit b1, a bit y1 with a bit b2, a bit y0 with a bit b3, a bit y7 with a bit b4, a bit y5 with a bit b5, a bit y3 with a bit b6, and a bit y4 with a bit b7, where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i. The LDPC code includes information bits and parity bits, and the parity check matrix includes an information matrix portion corresponding to the information bits and a parity matrix portion corresponding to the parity bits. The information matrix portion is represented by a check matrix initial value table, and the check matrix initial value table is a table that shows positions of elements "1" of the information matrix portion at intervals of 360 columns, and contains 32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464

In the above described second aspect, symbol bits of a symbol corresponding to one of 256 signal points defined by 256QAM are replaced with sign bits of an LDPC code having a code length of 16200 bits and a code rate of 8/15, and the shuffled LDPC code is decoded based on a parity check matrix for LDPC codes. The inverse shuffling unit/step replaces a bit y2 with a bit b0, a bit y6 with a bit b1, a bit y1 with a bit b2, a bit y0 with a bit b3, a bit y7 with a bit b4, a bit y5 with a bit b5, a bit y3 with a bit b6, and a bit y4 with a bit b7, where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i. The LDPC code includes information bits and parity bits, and the parity check matrix includes an information matrix portion corresponding to the information bits and a parity matrix portion corresponding to the parity bits. The information matrix portion is represented by a check matrix initial value table, and the check matrix initial value table is a table that shows positions of elements "1" of the information matrix portion at intervals of 360 columns, and contains 32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464

A data processing device may be an independent device, or may be an internal block in a single device.

Effects of the Invention

According to the present technique, tolerance for errors can be increased.

BRIEF DESCRIPTION OF DRAWINGS

FIG. 3 is a diagram showing an example of the parity check matrix of an LDPC code.

FIG. 13 is a diagram for explaining the parity check matrix of an LDPC code specified in the DVB-S.2 standards.

FIG. 25 is a diagram showing the required number of columns for column twist interleaving in a memory 31, and the addresses of write start positions.

FIG. 26 is a diagram showing the required number of columns for column twist interleaving in the memory 31, and the addresses of write start positions.

FIG. 28 is a diagram showing a model of a channel used in a simulation.

FIG. 32 is a flowchart for explaining an operation of the LDPC encoder 115.

FIG. 33 is a diagram showing an example of a check matrix initial value table for a code rate of 1/4 and a code length of 16200.

FIG. 35 is a diagram showing an example of a check matrix initial value table for a code rate of 1/5 and a code length of 16200.

FIG. 36 is a diagram showing an example of a check matrix initial value table for a code rate of 4/15 and a code length of 16200.

FIG. 37 is a diagram showing an example of a check matrix initial value table for a code rate of 1/3 and a code length of 16200.

FIG. 38 is a diagram showing an example of a check matrix initial value table for a code rate of 2/5 and a code length of 16200.

FIG. 39 is a diagram showing an example of a check matrix initial value table for a code rate of 4/9 and a code length of 16200.

FIG. 40 is a diagram showing an example of a check matrix initial value table for a code rate of 7/15 and a code length of 16200.

FIG. 41 is a diagram showing an example of a check matrix initial value table for a code rate of 8/15 and a code length of 16200.

FIG. 42 is a diagram showing an example of a check matrix initial value table for a code rate of 3/5 and a code length of 16200.

FIG. 43 is a diagram showing an example of a check matrix initial value table for a code rate of 2/3 and a code length of 16200.

FIG. 48 is a diagram for explaining the parity check matrix of an LDPC code having the code length of 16200.

FIG. 64 is a diagram showing an example of the parity check matrix of an LDPC code.

MODE FOR CARRYING OUT THE INVENTION

Figure 7:
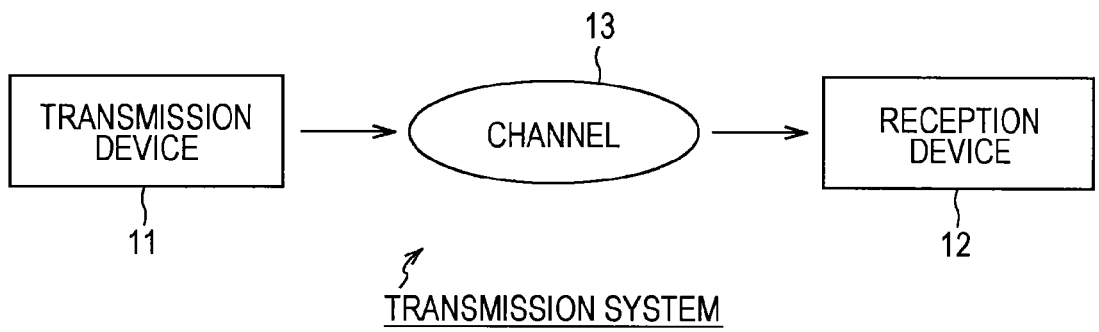
FIG. 7 is a diagram showing an example structure of an embodiment of a transmission system to which the present technique is applied.

Example Structure of a Transmission System to which the Present Technique is Applied FIG. 7 shows an example structure of an embodiment of a transmission system to which the present technique is applied (a "system" means a logical assembly of devices, and the devices with respective structures are not necessarily placed in the same housing).

In FIG. 7, the transmission system includes a transmission device 11 and a reception device 12.

The transmission device 11 performs transmission (broadcasting) (delivery) of shows directed to fixed terminals and portable terminals. Specifically, the transmission device 11 encodes transmission target data such as image data and audio data as shows directed to fixed terminals and portable terminals into LDPC codes, and transmits the LDPC codes via a channel 13 of ground waves, for example.

The reception device 12 is a portable terminal, for example. The reception device 12 receives the LDPC codes transmitted from the transmission device 11 via the channel 13, and decodes the LDPC codes into the target data before outputting the target data.

Here, the LDPC codes used in the transmission system shown in FIG. 7 are known for their extremely high performance in AWGN (Additive White Gaussian Noise) channels.

However, burst errors and erasures might occur in the channel 13 of ground waves or the like. For example, in an OFDM (Orthogonal Frequency Division Multiplexing) system, there are times when the power of a certain symbol becomes zero (erasure) in accordance with a delay of an echo (a path other than the main path) in a multipath environment in which the D/U (Desired to Undesired ratio) is 0 dB (the power of Undesired or the echo is equal to the power of Desired or the main path).

Also, when the D/U is 0 dB in the case of a flutter (a channel in which the delay is zero and has an echo at a Doppler frequency added thereto), the power of the entire OFDM symbols at a certain time might become zero (erasure) due to the Doppler frequency.

Further, on the side of the reception device 12, there are cases where burst errors occur due to the conditions of the line from a reception unit (not shown) such as an antenna that receives signals from the transmission device 11 to the reception device 12, and instability of the power source for the reception device 12.

Figure 1:
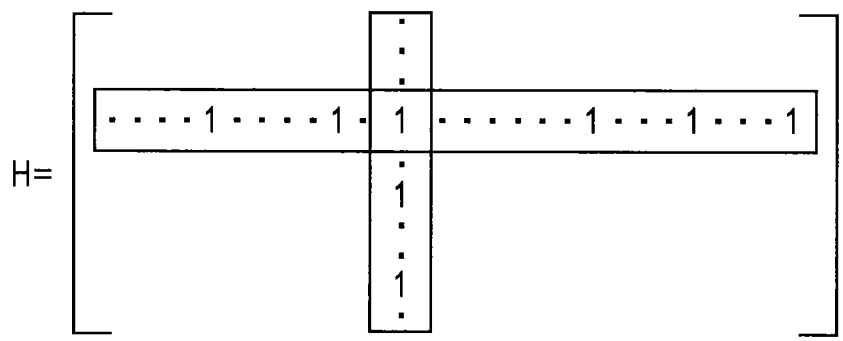
FIG. 1 is a diagram for explaining a parity check matrix H of an LDPC code.
Figure 2:
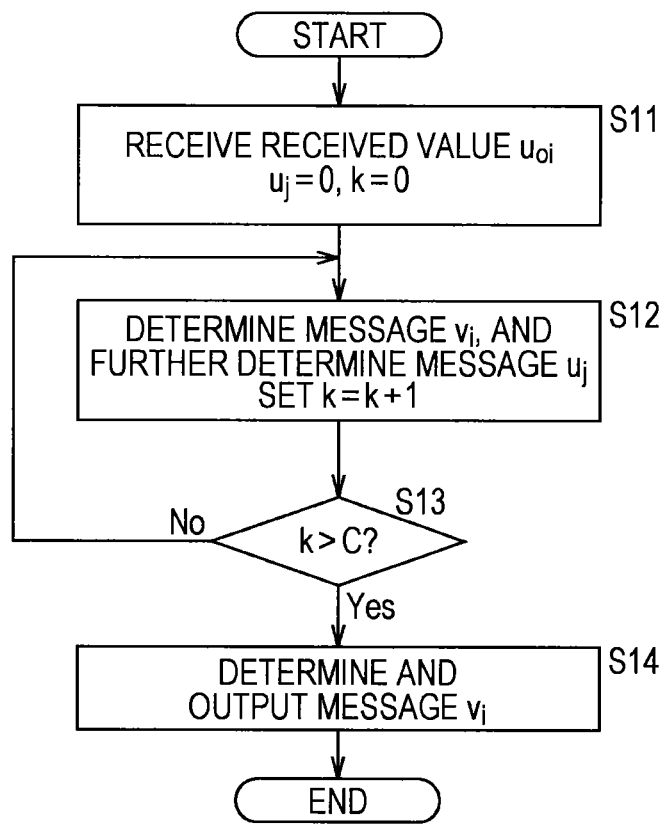
FIG. 2 is a flowchart for explaining the procedures for decoding an LDPC code.
Figure 4:
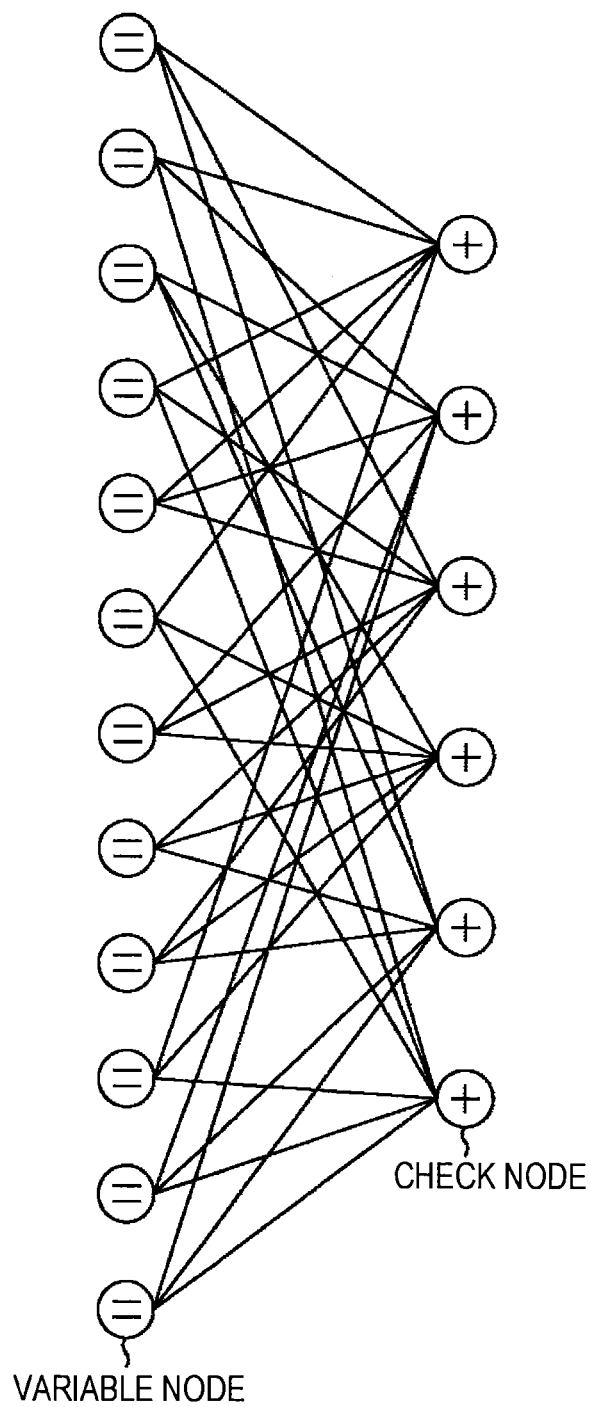
FIG. 4 is a diagram showing a Tanner graph of a parity check matrix.
Figure 5:
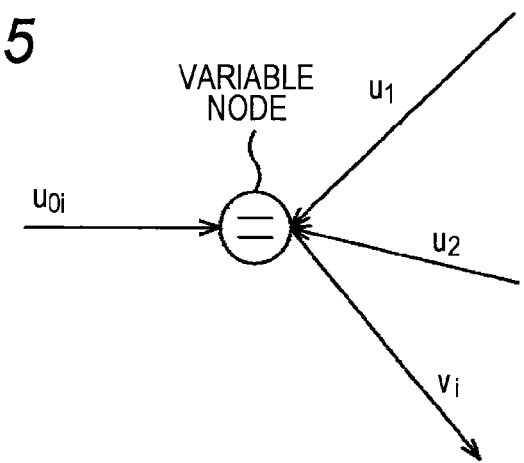
FIG. 5 is a diagram showing a variable node.
Figure 6:
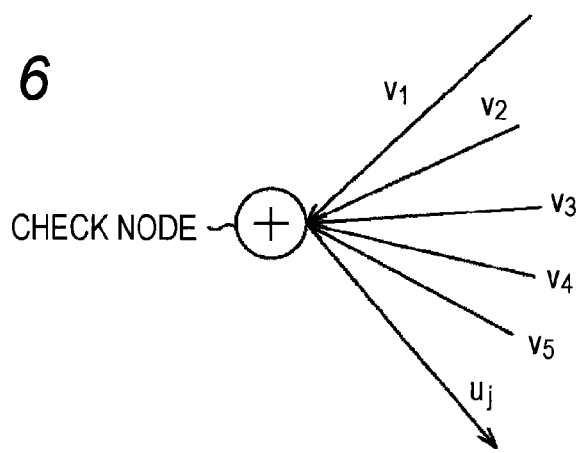
FIG. 6 is a diagram showing a check node.

In decoding an LDPC code, on the other hand, in a row of a parity check matrix H or at the variable node corresponding to a sign bit of the LDPC code, the variable node calculation shown in the equation (1) involving the addition of (the received value $u_{0i}$ of) the sign bit of the LDPC code is performed, as already described with reference to FIG. 5. Therefore, if an error occurs in the sign bit used in the variable node calculation, accuracy of the resultant message becomes poorer.

In decoding an LDPC code, the check node calculation shown in the equation (7) is performed at a check node by using messages determined at the variable nodes connected to the check node. Therefore, if the number of check nodes that cause simultaneous errors (including erasures) at connected variable nodes (or in the sign bits of LDPC codes corresponding to the variable nodes) becomes larger, decoding performance is degraded.

That is, when erasures simultaneously occur in two or more variable nodes connected to a check node, the check node returns, to all the variable nodes, a message indicating that the probability of the value being "0" and the probability of the value being "1" are equal to each other. In this case, the check node that returns the message indicating the equal probabilities does not contribute to one decoding operation (one set of a variable node calculation and a check node calculation). As a result, the number of repetitions of a decoding operation needs to be increased, and decoding performance is degraded. Further, the power consumption by the reception device 12 that decodes LDPC codes increases.

In view of this, the transmission system shown in FIG. 7 improves tolerance for burst errors and erasures while maintaining high performance in AWGN channels.

[Example Structure of Transmission Device 11]

Figure 8:
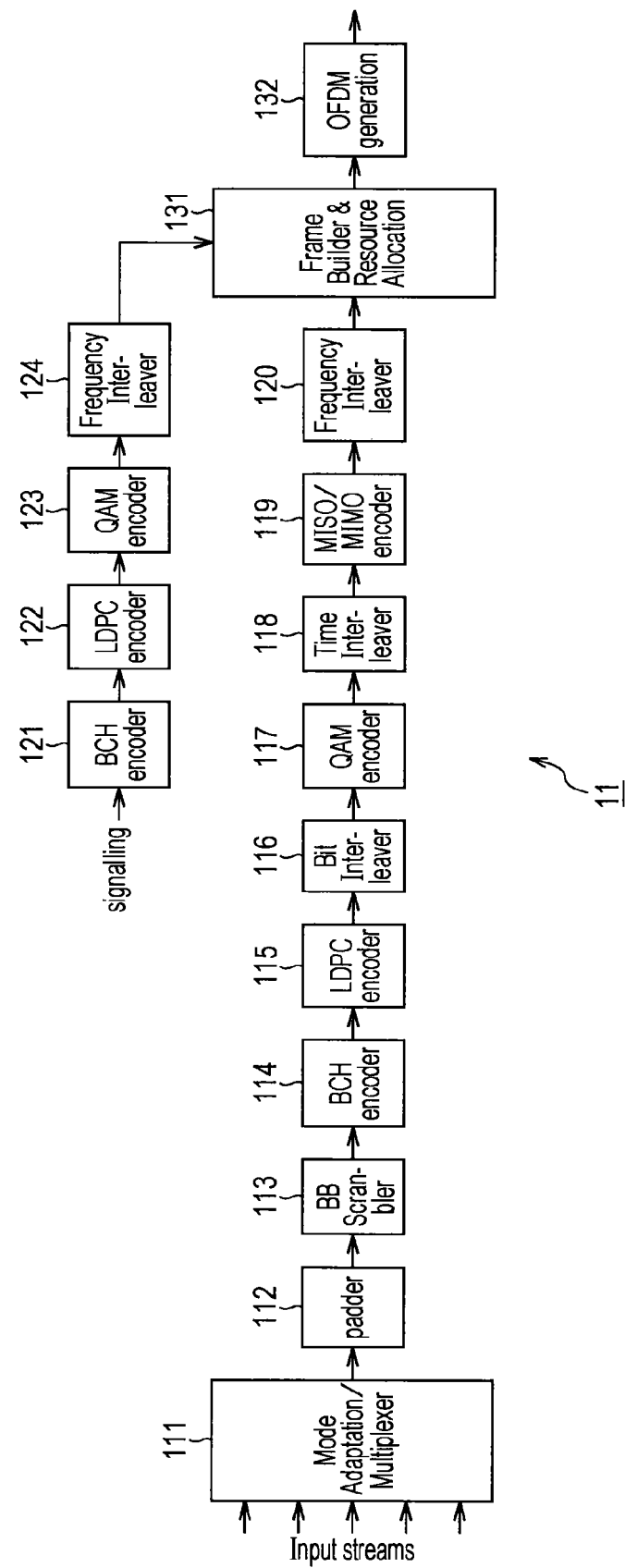
FIG. 8 is a block diagram showing an example structure of a transmission device 11.

FIG. 8 is a block diagram showing an example structure of the transmission device 11 shown in FIG. 7.

In the transmission device 11, one or more input streams as target data are supplied to a mode adaptation/multiplexer unit 111.

The mode adaptation/multiplexer unit 111 performs mode selection and multiplexes the one or more input streams supplied thereto. The resultant data is supplied to a padder 112.

The padder 112 performs necessary zero filling (null insertions) on the data supplied from the mode adaptation/multiplexer unit 111, and supplies the resultant data to a BB scrambler 113.

The BB scrambler 113 performs an energy diffusing operation on the data supplied from the padder 112, and supplies the resultant data to a BCH encoder 114.

The BCH encoder 114 performs BCH encoding on the data supplied from the BB scrambler 113, and supplies the resultant data as LDPC target data to be subjected to LDPC encoding, to an LDPC encoder 115.

On the LDPC target data supplied from the BCH encoder 114, the LDPC encoder 115 performs LDPC encoding according to a parity check matrix having a staircase structure in the parity matrix corresponding to the parity bits of LDPC codes, and outputs an LDPC code having the LDPC target data as an information bit.

That is, the LDPC encoder 115 performs LDPC encoding to encode the LDPC target data into an LDPC code such as an LDPC code specified in the DVB-T.2 standards, and outputs the resultant LDPC code.

According to the DVB-T.2 standards, LDPC codes specified in the DVB-S.2 standards are used unless the code length is 16200 bits and the code rate is 3/5. LDPC codes specified in the DVB-T.2 standards are IRA (Irregular Repeat Accumulate) codes, and the parity matrixes in the parity check matrixes of the LDPC codes have staircase structures. Parity matrixes and staircase structures will be described later. IRA codes are disclosed in "Irregular Repeat-Accumulate Codes," H. Jin, A. Khandekar, and R. J. McEliece, in Proceedings of 2nd International Symposium on Turbo Codes and Related Topics, pp. 1-8, September 2000, for example.

The LDPC code that is output from the LDPC encoder 115 is supplied to a bit interleaver 116.

The bit interleaver 116 performs the later described bit interleaving on the LDPC code supplied from the LDPC encoder 115, and the LDPC code subjected to the bit interleaving is supplied to a QAM encoder 117.

The QAM encoder 117 performs orthogonal modulation (multilevel modulation) on the LDPC code supplied from the bit interleaver 116 by mapping each sign bit unit (each symbol unit) of one or more bits of the LDPC code to a signal point representing one symbol of orthogonal modulation.

That is, the QAM encoder 117 performs orthogonal modulation by mapping the LDPC code supplied from the bit interleaver 116 to signal points that are determined by the modulation method for the orthogonal modulation performed on the LDPC code in the I-Q plane (I-Q constellation) specified by the I-axis indicating the I-component of the same phase as the carrier waves and the Q-axis indicating the Q-component perpendicular to the carrier waves.

Here, examples of modulation methods for orthogonal modulation performed by the QAM encoder 117 include modulation methods specified in the DVB-T standards, such as QPSK (Quadrature Phase Shift Keying), 16QAM (Quadrature Amplitude Modulation), 64QAM, 256QAM, 1024QAM, and 4096QAM. At the QAM encoder 117, which modulation method is used in the orthogonal modulation is set beforehand in accordance with an operation by the operator of the transmission device 11, for example. The QAM encoder 117 can also perform other orthogonal modulation such as 4PAM (Pulse Amplitude Modulation).

The data obtained through the operation by the QAM encoder 117 (the symbols mapped to signal points) is supplied to a time interleaver 118.

The time interleaver 118 performs time interleaving (interleaving in the temporal direction) on each symbol unit of the data (symbols) supplied from the QAM encoder 117, and supplies the resultant data to a MISO/MIMO encoder 119.

The MISO/MIMO encoder 119 performs space-time encoding on the data (symbols) supplied from the time interleaver 118, and supplies the resultant data to a frequency interleaver 120.

The frequency interleaver 120 performs frequency interleaving (interleaving in the frequency direction) on each symbol unit of the data (symbols) supplied from the MISO/MIMO encoder 119, and supplies the resultant data to a frame builder/resource allocation unit 131.

Meanwhile, control data (signalling) for transmission control, such as a preamble called L1 is supplied to a BCH encoder 121.

Like the BCH encoder 114, the BCH encoder 121 performs BCH encoding on the control data supplied thereto, and supplies the resultant data to an LDPC encoder 122.

Like the LDPC encoder 115, the LDPC encoder 122 performs LDPC encoding on the data supplied as LDPC target data from the BCH encoder 121, and supplies the resultant LDPC code to a QAM encoder 123.

Like the QAM encoder 117, the QAM encoder 123 performs orthogonal modulation on the LDPC code supplied from the LDPC encoder 122 by mapping each sign bit unit (each symbol unit) of one or more bits of the LDPC code to a signal point representing one symbol of orthogonal modulation, and supplies the resultant data (symbols) to a frequency interleaver 124.

Like the frequency interleaver 120, the frequency interleaver 124 performs frequency interleaving on each symbol unit of the data (symbols) supplied from the QAM encoder 123, and supplies the resultant data to the frame builder/resource allocation unit 131.

The frame builder/resource allocation unit 131 inserts a pilot symbol to each relevant position in the data (symbols) supplied from the frequency interleavers 120 and 124, and creates a frame formed with a predetermined number of symbols out of the resultant data (symbols). The frame is supplied to an OFDM generation unit 132.

The OFDM generation unit 132 generates a corresponding OFDM signal from the frame supplied from the frame builder/resource allocation unit 131, and transmits the OFDM signal via the channel 13 (FIG. 7).

Figure 9:
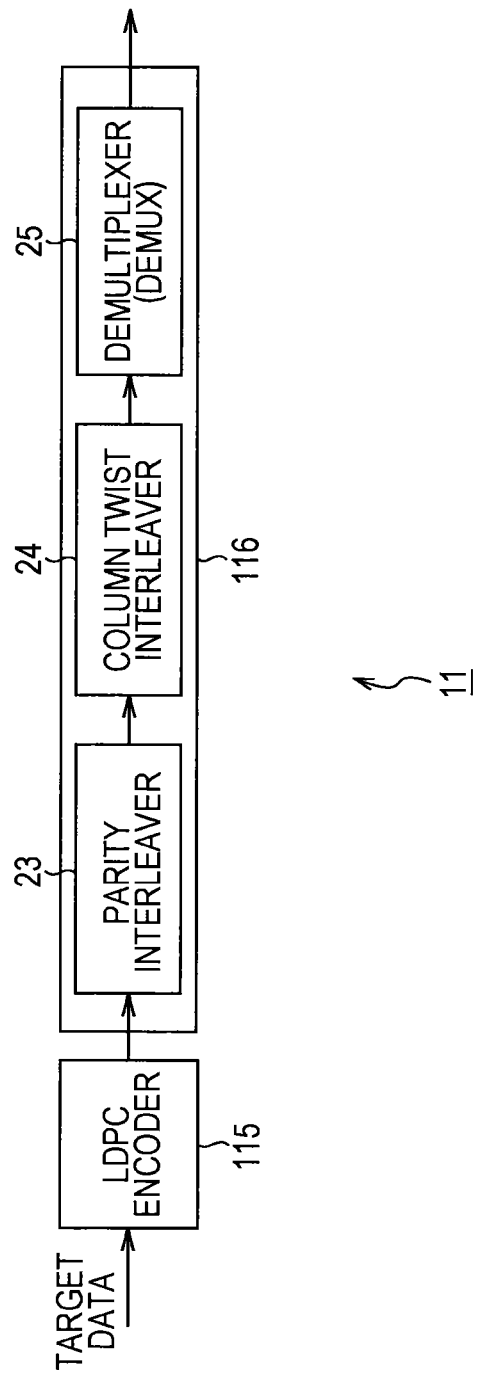
FIG. 9 is a block diagram showing an example structure of a bit interleaver 116.

FIG. 9 shows an example structure of the bit interleaver 116 shown in FIG. 8.

The bit interleaver 116 is a data processing device that interleaves data, and is formed with a parity interleaver 23, a column twist interleaver 24, and a demultiplexer (DEMUX) 25.

The parity interleaver 23 performs parity interleaving to interleave the parity bit of an LDPC code supplied from the LDPC encoder 115 to the position of another parity bit, and supplies the LDPC code subjected to the parity interleaving to the column twist interleaver 24.

The column twist interleaver 24 performs column twist interleaving on the LDPC code supplied from the parity interleaver 23, and supplies the LDPC code subjected to the column twist interleaving to the demultiplexer 25.

That is, at the QAM encoder 117 shown in FIG. 8, a sign bit of one or more bits of the LDPC code is mapped to a signal point representing one symbol of orthogonal modulation, and the LDPC code is then transmitted.

At the column twist interleaver 24, the later described column twist interleaving is performed as a rearrangement operation to rearrange sign bits of the LDPC code supplied from the parity interleaver 23 so that sign bits of an LDPC code corresponding to "1" in an arbitrary row in the parity check matrix used at the LDPC encoder 115 are not contained in one symbol.

The demultiplexer 25 performs a shuffling operation on the LDPC code supplied from the column twist interleaver 24, to shuffle the positions of two or more sign bits to be symbols in the LDPC code. In this manner, an LDPC code with increased tolerance for AWGN is obtained. The demultiplexer 25 then supplies the two or more sign bits of the LDPC code obtained through the shuffling operation, as symbols to the QAM encoder 117 (FIG. 8).

Figure 10:
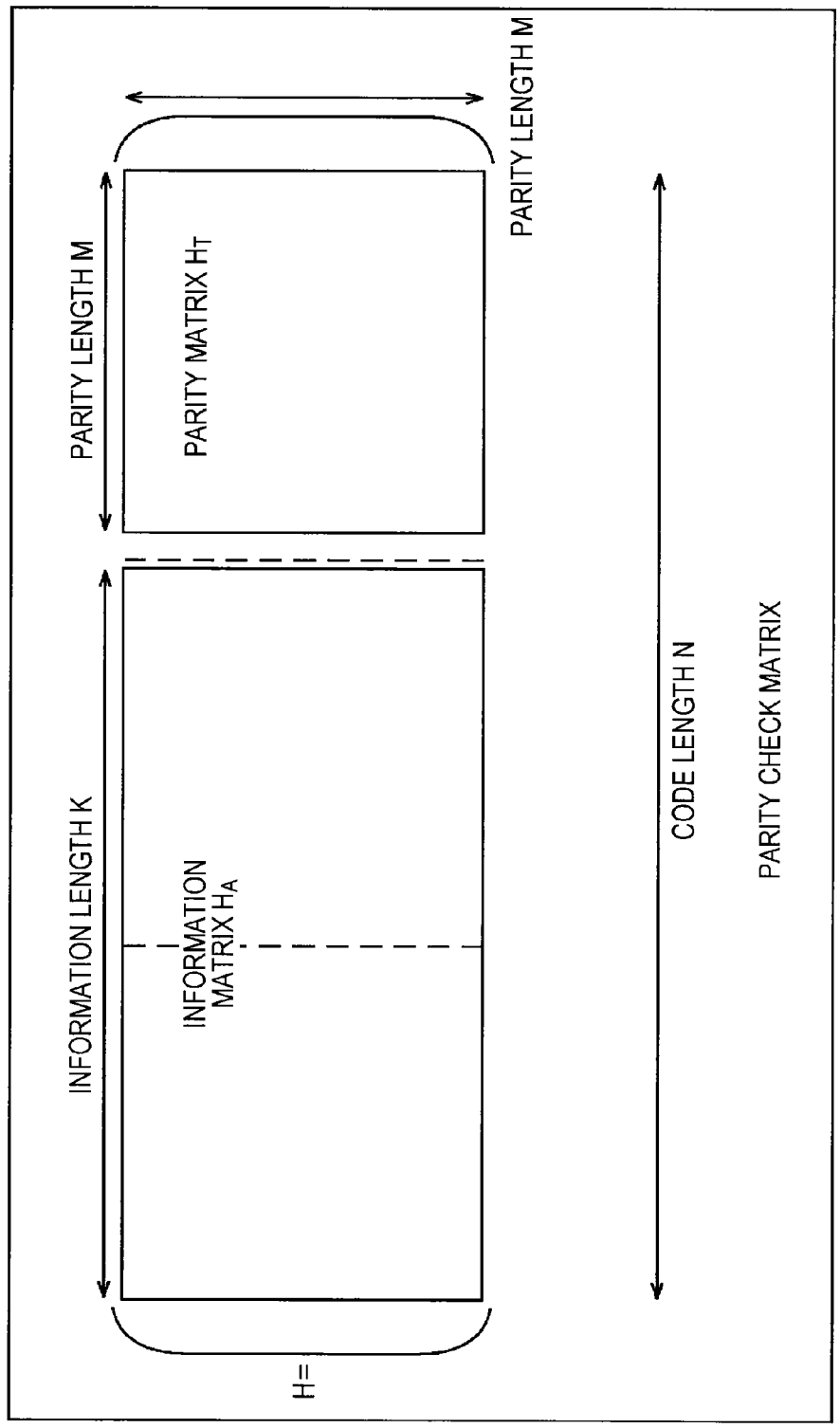
FIG. 10 is a diagram showing a parity check matrix.

FIG. 10 shows the parity check matrix H used in the LDPC encoding at the LDPC encoder 115 shown in FIG. 8.

The parity check matrix H has an LDGM (Low-Density Generation Matrix) structure, and can be expressed by the equation, $H=[H_A|H_T]$ (a matrix having an information matrix $H_A$ as the element on the left side, and a parity matrix $H_T$ as the element on the right side), where the information matrix $H_A$ corresponds to the information bits of the sign bits of an LDPC code, and the parity matrix $H_T$ corresponds to the parity bits of the sign bits of the LDPC code.

Here, of the sign bits of one LDPC code (one code word), the number of information bits and the number of parity bits are referred to as an information length K and a parity length M. Also, the number of sign bits in one LDPC code is referred to as a code length N (=K+M).

The information length K and the parity length M of an LDPC code having a certain code length N are determined by its code rate. The parity check matrix H is a matrix having M rows and N columns. The information matrix $H_A$ is a M×K matrix, and the parity matrix $H_T$ is a M×M matrix.

Figure 11:
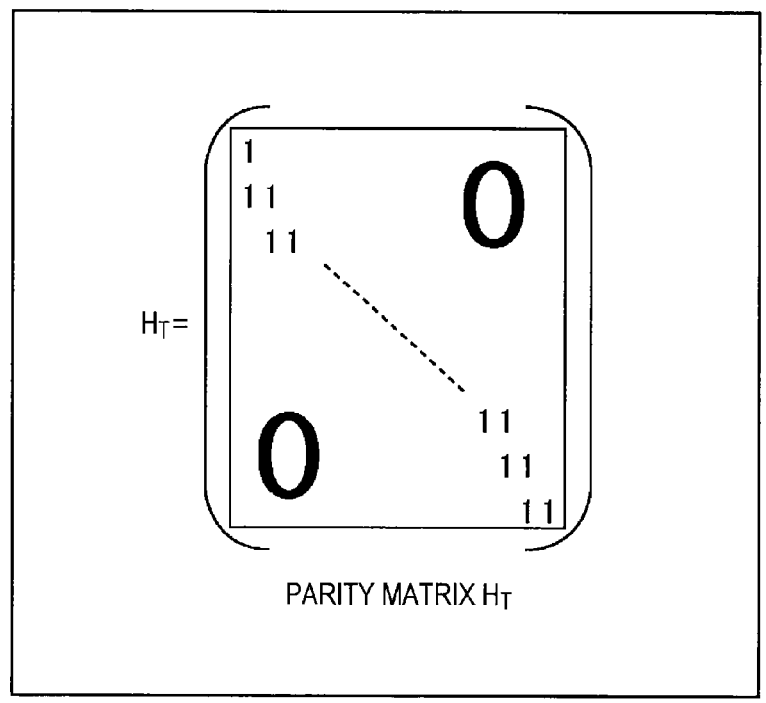
FIG. 11 is a diagram showing a parity matrix.

FIG. 11 shows the parity matrix $H_T$ of the parity check matrix H of an LDPC code specified in the DVB-T.2 (and DVB-S.2) standards.

The parity matrix $H_T$ of the parity check matrix H of an LDPC code specified in the DVB-T.2 standards has a staircase structure in which the elements "1" are arranged in a step-like fashion, as shown in FIG. 11. In the parity matrix $H_T$, the row weight is 1 in the first row, and is 2 in each of the rest of the rows. Meanwhile, the column weight is 1 in the last column, and is 2 in each of the rest of the columns.

As described above, an LDPC code having the parity check matrix H with a staircase structure in the parity matrix $H_T$ can be easily generated by using the parity check matrix H.

That is, an LDPC code (one code word) is represented by a row vector c, and the column vector obtained by transposing the row vector is represented by $c^T$. Of the row vector c as an LDPC code, the information bit portion is represented by a row vector A, and the parity bit portion is represented by a row vector T.

In this case, the row vector c can be expressed by the equation, c=[A|T] (a row vector having the row vector A as the element on the left side, and the row vector T as the element on the right side), where the row vector A represents the information bits, and the row vector T represents the parity bits.

The parity check matrix H and the row vector c=[A|T] as an LDPC code need to satisfy the equation, $Hc^T=0$, and the row vector T as the parity bits of the row vector c=[A|T], which satisfies the equation, $Hc^T=0$, can be sequentially determined (in order) by changing the element in each row to "0" in the column vector $Hc^T$ in the equation, $Hc^T=0$, starting from the element in the first row, if the parity matrix $H_T$ in the parity check matrix H=[$H_A$|$H_T$] has the staircase structure shown in FIG. 11.

Figure 12:
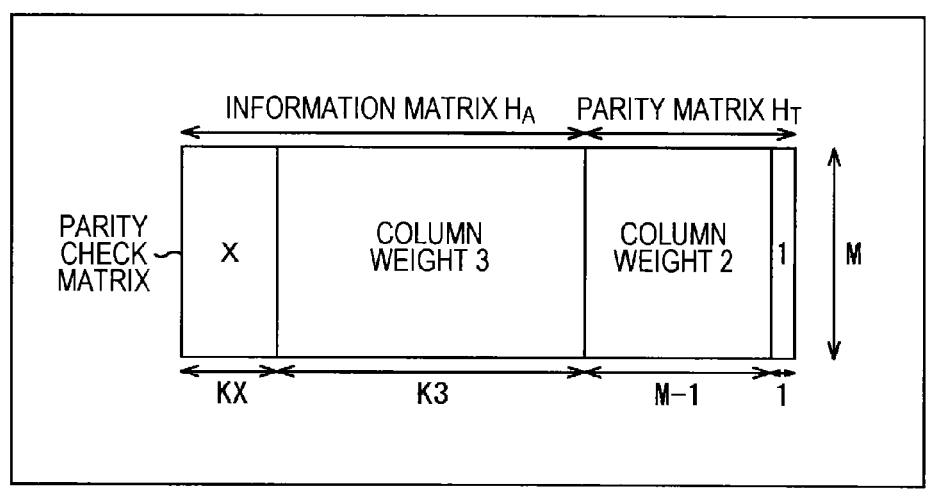
FIG. 12 is a diagram for explaining the parity check matrix of an LDPC code specified in the DVB-S.2 standards.

FIG. 12 is a diagram for explaining the parity check matrix H of an LDPC code specified in the DVB-T.2 standards.

In the KX columns starting from the first row of the parity check matrix H of an LDPC code specified in the DVB-T.2 standards, the column weight is X. In the K3 columns following the KX columns, the column weight is 3. In the (M−1) columns following the K3 columns, the column weight is 2. In the last one column, the column weight is 1.

Here, KX+K3+(M−1)+1 is equal to the code length N.

FIG. 13 is a diagram showing the numbers KX, K3, and M of columns, and the column weight X at each code rate r of LDPC codes specified in the DVB-T.2 standards.

In the DVB-T.2 standards, LDPC codes with code lengths N of 64800 bits and 16200 bits are specified.

As for the LDPC codes with the code length N of 64800 bits, the 11 code rates (nominal rates) of 1/4, 1/3, 2/5, 1/2, 3/5, 2/3, 3/4, 4/5, 5/6, 8/9, and 9/10 are specified. As for the LDPC codes with the code length N of 16200 bits, the 10 code rates of 1/4, 1/3, 2/5, 1/2, 3/5, 2/3, 3/4, 4/5, 5/6, and 8/9 are specified.

Here, the code length N of 64800 bits is also referred to as 64 kbits, and the code length N of 16200 bits is also referred to as 16 kbits.

As for an LDPC code, it is known that a sign bit corresponding to a column with a larger column weight in the parity check matrix H has a lower error rate.

In the parity check matrix H specified in the DVB-T.2 standards shown in FIGS. 12 and 13, a column closer to the top (the left side) tends to have a larger column weight. Accordingly, in an LDPC code corresponding to the parity check matrix H, a sign bit closer to the top tends to be strong against errors (or have tolerance for errors), and a sign bit closer to the last tends to be weak against errors.

Figure 14:
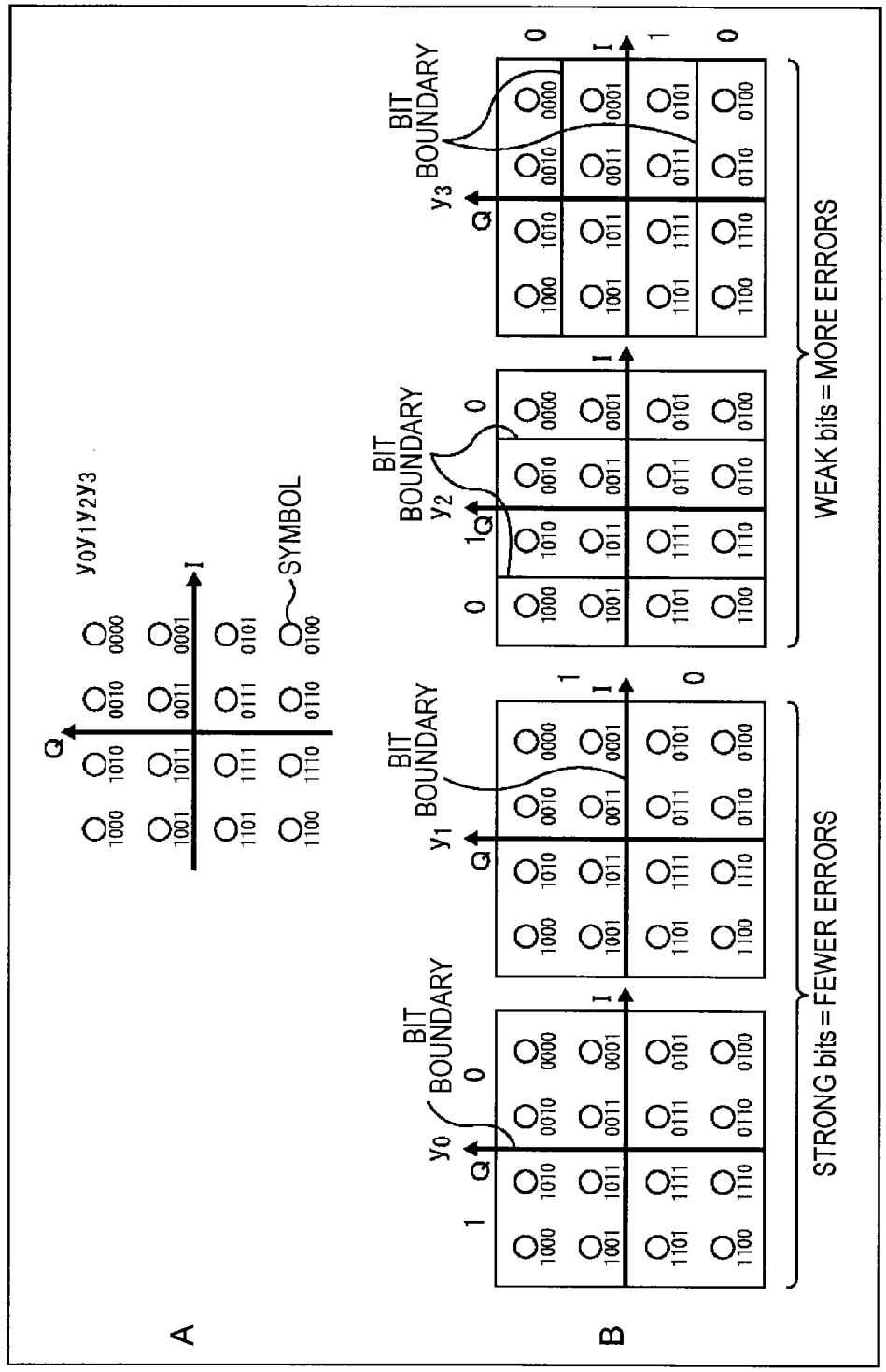
FIG. 14 is a diagram showing the signal point arrangement of 16QAM.

FIG. 14 shows the arrangement of (the signal points corresponding to) 16 symbols in the I-Q plane in a case where 16QAM is performed at the QAM encoder 117 shown in FIG. 8.

That is, A of FIG. 14 shows the symbols of 16QAM of DVB-T.2.

In 16QAM, one symbol represents four bits, and there exist 16 ($=2^4$) symbols. The 16 symbols are arranged so that a square of 4×4 in the I-direction and the Q-direction is formed about the origin of the I-Q plane.

Where a bit $y_i$ represents the (i+1)th bit counted from the uppermost bit in a bit column represented by one symbol, the four bits represented by one symbol of 16QAM can be represented by bits $y_0$, $y_1$, $y_2$, and $y_3$ in the order from the uppermost bit. When the modulation method is 16QAM, the four bits of a sign bit of an LDPC code are turned (symbolized) into a symbol (a symbol value) of the four bits $y_0$ through $y_3$.

In FIG. 14, B shows the bit boundaries in the four respective bits (hereinafter also referred to as the symbol bits) $y_0$ through $y_3$ represented by a symbol of 16QAM.

Here, a bit boundary in a symbol bit $y_i$ (i=0, 1, 2, and 3 in FIG. 14) is a boundary between symbols with which the symbol bit $y_i$ is 0 and symbols with which the symbol bit $y_i$ is 1.

As shown in B of FIG. 14, the Q-axis of the I-Q plane is the only one bit boundary in the uppermost symbol bit $y_0$ among the four symbol bits $y_0$ through $y_3$ represented by a symbol of 16QAM, and the I-axis of the I-Q plane is the only one bit boundary in the second symbol bit $y_1$ (the second uppermost bit counted from the uppermost bit).

In the third symbol bit $y_2$, a line between the first and second columns from the left, and a line between the third and the fourth columns among the 4×4 symbols serve as bit boundaries.

Further, in the fourth symbol bit $y_3$, a line between the first and second rows from the top, and a line between the third and the fourth rows among the 4×4 symbols serve as bit boundaries.

Among the symbol bits $y_i$ represented by symbols, a symbol bit having a larger number of symbols located further away from a bit boundary tends to have fewer errors (or have a lower error probability), and a symbol bit having a larger number of symbols located closer to a bit boundary tends to have more errors (or have a higher error probability).

Where bits that tend to have fewer errors (or are strong against errors) are called "strong bits", and bits that tend to have more errors (or are weak against errors) are called "weak bits", the uppermost symbol bit $y_0$ and the second symbol bit $y_1$ are the strong bits among the four symbol bits $y_0$ through $y_3$ of a symbol of 16QAM, and the third symbol bit $y_2$ and the fourth symbol bit $y_3$ are the weak bits.

Figure 15:
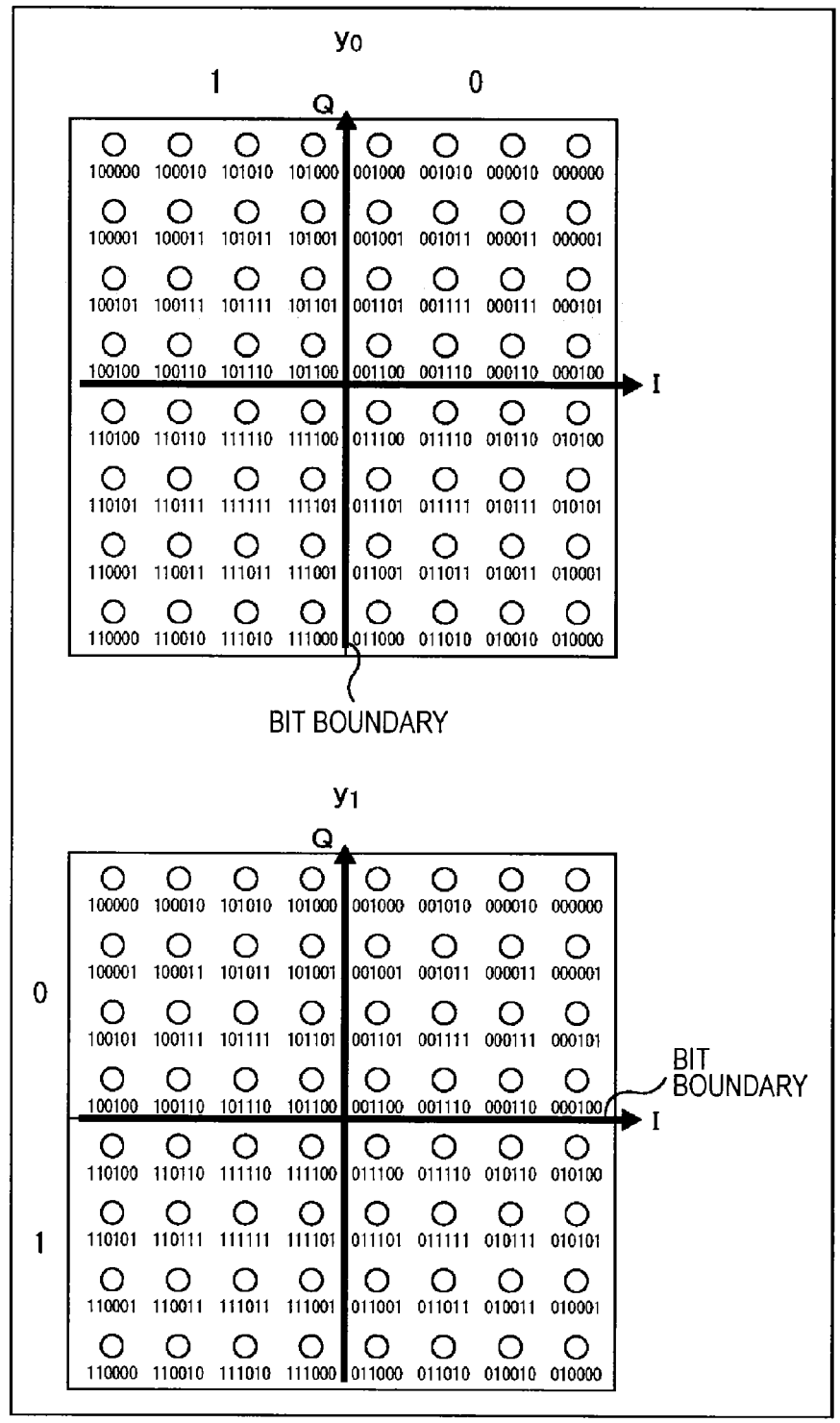
FIG. 15 is a diagram showing the signal point arrangement of 64QAM.
Figure 16:
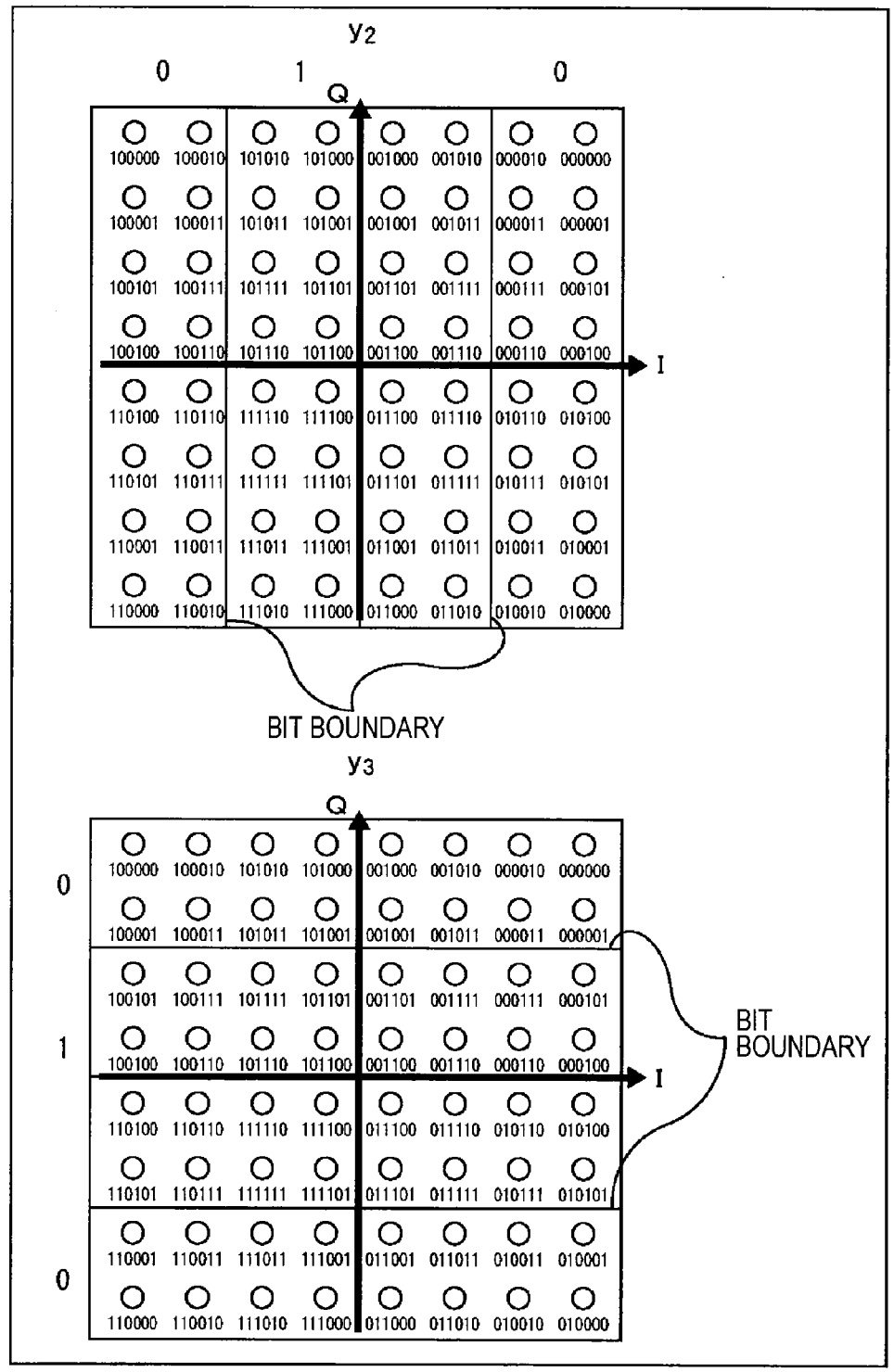
FIG. 16 is a diagram showing the signal point arrangement of 64QAM.
Figure 17:
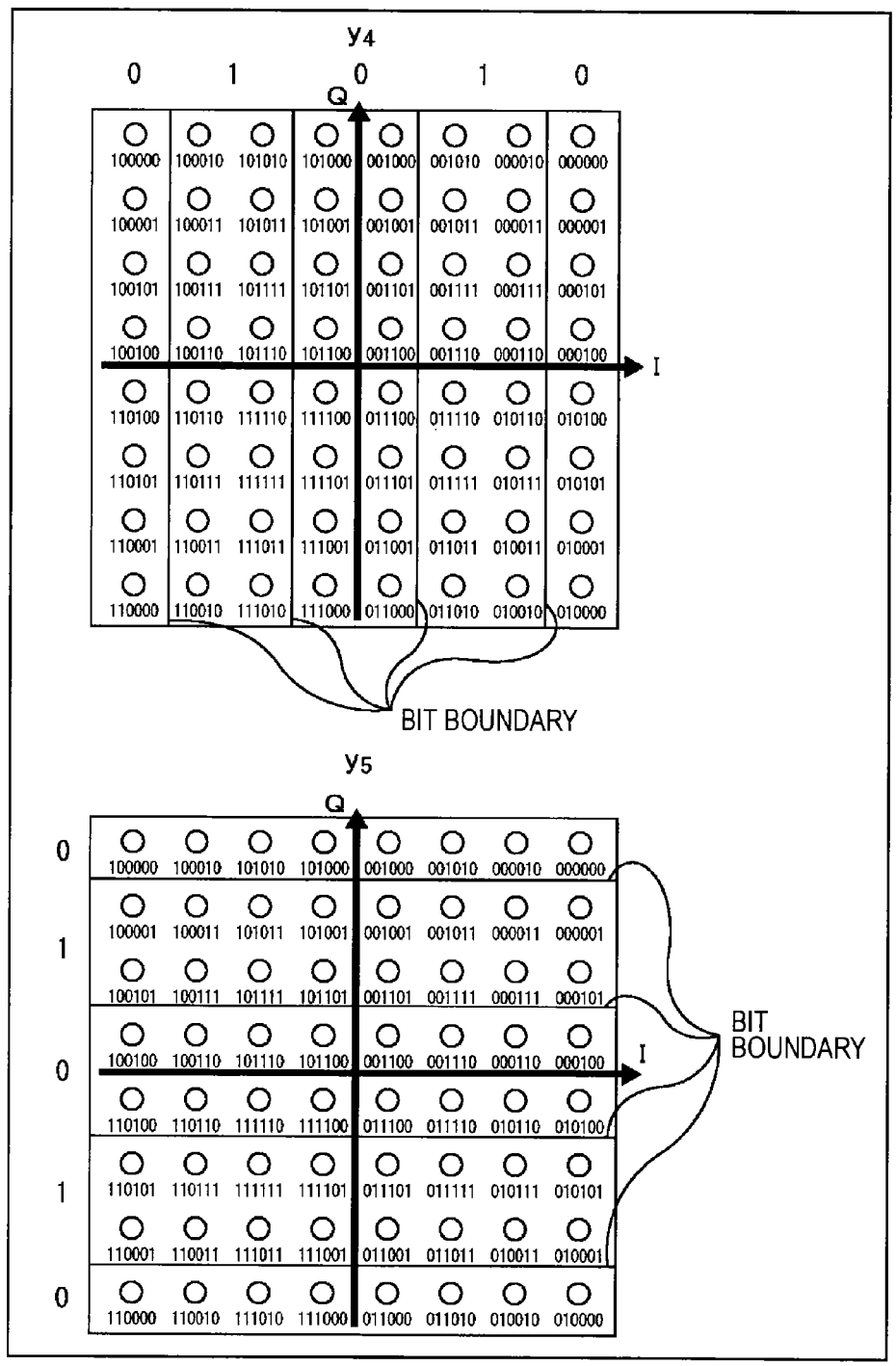
FIG. 17 is a diagram showing the signal point arrangement of 64QAM.

FIGS. 15 through 17 show the arrangement of (signal points corresponding to) 64 symbols in the I-Q plane in a case where 64QAM is performed at the QAM encoder 117 shown in FIG. 8, or symbols of 16QAM of DVB-T.2.

In 64QAM, one symbol represents six bits, and there exist 64 (=$2^6$) symbols. The 64 symbols are arranged so that a square of 8×8 in the I-direction and the Q-direction is formed about the origin of the I-Q plane.

The symbol bits of one symbol of 64QAM can be represented by bits $y_0$, $y_1$, $y_2$, $y_3$, $y_4$, and $y_5$ in the order from the uppermost bit. When the modulation method is 64QAM, six sign bits of an LDPC code are turned into a symbol of the six symbol bits $y_0$ through $y_5$.

FIG. 15 shows respective bit boundaries in the uppermost symbol bit $y_0$0 and the second symbol bit $y_1$ among the symbol bits $y_0$ through $y_5$ of a symbol of 64QAM. FIG. 16 shows respective bit boundaries in the third symbol bit $y_2$ and the fourth symbol bit $y_3$. FIG. 17 shows respective bit boundaries in the fifth symbol bit $y_4$ and the sixth symbol bit $y_5$.

As shown in FIG. 15, there is one bit boundary in each of the uppermost symbol bit $y_0$ and the second symbol bit $y_1$. Also, as shown in FIG. 16, there are two bit boundaries in each of the third symbol bit $y_2$ and the fourth symbol bit $y_3$. As shown in FIG. 17, there are four bit boundaries in each of the fifth symbol bit $y_4$ and the sixth symbol bit $y_5$.

Accordingly, of the symbol bits $y_0$ through $y_5$ of a symbol of 64QAM, the uppermost symbol bit $y_0$ and the second symbol bit $y_1$ are the strong bits, and the third symbol bit $y_2$ and the fourth symbol bit $y_3$ are the second strongest bits. The fifth symbol bit $y_4$ and the sixth symbol bit $y_5$ are the weak bits.

As can be seen from FIG. 14 and FIGS. 15 through 17, of the symbol bits of a symbol of orthogonal modulation, the upper bits tend to be the strong bits, and the lower bits tend to be the weak bits.

As described above with reference to FIGS. 12 and 13, in an LDPC code that is output from the LDPC encoder 115 (FIG. 8), there are sign bits that are strong against errors, and sign bits that are weak against errors.

Also, as described above with reference to FIGS. 14 through 17, among the symbol bits of a symbol of orthogonal modulation performed at the QAM encoder 117, there are strong bits and weak bits.

Therefore, when the sign bits that are weak against errors in an LDPC code are assigned to the weak symbol bits of a symbol of orthogonal modulation, the entire tolerance for errors becomes lower.

In view of this, there has been a suggested interleaver that interleaves sign bits of an LDPC code by assigning sign bits that are weak against errors in an LDPC code mostly to the strong bits (symbol bits) of a symbol of orthogonal modulation.

The demultiplexer 25 shown in FIG. 9 can perform such an operation of an interleaver.

Figure 18:
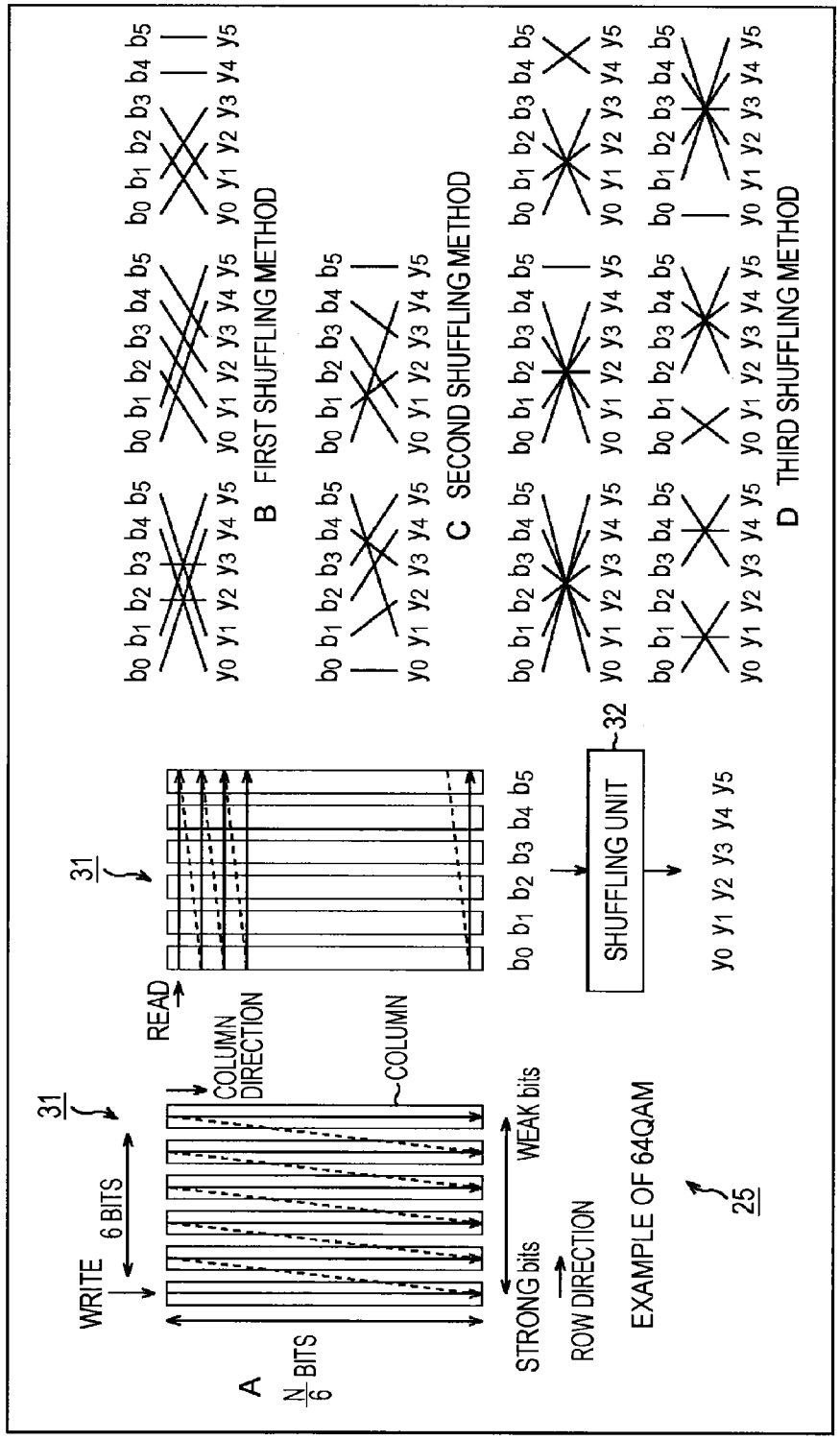
FIG. 18 is a diagram for explaining operations of a demultiplexer 25.

FIG. 18 is a diagram for explaining the operation of the demultiplexer 25 shown in FIG. 9.

Specifically, A of FIG. 18 shows an example functional structure of the demultiplexer 25.

The demultiplexer 25 includes a memory 31 and a shuffling unit 32.

An LDPC code is supplied from the LDPC encoder 115 to the memory 31.

The memory 31 has a storage capacity to store mb bits in the row (horizontal) direction and N/(mb) bits in the column (vertical) direction, writes the sign bits of the supplied LDPC code in the column direction, reads out the sign bits in the row direction, and supplies the sign bits to the shuffling unit 32.

Here, N (=information length K+parity length M) represents the code length of the LDPC code, as described above.

Also, m represents the number of sign bits of the LDPC code to form one symbol, and b represents a predetermined positive integer that is a multiple number to be used to multiply m by an integer. As described above, the demultiplexer 25 turns (symbolizes) the sign bits of the LDPC code into symbols, and the multiple number b represents the number of symbols to be obtained by the demultiplexer 25 performing a single symbolizing operation.

In FIG. 18, A shows an example structure of the demultiplexer 25 in a case where the modulation method is 64QAM, and therefore, the number m of sign bits of the LDPC code to form one symbol is 6.

Also, in A of FIG. 18, the multiple number b is 1, and accordingly, the memory 31 has a storage capacity of N/(6×1)×(6×1) bits in the column direction and the row direction.

In the memory 31, each storage area that has one bit in the row direction and extends in the column direction will be hereinafter referred to as a column, appropriately. In A of FIG. 18, the memory 31 is formed with six (=6×1) columns.

In the demultiplexer 25, writing of sign bits of the LDPC code into the columns forming the memory 31 in the direction from the top toward the bottom (in the column direction) is performed on the columns in the direction from left to right.

After the writing of sign bits is completed in the lowermost position in the rightmost column, the sign bits are read out from the first row of all the columns forming the memory 31 in the row direction six bits (mb bits) at a time, and are then supplied to the shuffling unit 32.

The shuffling unit 32 performs a shuffling operation to shuffle the positions of six sign bits supplied from the memory 31, and outputs the resultant six bits as the six symbol bits $y_0$, $y_1$, $y_2$, $y_3$, $y_4$, and $y_5$ which represent one symbol of 64QAM.

Specifically, mb bits (six bits in this example) are read in the row direction from the memory 31. Where the ith bit (i=0, 1, . . . , mb−1) counted from the uppermost bit among the mb sign bits read from the memory 31 is represented by a bit $b_i$, the six sign bits read in the row direction from the memory 31 can be expressed as bits $b_0$, $b_1$, $b_2$, $b_3$, $b_4$, and $b_5$ in the order from the uppermost bit.

In the column weight relationship described with reference to FIGS. 12 and 13, the sign bits located in the direction of the bit $b_0$ are sign bits that are strong against errors, and the sign bits located in the direction of the bit $b_5$ are sign bits that are weak against errors.

The shuffling unit 32 can perform a shuffling operation to shuffle the positions of the six sign bits $b_0$ through $b_5$ read from the memory 31 so that the sign bits weak against errors among the six sign bits $b_0$ through $b_5$ read from the memory 31 are assigned to the strong bits among the symbol bits $y_0$ through $y_5$ of one symbol of 64QAM.

Manufacturers have suggested various methods as shuffling methods for shuffling the six sign bits $b_0$ through $b_5$ read from the memory 31, and assigning the six sign bits to the six symbol bits $y_0$ through $y_5$, which represent one symbol of 64QAM.

In FIG. 18, B shows a first shuffling method, C shows a second shuffling method, and D shows a third shuffling method.

In B through D of FIG. 18 (and FIG. 19, which will be described later), each line connecting bits $b_i$ and $y_j$ means that the sign bit $b_i$ is assigned to the symbol bit $y_j$ of a symbol (or replaces the symbol bit $y_j$).

As the first shuffling method shown in B of FIG. 18, the use of one of three shuffling methods has been suggested. As the second shuffling method shown in C of FIG. 18, the use of one of two shuffling methods has been suggested.

As the third suggested shuffling method shown in D of FIG. 18, the six shuffling methods are sequentially selected and used.

Figure 19:
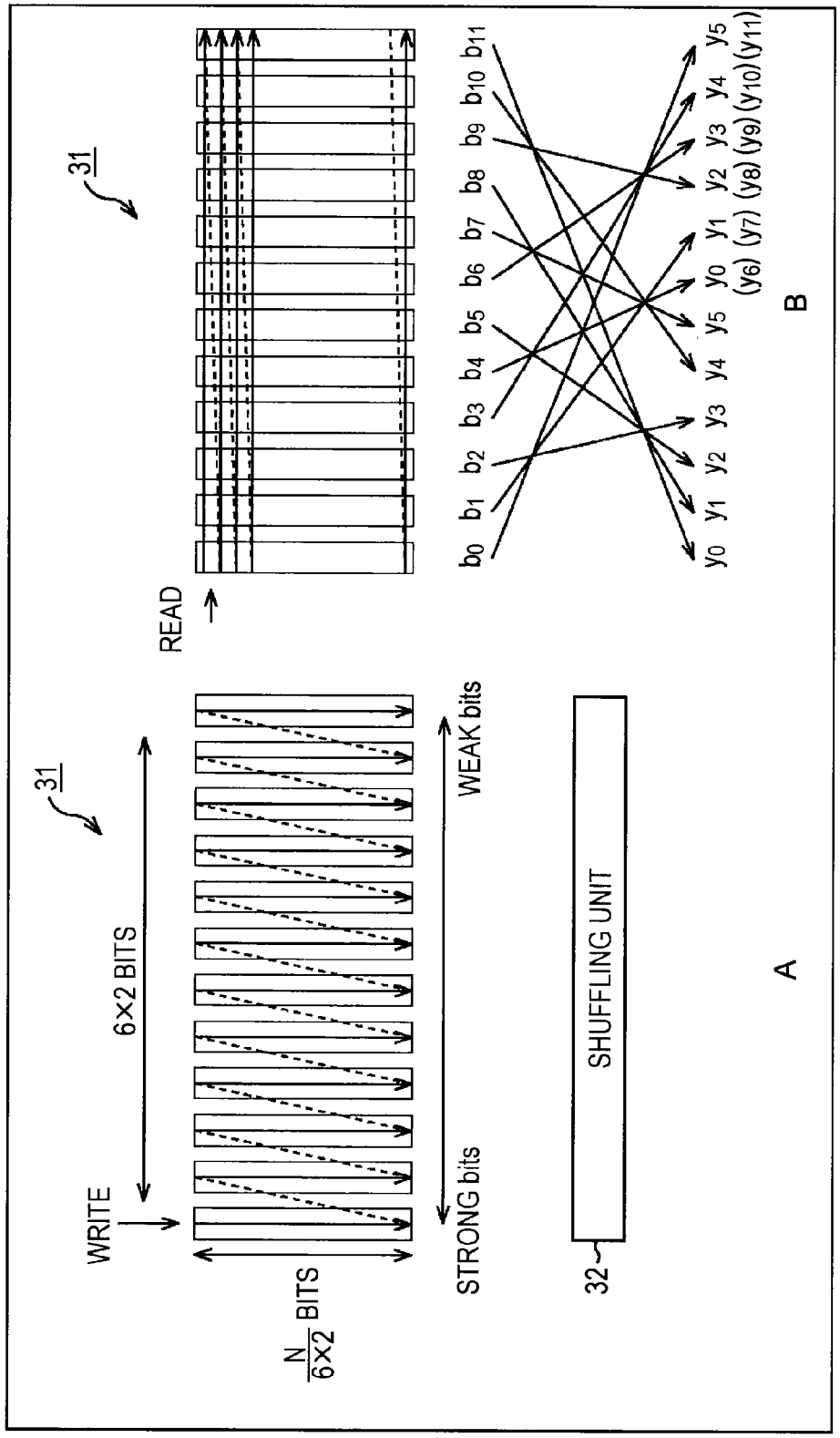
FIG. 19 is a diagram for explaining operations of the demultiplexer 25.

FIG. 19 shows an example structure of the demultiplexer 25 in a case where the modulation method is 64QAM (the number m of sign bits in an LDPC code to be mapped to one symbol is 6 as in the example shown in FIG. 18) and the multiple number b is 2, and also shows a fourth shuffling method.

Where the multiple number b is 2, the memory 31 has a storage capacity of N/(6×2)×(6×2) bits in the column direction and the row direction, and is formed with 12 (=6×2) columns.

In FIG. 19, A shows the order of writing of an LDPC code into the memory 31.

In the demultiplexer 25, writing of sign bits of an LDPC code into the columns forming the memory 31 in the direction from the top toward the bottom (in the column direction) is performed on the columns in the direction from left to right, as described above with reference to FIG. 18.

After the writing of sign bits is completed in the lowermost position in the rightmost column, the sign bits are read out from the first row of all the columns forming the memory 31 in the row direction 12 bits (mb bits) at a time, and are then supplied to the shuffling unit 32.

The shuffling unit 32 performs a shuffling operation to shuffle the positions of the 12 sign bits supplied from the memory 31 by the fourth shuffling method, and outputs the resultant 12 bits that are 12 bits representing two symbols (b symbols) of 64QAM, or six symbol bits $y_0, y_1, y_2, y_3, y_4$, and $y_5$, which represent one symbol of 64QAM, and six symbol bits $y_0, y_1, y_2, y_3, y_4$, and $y_5$, which represent the next one symbol.

In FIG. 19, B shows the fourth shuffling method to be used by the shuffling unit 32 shown in A of FIG. 19 to perform a shuffling operation.

In a case where the multiple number b is 2 (as in cases where the multiple number b is 3 or greater), the mb sign bits are assigned to mb symbol bits of b successive symbols in a shuffling operation. As in FIG. 19, in the following, the (i+1)th bit counted from the uppermost bit among the mb symbol bits of the b successive symbols is expressed as a bit (symbol bit) for ease of explanation.

Also, which shuffling method is appropriate or whether to increase the error rate in AWGN channels depends on the code rate and the code length of each LDPC code, the modulation method, and the like.

[Parity Interleaving]

Figure 20:
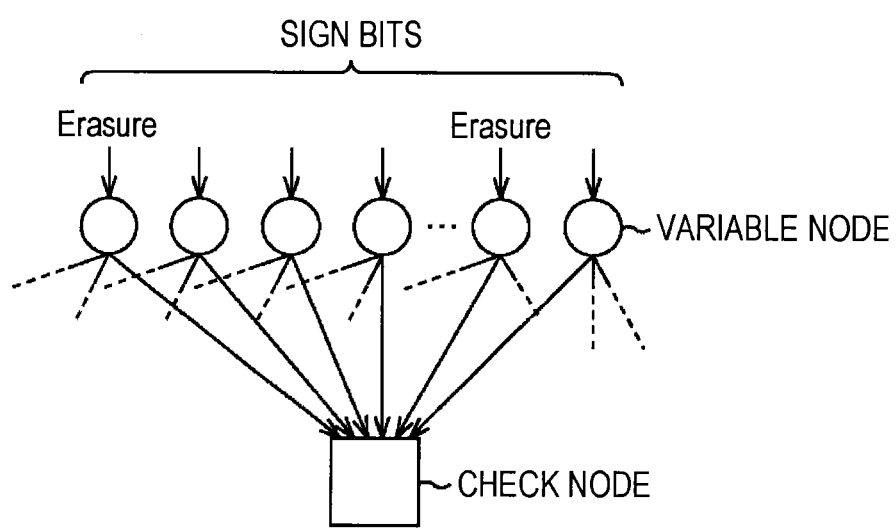
FIG. 20 is a diagram showing a Tanner graph about decoding of an LDPC code.
Figure 21:
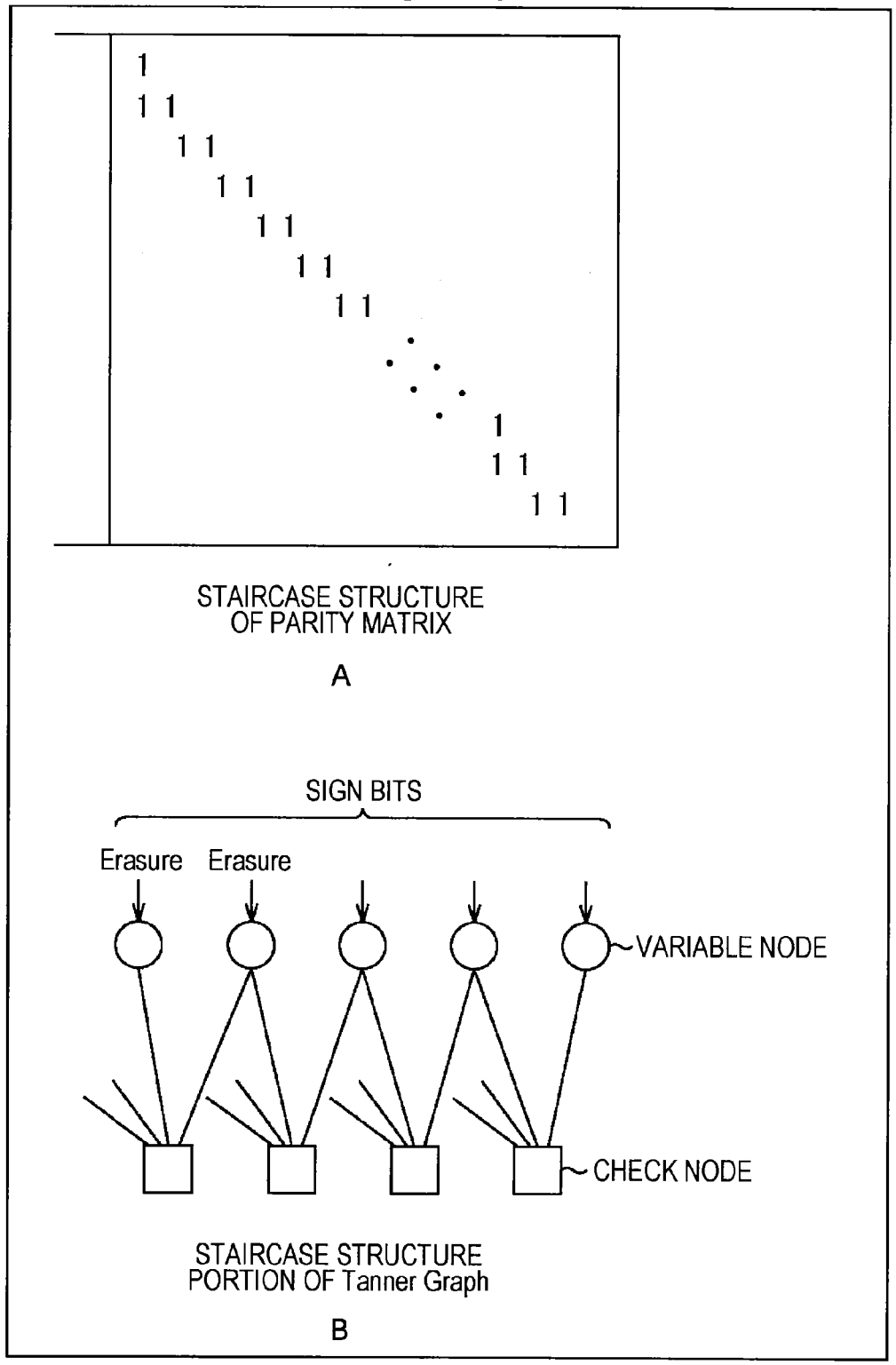
FIG. 21 is a diagram showing a parity matrix $H_T$ having a staircase structure, and a Tanner graph corresponding to a parity matrix $H_T$.
Figure 22:
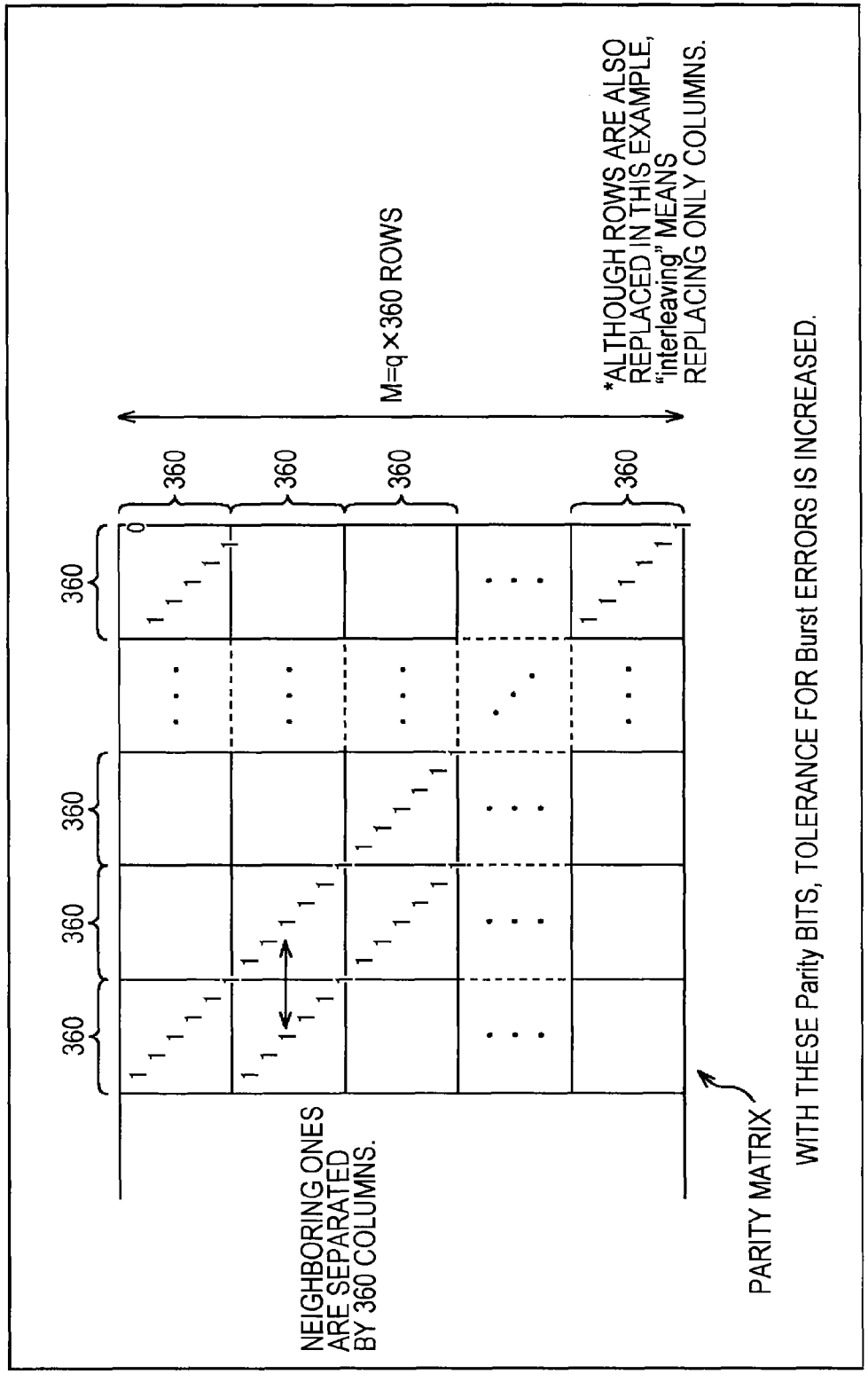
FIG. 22 is a diagram showing the parity matrix $H_T$ of the parity check matrix H corresponding to an LDPC code subjected to parity interleaving.

Referring now to FIGS. 20 through 22, the parity interleaving by the parity interleaver 23 shown in FIG. 9 is described.

FIG. 20 shows (part of) a Tanner graph of a parity check matrix of an LDPC code.

As shown in FIG. 20, when two or more (sign bits corresponding to) variable nodes connected to a check node simultaneously have errors such as erasures, the check node returns a message indicating that the probability of the value being "0" and the probability of the value being "1" are equal to each other, to all the variable nodes connected to the check node. Therefore, when variable nodes connected to the same check node simultaneously have erasures or the like, decoding performance is degraded.

Meanwhile, an LDPC code that is output from the LDPC encoder 115 shown in FIG. 8 and is specified in the DVB-T.2 standards is an IRA code, and the parity matrix $H_T$ of the parity check matrix H has a staircase structure as shown in FIG. 11.

FIG. 21 shows a parity matrix $H_T$ having a staircase structure, and a Tanner graph corresponding to the parity matrix $H_T$.

Specifically, A of FIG. 21 shows a parity matrix $H_T$ having a staircase structure, and B of FIG. 21 shows a Tanner graph corresponding to the parity matrix $H_T$ shown in A of FIG. 21.

In the parity matrix $H_T$ having a staircase structure, elements "1" are adjacent to each other in each row (except for the first row). Therefore, in the Tanner graph of the parity matrix $H_T$, two adjacent variable nodes corresponding to a column of two adjacent elements having the value "1" in the parity matrix $H_T$ are connected to the same check node.

When the parity bits corresponding to the two adjacent variable nodes simultaneously have errors due to burst errors or erasures or the like, the check node connected to the two variable nodes (the variable nodes requesting a message by using the parity bits) corresponding to the two parity bits having the errors returns a message indicating that the probability of the value being "0" and the probability of the value being "1" are equal to each other, to the variable nodes connected to the check node. As a result, decoding performance is degraded. When the burst length (the number of parity bits having successive errors) becomes larger, the number of check nodes returning the equal probability message becomes larger, and decoding performance is further degraded.

To prevent the decoding performance degradation, the parity interleaver 23 (FIG. 9) performs parity interleaving to interleave the parity bits of an LDPC code supplied from the LDPC encoder 115 in the positions of other parity bits.

FIG. 22 shows the parity matrix $H_T$ of the parity check matrix H corresponding to an LDPC code subjected to the parity interleaving performed by the parity interleaver 23 shown in FIG. 9.

Here, the information matrix $H_A$ of the parity check matrix H corresponding to an LDPC code that is output from the LDPC encoder 115 and is specified in the DVB-T.2 standards has a cyclic structure.

A cyclic structure is a structure in which a column is the same as a column formed as a result of a cyclic shift of another column. For example, a cyclic structure is also a structure in which the positions of elements "1" in each row of P columns are cyclically shifted in the column direction by a value proportional to a value q obtained by dividing the first column of the P columns by the parity length M. Hereinafter, the P columns in the cyclic structure will be referred to as an unit column number in the cyclic structure.

As for LDPC codes specified in the DVB-T.2 standards, there are two types of LDPC codes having code lengths N of 64800 bits and 16200 bits, as described above with reference to FIGS. 12 and 13. For each of the two types of LDPC codes, the unit column number P in the cyclic structure is specified as 360, which is one of the divisors of the parity length M, except for 1 and M.

The parity length M has a value expressed by the equation, M=q×P=q×360, using a different value q at each code rate. The parity length M has a value other than a prime number. Therefore, like the unit column number P in the cyclic structure, the value q is another one of the divisors of the parity length M, except for 1 and M, and is obtained by dividing the parity length M by the unit column number P in the cyclic structure (the product of P and q, which are divisors of the parity length M, is equal to the parity length M).

Where K represents the information length, x represents an integer that is not smaller than 0 and is smaller than P, and y represents an integer that is not smaller than 0 and is smaller than q, as described above, the parity interleaver 23 performs parity interleaving to interleave the (K+qx+y+1)th sign bit among the sign bits of an N-bit LDPC code to the position of the (K+Py+x+1)th sign bit.

Both the (K+qx+y+1)th sign bit and the (K+Py+x+1)th sign bit are sign bits after the (K+1)th sign bit, and therefore, are parity bits. Accordingly, through the parity interleaving, the positions of the parity bits of the LDPC code are shifted.

Through such parity interleaving, (the parity bits corresponding to) the variable nodes connected to the same check node are separated from each other by the distance equivalent to the unit column number P in the cyclic structure, or 360 bits in this case. Accordingly, when the burst length is smaller than 360 bits, variable nodes connected to the same check node can be prevented from simultaneously having errors. As a result, the tolerance for burst errors can be increased.

The LDPC code subjected to the parity interleaving to interleave the (K+qx+y+1)th sign bit to the position of the (K+Py+x+1)th sign bit is the same as an LDPC code of a parity check matrix obtained by performing column replacement to replace the (K+qx+y+1)th column in the original parity check matrix H with the (K+Py+x+1)th column (the resultant parity check matrix will be hereinafter also referred to as the transformed parity check matrix).

In the parity matrix of the transformed parity check matrix, a pseudo cyclic structure having cycles of P columns (360 columns in FIG. 22) appears, as shown in FIG. 22.

Here, a pseudo cyclic structure means a structure that is a cyclic structure except for some portions. The transformed parity check matrix obtained by performing column replacement equivalent to parity interleaving on the parity check matrix of an LDPC code specified in the DVB-T.2 standards is only one short of the number of elements "1" (and has one extra element "0", instead) in the right corner portion of 360 rows and 360 columns (a shift matrix that will be described later). In this aspect, the structure is not a (perfect) cyclic structure, but is a so-called pseudo cyclic structure.

The transformed parity check matrix shown in FIG. 22 is a matrix formed by subjecting the original parity check matrix H not only to column replacement equivalent to parity interleaving, but also to an operation for a row replacement (row replacement) to form a transformed parity check matrix with the later described constitutive matrix.

[Column Twist Interleaving]

Referring now to FIGS. 23 through 26, the column twist interleaving as the rearrangement operation by the column twist interleaver 24 shown in FIG. 9 is described.

In the transmission device 11 shown in FIG. 8, one or more sign bits of an LDPC code are transmitted as one symbol. Specifically, in a case where two sign bits form one symbol, QPSK is used as the modulation method, for example. In a case where four sign bits form one symbol, 16QAM is used as the modulation method, for example.

In a case where two or more sign bits are transmitted as one symbol, when an erasure occurs in a symbol, all the sign bits of the symbol have errors (erasures).

Therefore, to lower the probability that (the sign bits corresponding to) variable nodes connected to the same check node simultaneously have erasures, and thus improve decoding performance, the variable nodes corresponding to the sign bits of one symbol should be prevented from being connected to the same check node.

Meanwhile, in the parity check matrix H of an LDPC code that is to be output from the LDPC encoder 115 and is specified in the DVB-T.2 standards, the information matrix $H_A$ has a cyclic structure, and the parity matrix $H_T$ has a staircase structure, as described above. In a transformed parity check matrix that is the parity check matrix of an LDPC code subjected to parity interleaving, a cyclic structure (to be exact, a pseudo cyclic structure, as described above) also appears in the parity matrix, as described above with reference to FIG. 22.

Figure 23:
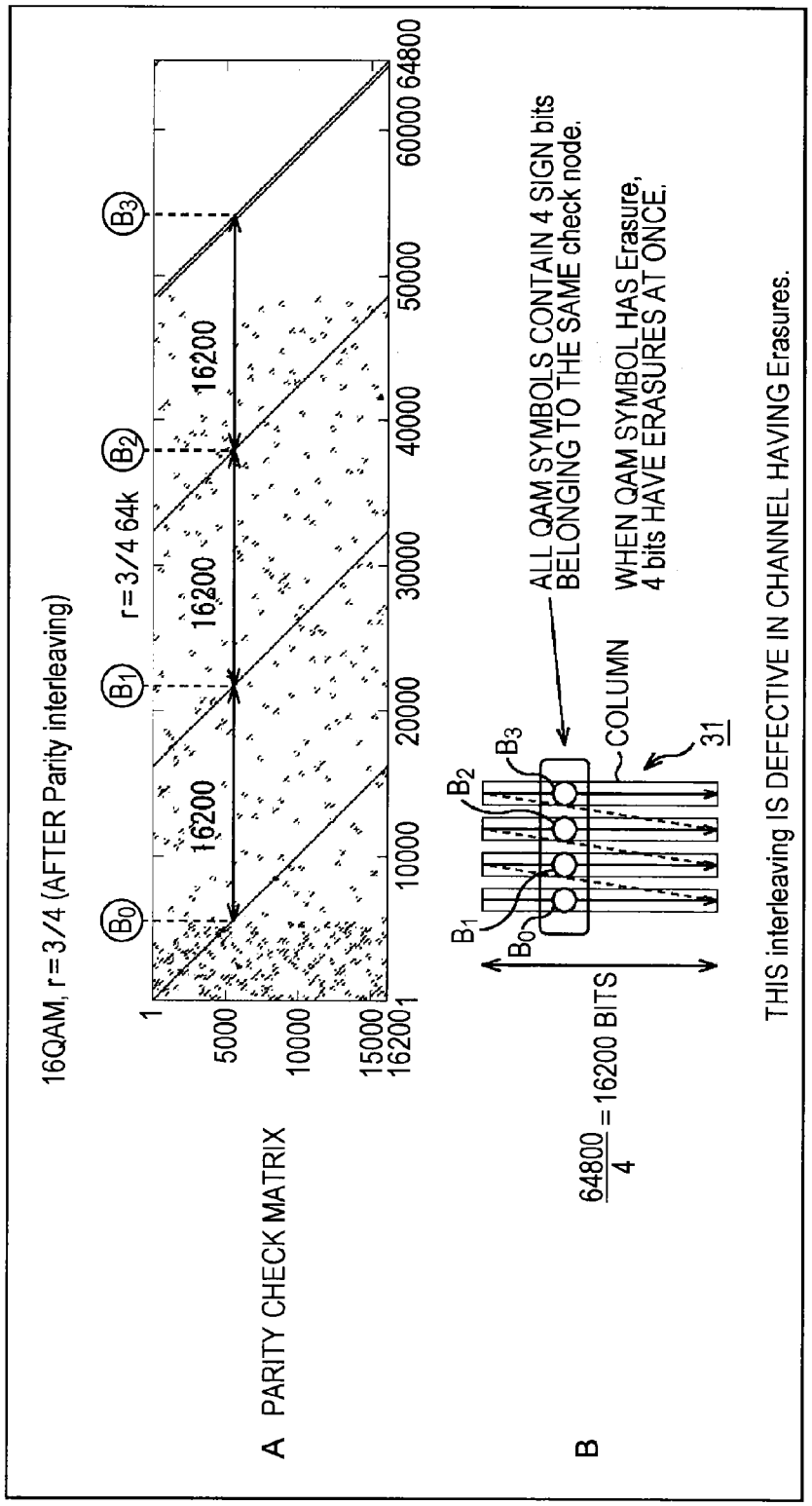
FIG. 23 is a diagram showing a transformed parity check matrix.

FIG. 23 shows a transformed parity check matrix.

Specifically, A of FIG. 23 shows a transformed parity check matrix of the parity check matrix H of an LDPC code having a code length N of 64800 bits and a code rate (r) of 3/4.

In A of FIG. 23, the positions of the elements having the value "1" in the transformed parity check matrix are indicated by dots (•).

B of FIG. 23 illustrates an operation to be performed by the demultiplexer 25 (FIG. 9) on the LDPC code of the transformed parity check matrix shown in A of FIG. 23 or an LDPC code subjected to parity interleaving.

In B of FIG. 23, the modulation method is 16QAM, and the sign bits of an LDPC code subjected to parity interleaving are written in the column direction in the four columns forming the memory 31 of the demultiplexer 25.

The sign bits written in the column direction in the four columns forming the memory 31 are read out four bits at a time in the row direction, and then form one symbol.

In this case, the four sign bits $B_0$, $B_1$, $B_2$, and $B_3$, which form one symbol, might be the sign bits corresponding to the elements "1" in an arbitrary row in the transformed parity check matrix shown in A of FIG. 23. In that case, the variable nodes corresponding to the sign bits $B_0$, $B_1$, $B_2$, and $B_3$ are connected to the same check node.

Therefore, in a case where the four sign bits $B_0$, $B_1$, $B_2$, and $B_3$ of one symbol are the sign bits corresponding to the elements "1" in an arbitrary row in the transformed parity check matrix, if an erasure occurs in the symbol, an appropriate message cannot be obtained from the check node to which the variable nodes corresponding to the sign bits $B_0$, $B_1$, $B_2$, and $B_3$ are connected. As a result, decoding performance is degraded.

In cases of code rates other than 3/4, the sign bits corresponding to variable nodes connected to the same check node might also form one symbol of 16QAM.

In view of this, the column twist interleaver 24 performs column twist interleaving to interleave the sign bits of an LDPC code that has been subjected to parity interleaving and been supplied from the parity interleaver 23, so that the sign bits corresponding to the elements "1" in an arbitrary row in the transformed parity check matrix are not contained in one symbol.

Figure 24:
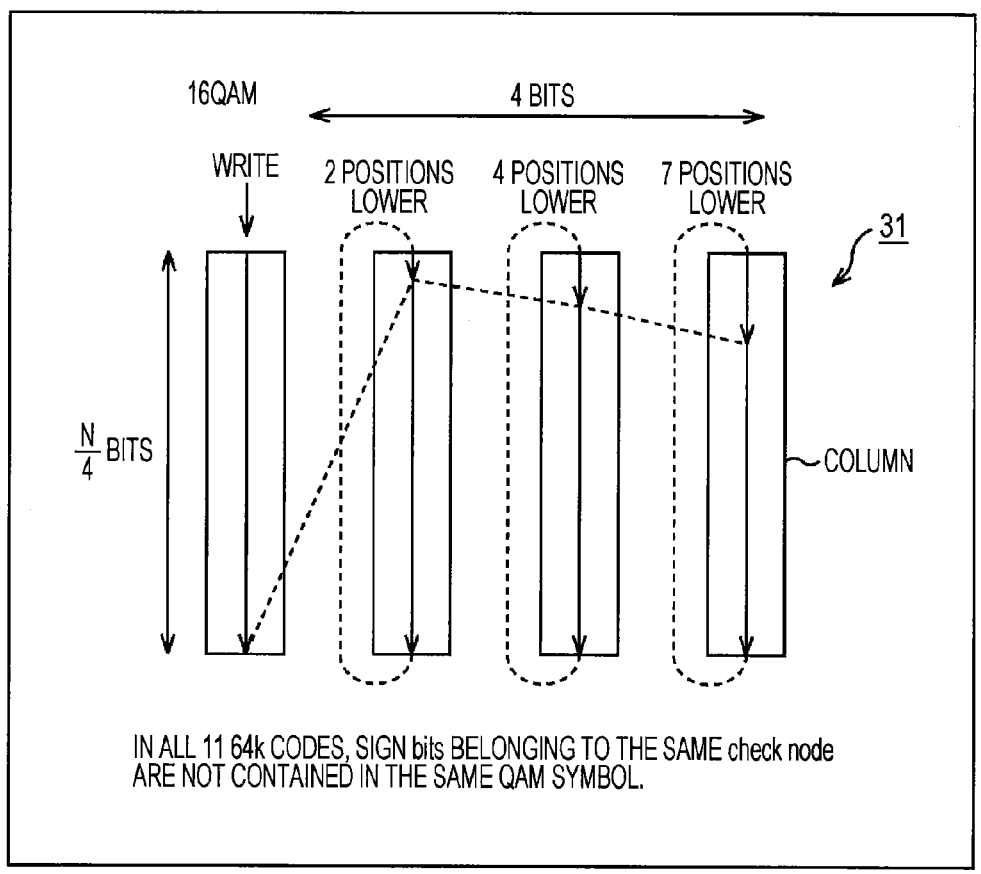
FIG. 24 is a diagram for explaining an operation of a column twist interleaver 24.

FIG. 24 is a diagram for explaining the column twist interleaving.

Specifically, FIG. 24 shows the memory 31 (FIGS. 18 and 19) of the demultiplexer 25.

As described above with reference to FIG. 18, the memory 31 has a storage capacity to store mb bits in the column (vertical) direction and N/(mb) bits in the row (horizontal) direction, and is formed with mb columns. The column twist interleaver 24 performs column twist interleaving on the memory 31 by controlling write start positions when writing the sign bits of an LDPC code in the column direction and reading out the sign bits in the row direction.

That is, the column twist interleaver 24 appropriately changes write start positions in which sign bit writing is started in the respective columns, so that the sign bits forming one symbol to be read out in the row direction are not the sign bits corresponding to the elements "1" in an arbitrary row in the transformed parity check matrix (or the sign bits of the LDPC code are rearranged so that the sign bits corresponding to the elements "1" in an arbitrary row in the parity check matrix are not contained in one symbol).

Here, FIG. 24 shows an example structure of the memory 31 in a case where the modulation method is 16QAM, and the multiple number b described with reference to FIG. 18 is 1. Accordingly, the number m of the sign bits of an LDPC code to be one symbol is 4, and the memory 31 is formed with four (=mb) columns.

In the column twist interleaver 24 (instead of the demultiplexer 25 shown in FIG. 18), writing of sign bits of an LDPC code into the four columns forming the memory 31 in the direction from the top toward the bottom (in the column direction) is performed on the columns in the direction from left to right.

When the writing of the sign bits is completed in the rightmost column, the column twist interleaver 24 reads out the sign bits, four bits (mb bits) at a time, in the row direction from the first row of all the columns forming the memory 31, and outputs the sign bits as the LDPC code subjected to the column twist interleaving, to the shuffling unit 32 (shown in FIGS. 18 and 19) of the demultiplexer 25.

Where the address of the top position (the uppermost position) in each column is 0, and the addresses of the respective positions in the column direction are represented by integers in ascending order, the column twist interleaver 24 sets the write start position in the position at the address 0 in the leftmost column, sets the write start position in the position at the address 2 in the second column (from the left), sets the write start position in the position at the address 4 in the third column, and sets the write start position in the position at the address 7 in the fourth column.

In each column in which the write start position is not the position at the address 0, the writing operation returns to the top (the position at the address 0) after the sign bit writing has been performed in the lowermost position, and the writing is then continued until reaching the position immediately before the write start position. After that, the writing is performed on the next (right) column.

By performing the above described column twist interleaving on an LDPC code specified in the DVB-T.2 standards, the sign bits corresponding to variable nodes connected to the same check node can be prevented from forming one symbol (or being contained in the same symbol) of 16QAM. As a result, decoding performance in channels having erasures can be improved.

FIG. 25 shows the numbers of columns necessary for column twist interleaving in the memory 31 and the addresses of the write start positions for respective LDPC codes that are specified in the DVB-T.2 standards, have a code length N of 64800, and have 11 different code rates, in conjunction with respective modulation methods.

In a case where the multiple number b is 1, QPSK is used as the modulation method, for example, and accordingly, the number m of bits in one symbol is 2, the memory 31 has two columns to store 2×1 (=mb) bits in the row direction, and stores 64800/(2×1) bits in the column direction, as shown in FIG. 25.

The write start position in the first column of the two columns in the memory 31 is the position at the address 0, and the write start position in the second column is the position at the address 2.

If one of the first through third shuffling methods shown in FIG. 18 is used as the shuffling method in the shuffling operation by the demultiplexer 25 (FIG. 9), for example, the multiple number b is 1.

In a case where the multiple number b is 2, QPSK is used as the modulation method, for example, and accordingly, the number m of bits in one symbol is 2, the memory 31 has four columns to store 2×2 bits in the row direction, and stores 64800/(2×2) bits in the column direction, as shown in FIG. 25.

The write start position in the first column of the four columns in the memory 31 is the position at the address 0, the write start position in the second column is the position at the address 2, the write start position in the third column is the position at the address 4, and the write start position in the fourth column is the position at the address 7.

If the fourth shuffling method shown in FIG. 19 is used as the shuffling method in the shuffling operation by the demultiplexer 25 (FIG. 9), for example, the multiple number b is 2.

In a case where the multiple number b is 1, 16QAM is used as the modulation method, for example, and accordingly, the number m of bits in one symbol is 4, the memory 31 has four columns to store 4×1 bits in the row direction, and stores 64800/(4×1) bits in the column direction, as shown in FIG. 25.

The write start position in the first column of the four columns in the memory 31 is the position at the address 0, the write start position in the second column is the position at the address 2, the write start position in the third column is the position at the address 4, and the write start position in the fourth column is the position at the address 7.

In a case where the multiple number b is 2, 16QAM is used as the modulation method, for example, and accordingly, the number m of bits in one symbol is 4, the memory 31 has eight columns to store 4×2 bits in the row direction, and stores 64800/(4×2) bits in the column direction, as shown in FIG. 25.

The write start position in the first column of the eight columns in the memory 31 is the position at the address 0, the write start position in the second column is the position at the address 0, the write start position in the third column is the position at the address 2, the write start position in the fourth column is the position at the address 4, the write start position in the fifth column is the position at the address 4, the write start position in the sixth column is the position at the address 5, the write start position in the seventh column is the position at the address 7, and the write start position in the eighth column is the position at the address 7.

In a case where the multiple number b is 1, 64QAM is used as the modulation method, for example, and accordingly, the number m of bits in one symbol is 6, the memory 31 has six columns to store 6×1 bits in the row direction, and stores 64800/(6×1) bits in the column direction, as shown in FIG. 25.

The write start position in the first column of the six columns in the memory 31 is the position at the address 0, the write start position in the second column is the position at the address 2, the write start position in the third column is the position at the address 5, the write start position in the fourth column is the position at the address 9, the write start position in the fifth column is the position at the address 10, and the write start position in the sixth column is the position at the address 13.

In a case where the multiple number b is 2, 64QAM is used as the modulation method, for example, and accordingly, the number m of bits in one symbol is 6, the memory 31 has 12 columns to store 6×2 bits in the row direction, and stores 64800/(6×2) bits in the column direction, as shown in FIG. 25.

The write start position in the first column of the 12 columns in the memory 31 is the position at the address 0, the write start position in the second column is the position at the address 0, the write start position in the third column is the position at the address 2, the write start position in the fourth column is the position at the address 2, the write start position in the fifth column is the position at the address 3, the write start position in the sixth column is the position at the address 4, the write start position in the seventh column is the position at the address 4, the write start position in the eighth column is the position at the address 5, the write start position in the ninth column is the position at the address 5, the write start position in the tenth column is the position at the address 7, the write start position in the 11th column is the position at the address 8, and the write start position in the 12th column is the position at the address 9.

In a case where the multiple number b is 1, 256QAM is used as the modulation method, for example, and accordingly, the number m of bits in one symbol is 8, the memory 31 has eight columns to store 8×1 bits in the row direction, and stores 64800/(8×1) bits in the column direction, as shown in FIG. 25.

The write start position in the first column of the eight columns in the memory 31 is the position at the address 0, the write start position in the second column is the position at the address 0, the write start position in the third column is the position at the address 2, the write start position in the fourth column is the position at the address 4, the write start position in the fifth column is the position at the address 4, the write start position in the sixth column is the position at the address 5, the write start position in the seventh column is the position at the address 7, and the write start position in the eighth column is the position at the address 7.

In a case where the multiple number b is 2, 256QAM is used as the modulation method, for example, and accordingly, the number m of bits in one symbol is 8, the memory 31 has 16 columns to store 8×2 bits in the row direction, and stores 64800/(8×2) bits in the column direction, as shown in FIG. 25.

The write start position in the first column of the 16 columns in the memory 31 is the position at the address 0, the write start position in the second column is the position at the address 2, the write start position in the third column is the position at the address 2, the write start position in the fourth column is the position at the address 2, the write start position in the fifth column is the position at the address 2, the write start position in the sixth column is the position at the address 3, the write start position in the seventh column is the position at the address 7, the write start position in the eighth column is the position at the address 15, the write start position in the ninth column is the position at the address 16, the write start position in the tenth column is the position at the address 20, the write start position in the 11th column is the position at the address 22, the write start position in the 12th column is the position at the address 22, the write start position in the 13th column is the position at the address 27, the write start position in the 14th column is the position at the address 27, the write start position in the 15th column is the position at the address 28, and the write start position in the 16th column is the position at the address 32.

In a case where the multiple number b is 1, 1024QAM is used as the modulation method, for example, and accordingly, the number m of bits in one symbol is 10, the memory 31 has 10 columns to store 10×1 bits in the row direction, and stores 64800/(10×1) bits in the column direction, as shown in FIG. 25.

The write start position in the first column of the columns in the memory 31 is the position at the address 0, the write start position in the second column is the position at the address 3, the write start position in the third column is the position at the address 6, the write start position in the fourth column is the position at the address 8, the write start position in the fifth column is the position at the address 11, the write start position in the sixth column is the position at the address 13, the write start position in the seventh column is the position at the address 15, the write start position in the eighth column is the position at the address 17, the write start position in the ninth column is the position at the address 18, and the write start position in the tenth column is the position at the address 20.

In a case where the multiple number b is 2, 1024QAM is used as the modulation method, for example, and accordingly, the number m of bits in one symbol is 10, the memory 31 has 20 columns to store 10×2 bits in the row direction, and stores 64800/(10×2) bits in the column direction, as shown in FIG. 25.

The write start position in the first column of the 20 columns in the memory 31 is the position at the address 0, the write start position in the second column is the position at the address 1, the write start position in the third column is the position at the address 3, the write start position in the fourth column is the position at the address 4, the write start position in the fifth column is the position at the address 5, the write start position in the sixth column is the position at the address 6, the write start position in the seventh column is the position at the address 6, the write start position in the eighth column is the position at the address 9, the write start position in the ninth column is the position at the address 13, the write start position in the tenth column is the position at the address 14, the write start position in the 11th column is the position at the address 14, the write start position in the 12th column is the position at the address 16, the write start position in the 13th column is the position at the address 21, the write start position in the 14th column is the position at the address 21, the write start position in the 15th column is the position at the address 23, the write start position in the 16th column is the position at the address 25, the write start position in the 17th column is the position at the address 25, the write start position in the 18th column is the position at the address 26, the write start position in the 19th column is the position at the address 28, and the write start position in the 20th column is the position at the address 30.

In a case where the multiple number b is 1, 4096QAM is used as the modulation method, for example, and accordingly, the number m of bits in one symbol is 12, the memory 31 has 12 columns to store 12×1 bits in the row direction, and stores 64800/(12×1) bits in the column direction, as shown in FIG. 25.

The write start position in the first column of the 12 columns in the memory 31 is the position at the address 0, the write start position in the second column is the position at the address 0, the write start position in the third column is the position at the address 2, the write start position in the fourth column is the position at the address 2, the write start position in the fifth column is the position at the address 3, the write start position in the sixth column is the position at the address 4, the write start position in the seventh column is the position at the address 4, the write start position in the eighth column is the position at the address 5, the write start position in the ninth column is the position at the address 5, the write start position in the tenth column is the position at the address 7, the write start position in the 11th column is the position at the address 8, and the write start position in the 12th column is the position at the address 9.

In a case where the multiple number b is 2, 4096QAM is used as the modulation method, for example, and accordingly, the number m of bits in one symbol is 12, the memory

31 has 24 columns to store 12×2 bits in the row direction, and stores 64800/(12×2) bits in the column direction, as shown in FIG. 25.

The write start position in the first column of the 24 columns in the memory 31 is the position at the address 0, the write start position in the second column is the position at the address 5, the write start position in the third column is the position at the address 8, the write start position in the fourth column is the position at the address 8, the write start position in the fifth column is the position at the address 8, the write start position in the sixth column is the position at the address 8, the write start position in the seventh column is the position at the address 10, the write start position in the eighth column is the position at the address 10, the write start position in the ninth column is the position at the address 10, the write start position in the tenth column is the position at the address 12, the write start position in the 11th column is the position at the address 13, the write start position in the 12th column is the position at the address 16, the write start position in the 13th column is the position at the address 17, the write start position in the 14th column is the position at the address 19, the write start position in the 15th column is the position at the address 21, the write start position in the 16th column is the position at the address 22, the write start position in the 17th column is the position at the address 23, the write start position in the 18th column is the position at the address 26, the write start position in the 19th column is the position at the address 37, the write start position in the 20th column is the position at the address 39, the write start position in the 21st column is the position at the address 40, the write start position in the 22nd column is the position at the address 41, the write start position in the 23rd column is the position at the address 41, and the write start position in the 24th column is the position at the address 41.

FIG. 26 shows the numbers of columns necessary for column twist interleaving in the memory 31 and the addresses of the write start positions for respective LDPC codes that are specified in the DVB-T.2 standards, have a code length N of 16200, and have 10 different code rates, in conjunction with respective modulation methods.

In a case where the multiple number b is 1, QPSK is used as the modulation method, for example, and accordingly, the number m of bits in one symbol is 2, the memory 31 has two columns to store 2×1 bits in the row direction, and stores 16200/(2×1) bits in the column direction, as shown in FIG. 26.

The write start position in the first column of the two columns in the memory 31 is the position at the address 0, and the write start position in the second column is the position at the address 0.

In a case where the multiple number b is 2, QPSK is used as the modulation method, for example, and accordingly, the number m of bits in one symbol is 2, the memory 31 has four columns to store 2×2 bits in the row direction, and stores 16200/(2×2) bits in the column direction, as shown in FIG. 26.

The write start position in the first column of the four columns in the memory 31 is the position at the address 0, the write start position in the second column is the position at the address 2, the write start position in the third column is the position at the address 3, and the write start position in the fourth column is the position at the address 3.

In a case where the multiple number b is 1, 16QAM is used as the modulation method, for example, and accordingly, the number m of bits in one symbol is 4, the memory 31 has four columns to store 4×1 bits in the row direction, and stores 16200/(4×1) bits in the column direction, as shown in FIG. 26.

The write start position in the first column of the four columns in the memory 31 is the position at the address 0, the write start position in the second column is the position at the address 2, the write start position in the third column is the position at the address 3, and the write start position in the fourth column is the position at the address 3.

In a case where the multiple number b is 2, 16QAM is used as the modulation method, for example, and accordingly, the number m of bits in one symbol is 4, the memory 31 has eight columns to store 4×2 bits in the row direction, and stores 16200/(4×2) bits in the column direction, as shown in FIG. 26.

The write start position in the first column of the eight columns in the memory 31 is the position at the address 0, the write start position in the second column is the position at the address 0, the write start position in the third column is the position at the address 0, the write start position in the fourth column is the position at the address 1, the write start position in the fifth column is the position at the address 7, the write start position in the sixth column is the position at the address 20, the write start position in the seventh column is the position at the address 20, and the write start position in the eighth column is the position at the address 21.

In a case where the multiple number b is 1, 64QAM is used as the modulation method, for example, and accordingly, the number m of bits in one symbol is 6, the memory 31 has six columns to store 6×1 bits in the row direction, and stores 16200/(6×1) bits in the column direction, as shown in FIG. 26.

The write start position in the first column of the six columns in the memory 31 is the position at the address 0, the write start position in the second column is the position at the address 0, the write start position in the third column is the position at the address 2, the write start position in the fourth column is the position at the address 3, the write start position in the fifth column is the position at the address 7, and the write start position in the sixth column is the position at the address 7.

In a case where the multiple number b is 2, 64QAM is used as the modulation method, for example, and accordingly, the number m of bits in one symbol is 6, the memory 31 has 12 columns to store 6×2 bits in the row direction, and stores 16200/(6×2) bits in the column direction, as shown in FIG. 26.

The write start position in the first column of the 12 columns in the memory 31 is the position at the address 0, the write start position in the second column is the position at the address 0, the write start position in the third column is the position at the address 0, the write start position in the fourth column is the position at the address 2, the write start position in the fifth column is the position at the address 2, the write start position in the sixth column is the position at the address 2, the write start position in the seventh column is the position at the address 3, the write start position in the eighth column is the position at the address 3, the write start position in the ninth column is the position at the address 3, the write start position in the tenth column is the position at the address 6, the write start position in the 11th column is the position at the address 7, and the write start position in the 12th column is the position at the address 7.

In a case where the multiple number b is 1, 256QAM is used as the modulation method, for example, and accordingly, the number m of bits in one symbol is 8, the memory 31 has eight columns to store 8×1 bits in the row direction, and stores 16200/(8×1) bits in the column direction, as shown in FIG. 26.

The write start position in the first column of the eight columns in the memory 31 is the position at the address 0, the write start position in the second column is the position at the address 0, the write start position in the third column is the position at the address 0, the write start position in the fourth column is the position at the address 1, the write start position in the fifth column is the position at the address 7, the write start position in the sixth column is the position at the address 20, the write start position in the seventh column is the position at the address 20, and the write start position in the eighth column is the position at the address 21.

In a case where the multiple number b is 1, 1024QAM is used as the modulation method, for example, and accordingly, the number m of bits in one symbol is 10, the memory 31 has 10 columns to store 10×1 bits in the row direction, and stores 16200/(10×1) bits in the column direction, as shown in FIG. 26.

The write start position in the first column of the 10 columns in the memory 31 is the position at the address 0, the write start position in the second column is the position at the address 1, the write start position in the third column is the position at the address 2, the write start position in the fourth column is the position at the address 2, the write start position in the fifth column is the position at the address 3, the write start position in the sixth column is the position at the address 3, the write start position in the seventh column is the position at the address 4, the write start position in the eighth column is the position at the address 4, the write start position in the ninth column is the position at the address 5, and the write start position in the tenth column is the position at the address 7.

In a case where the multiple number b is 2, 1024QAM is used as the modulation method, for example, and accordingly, the number m of bits in one symbol is 10, the memory 31 has 20 columns to store 10×2 bits in the row direction, and stores 16200/(10×2) bits in the column direction, as shown in FIG. 26.

The write start position in the first column of the 20 columns in the memory 31 is the position at the address 0, the write start position in the second column is the position at the address 0, the write start position in the third column is the position at the address 0, the write start position in the fourth column is the position at the address 2, the write start position in the fifth column is the position at the address 2, the write start position in the sixth column is the position at the address 2, the write start position in the seventh column is the position at the address 2, the write start position in the eighth column is the position at the address 2, the write start position in the ninth column is the position at the address 5, the write start position in the tenth column is the position at the address 5, the write start position in the 11th column is the position at the address 5, the write start position in the 12th column is the position at the address 5, the write start position in the 13th column is the position at the address 5, the write start position in the 14th column is the position at the address 7, the write start position in the 15th column is the position at the address 7, the write start position in the 16th column is the position at the address 7, the write start position in the 17th column is the position at the address 7, the write start position in the 18th column is the position at the address 8, the write start position in the 19th column is the position at the address 8, and the write start position in the 20th column is the position at the address 10.

In a case where the multiple number b is 1, 4096QAM is used as the modulation method, for example, and accordingly, the number m of bits in one symbol is 12, the memory 31 has 12 columns to store 12×1 bits in the row direction, and stores 16200/(12×1) bits in the column direction, as shown in FIG. 26.

The write start position in the first column of the 12 columns in the memory 31 is the position at the address 0, the write start position in the second column is the position at the address 0, the write start position in the third column is the position at the address 0, the write start position in the fourth column is the position at the address 2, the write start position in the fifth column is the position at the address 2, the write start position in the sixth column is the position at the address 2, the write start position in the seventh column is the position at the address 3, the write start position in the eighth column is the position at the address 3, the write start position in the ninth column is the position at the address 3, the write start position in the tenth column is the position at the address 6, the write start position in the 11th column is the position at the address 7, and the write start position in the 12th column is the position at the address 7.

In a case where the multiple number b is 2, 4096QAM is used as the modulation method, for example, and accordingly, the number m of bits in one symbol is 12, the memory 31 has 24 columns to store 12×2 bits in the row direction, and stores 16200/(12×2) bits in the column direction, as shown in FIG. 26.

The write start position in the first column of the 24 columns in the memory 31 is the position at the address 0, the write start position in the second column is the position at the address 0, the write start position in the third column is the position at the address 0, the write start position in the fourth column is the position at the address 0, the write start position in the fifth column is the position at the address 0, the write start position in the sixth column is the position at the address 0, the write start position in the seventh column is the position at the address 0, the write start position in the eighth column is the position at the address 1, the write start position in the ninth column is the position at the address 1, the write start position in the tenth column is the position at the address 1, the write start position in the 11th column is the position at the address 2, and the write start position in the 12th column is the position at the address 2, the write start position in the 13th column is the position at the address 2, the write start position in the 14th column is the position at the address 3, the write start position in the 15th column is the position at the address 7, the write start position in the 16th column is the position at the address 9, the write start position in the 17th column is the position at the address 9, the write start position in the 18th column is the position at the address 9, the write start position in the 19th column is the position at the address 10, the write start position in the 20th column is the position at the address 10, the write start position in the 21st column is the position at the address 10, the write start position in the 22nd column is the position at the address 10, the write start position in the 23rd column is the position at the address 10, and the write start position in the 24th column is the position at the address 11.

Figure 27:
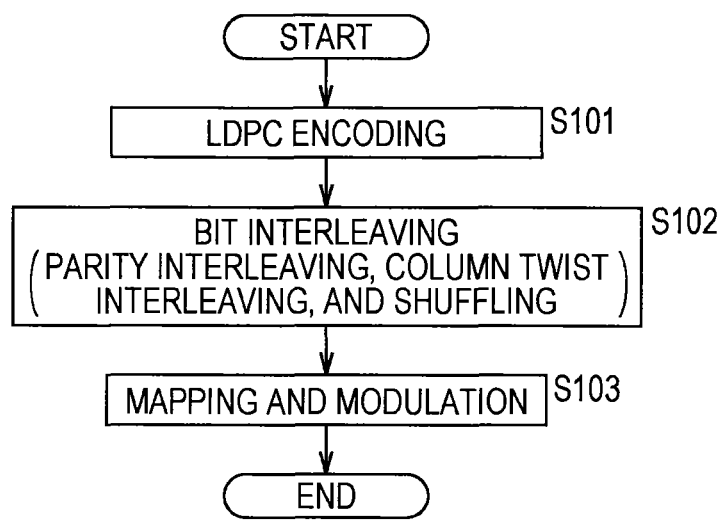
FIG. 27 is a flowchart for explaining operations to be performed at the bit interleaver 116 and a QAM encoder 117.

FIG. 27 is a flowchart for explaining operations to be performed at the LDPC encoder 115, the bit interleaver 116, and the QAM encoder 117 shown in FIG. 8.

The LDPC encoder 115 awaits a supply of LDPC target data from the BCH encoder 114. In step S101, the LDPC encoder 115 encodes the LDPC target data into an LDPC code, and supplies the LDPC code to the bit interleaver 116. The operation then moves on to step S102.

In step S102, the bit interleaver 116 performs bit interleaving on the LDPC code supplied from the LDPC encoder 115, and supplies the symbol obtained by symbolizing the LDPC code subjected to the bit interleaving, to the QAM encoder 117. The operation then moves on to step S103.

Specifically, in step S102, the parity interleaver 23 in the bit interleaver 116 (FIG. 9) performs parity interleaving on the LDPC code supplied from the LDPC encoder 115, and supplies the LDPC code subjected to the parity interleaving, to the column twist interleaver 24.

The column twist interleaver 24 performs column twist interleaving on the LDPC code supplied from the parity interleaver 23, and supplies the LDPC code to the demultiplexer 25.

The demultiplexer 25 performs a shuffling operation to shuffle the sign bits of the LDPC code subjected to the column twist interleaving by the column twist interleaver 24, and turn the shuffled sign bits into symbol bits of a symbol (or into the bits representing the symbol).

Here, the shuffling operation by the demultiplexer 25 can be performed in accordance with one of the first through fourth shuffling methods shown in FIGS. 18 and 19, or can be performed in accordance with an assignment rule. The assignment rule is a rule for assigning the sign bits of an LDPC code to the symbol bits representing a symbol, and will be described later in detail.

The symbol obtained through the shuffling operation by the demultiplexer 25 is supplied from the demultiplexer 25 to the QAM encoder 117.

In step S103, the QAM encoder 117 performs orthogonal modulation by mapping the symbol supplied from the demultiplexer 25 to signal points defined by the modulation method used in the orthogonal modulation performed at the QAM encoder 117, and supplies the resultant data to the time interleaver 118.

As described above, by performing parity interleaving and column twist interleaving, tolerance for erasures and burst errors can be increased in cases where sign bits of an LDPC code are transmitted as one symbol.

In FIG. 9, the parity interleaver 23 as a block for performing parity interleaving and the column twist interleaver 24 as a block for performing column twist interleaving are formed separately from each other, for ease of explanation. However, the parity interleaver 23 and the column twist interleaver 24 can be integrally formed.

Specifically, both the parity interleaving and the column twist interleaving can be performed by writing and reading sign bits into and out of the memory, and can be represented by a matrix that converts addresses at which sign bits are written (write addresses) into addresses at which the sign bits are read (read addresses).

Accordingly, if a matrix is generated by multiplying the matrix representing the parity interleaving by the matrix representing the column twist interleaving, the result of the column twist interleaving performed on an LDPC code subjected to the parity interleaving can be obtained by converting the sign bits with the use of the matrix.

Also, the demultiplexer 25 can be integrally formed with the parity interleaver 23 and the column twist interleaver 24.

Specifically, the shuffling operation to be performed at the demultiplexer 25 can also be represented by a matrix that converts write addresses in the memory 31 storing an LDPC code into read addresses.

Accordingly, if a matrix is generated by multiplying the matrix representing the parity interleaving by the matrix representing the column twist interleaving and the matrix representing the shuffling operation, the parity interleaving, the column twist interleaving, and the shuffling operation can be collectively performed with the use of the matrix.

It should be noted that either the parity interleaving or the column twist interleaving may be performed, or neither the parity interleaving nor the column twist interleaving may be performed.

Figure 29:
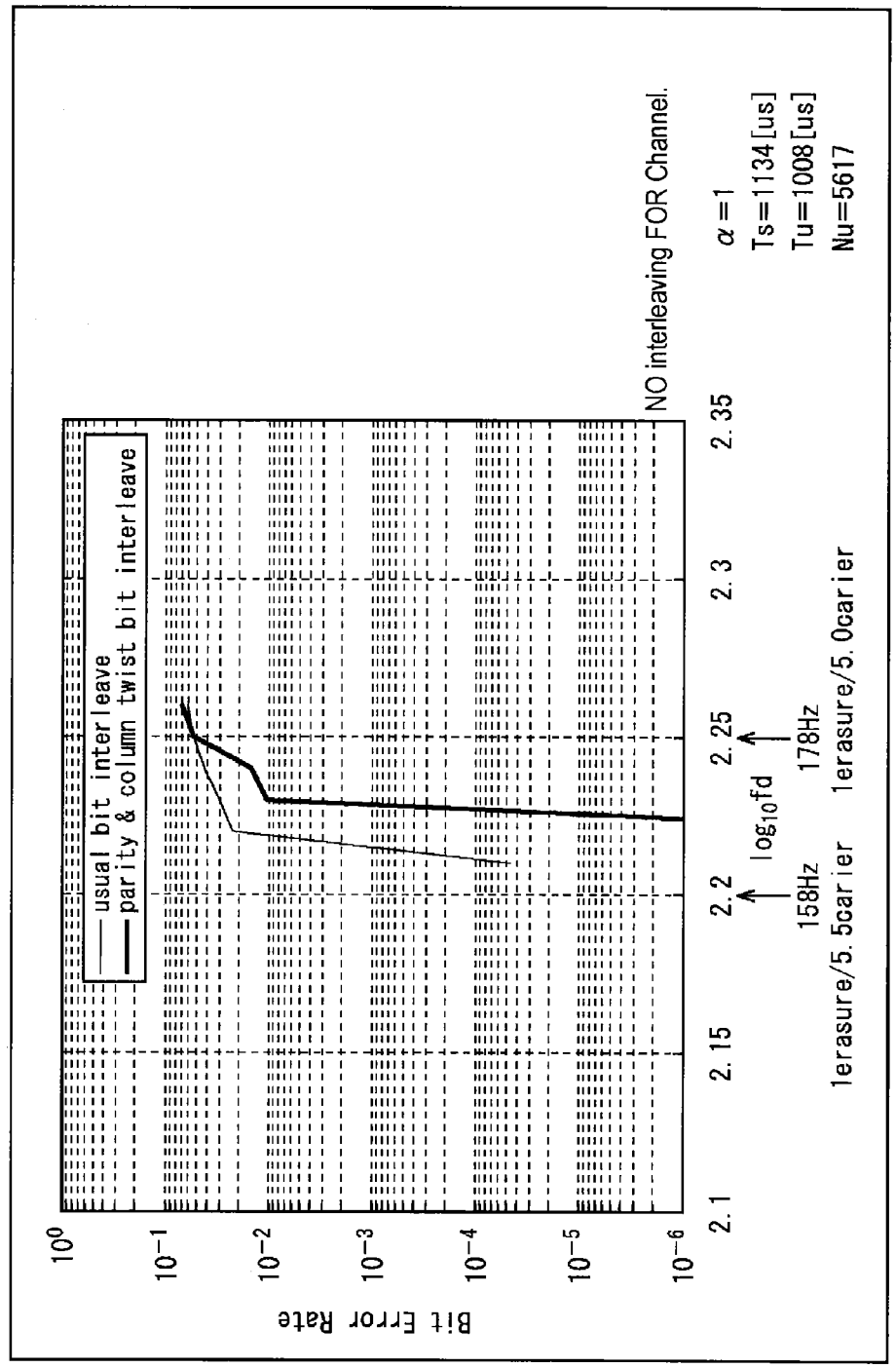
FIG. 29 is a diagram showing the relationship between the error rates obtained in the simulation and a Doppler frequency $f_d$ of a flutter.
Figure 30:
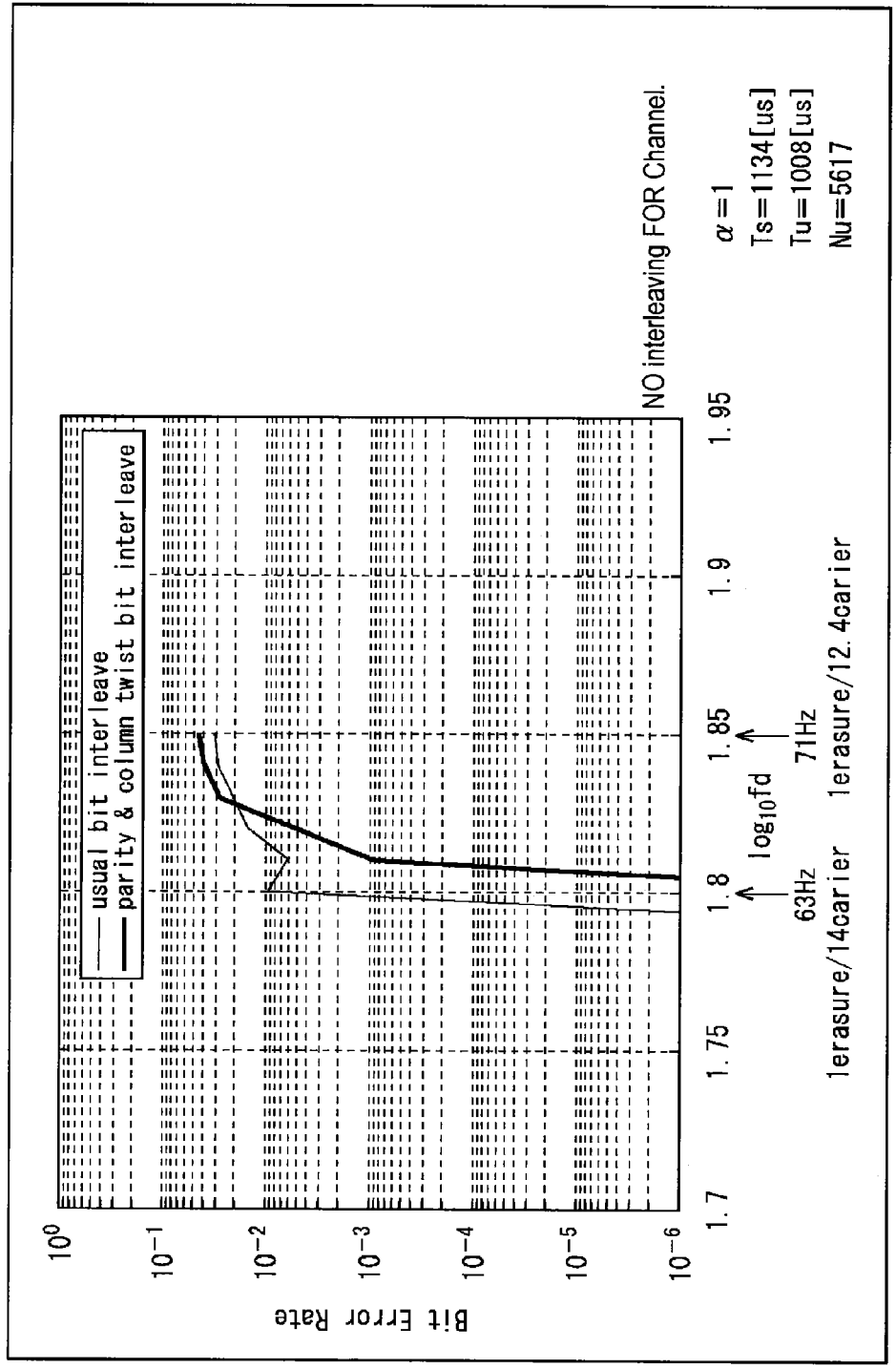
FIG. 30 is a diagram showing the relationship between the error rates obtained in the simulation and the Doppler frequency $f_d$ of the flutter.

Referring now to FIGS. 28 through 30, a simulation performed on the transmission device 11 shown in FIG. 8 to measure error rates (bit error rates) is described.

The simulation was performed by using a channel having a flutter with a D/U of 0 dB.

FIG. 28 shows a model of the channel used in the simulation.

Specifically, A of FIG. 28 shows a model of the flutter used in the simulation.

B of FIG. 28 shows a model of the channel having the flutter shown as the model in A of FIG. 28.

In B of FIG. 28, H represents the model of the flutter shown in A of FIG. 28. Also, in B of FIG. 28, N represents ICI (Inter Carrier Interference), and in the simulation, an expected value $E[N^2]$ of the power was approximated by AWGN.

FIGS. 29 and 30 show the relationships between the error rates obtained in the simulation and the Doppler frequency $f_d$ of the flutter.

FIG. 29 shows the relationship between the error rates and the Doppler frequency $f_d$ in cases where the modulation method is 16QAM, the code rate (r) is (3/4), and the shuffling method is the first shuffling method. FIG. 30 shows the relationship between the error rates and the Doppler frequency $f_d$ in cases where the modulation method is 64QAM, the code rate (r) is (5/6), and the shuffling method is the first shuffling method.

Further, in FIGS. 29 and 30, each thick line indicates the relationship between the error rates and the Doppler frequency $f_d$ in cases where the parity interleaving, the column twist interleaving, and the shuffling operation were all performed. Each thin line indicates the relationship between the error rates and the Doppler frequency $f_d$ in cases where only the shuffling operation was performed among the parity interleaving, the column twist interleaving, and the shuffling operation.

As can be seen from either of FIGS. 29 and 30, improved error rates (lower error rates) were obtained in a case where the parity interleaving, the column twist interleaving, and the shuffling operation were all performed, than in cases where only the shuffling operation was performed.

[Example Structure of LDPC Encoder 115]

Figure 31:
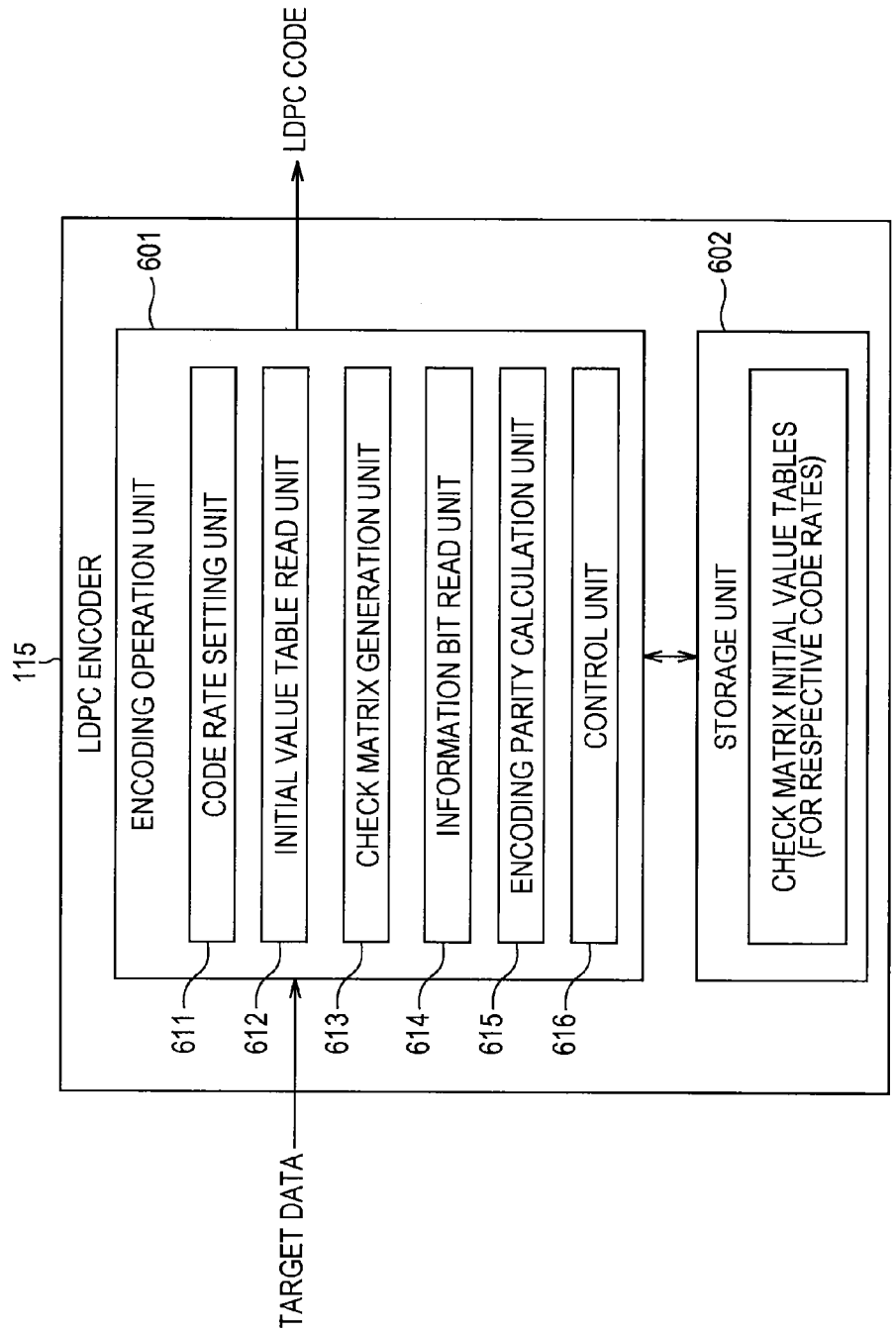
FIG. 31 is a block diagram showing an example structure of the LDPC encoder 115.

FIG. 31 is a block diagram showing an example structure of the LDPC encoder 115 shown in FIG. 8.

It should be noted that the LDPC encoder 122 shown in FIG. 8 has the same structure.

As described above with reference to FIGS. 12 and 13, in the DVB-T.2 standards, LDPC codes with two code lengths N of 64800 bits and 16200 bits are specified.

As for the LDPC codes with the code length N of 64800 bits, 11 code rates of 1/4, 1/3, 2/5, 1/2, 3/5, 2/3, 3/4, 4/5, 5/6, 8/9, and 9/10 are specified. As for the LDPC codes with the code length N of 16200 bits, 10 code rates 1/4, 1/3, 2/5, 1/2, 3/5, 2/3, 3/4, 4/5, 5/6, and 8/9 are specified (FIGS. 12 and 13).

The LDPC encoder 115 can perform encoding with LDPC codes having the code lengths N of 64800 bits and 16200 bits at the respective code rates (error correction encoding) in accordance with the parity check matrix H prepared for each code length N and each code rate.

The LDPC encoder 115 includes an encoding operation unit 601 and a storage unit 602.

The encoding operation unit 601 includes a code rate setting unit 611, an initial value table read unit 612, a check matrix generation unit 613, an information bit read unit 614, an encoding parity calculation unit 615, and a control unit 616. The encoding operation unit 601 performs LDPC encoding on LDPC target data supplied to the LDPC encoder 115, and supplies the resultant LDPC code to the bit interleaver 116 (FIG. 8).

Specifically, the code rate setting unit 611 sets a code length N and a code rate of an LDPC code in accordance with an operation by an operator, for example.

The initial value table read unit 612 reads, from the storage unit 602, a later described check matrix initial value table corresponding to the code length N and the code rate set by the code rate setting unit 611.

Based on the check matrix initial value table read by the initial value table read unit 612, the check matrix generation unit 613 generates the parity check matrix H by arranging the elements "1" of the information matrix $H_A$ in accordance with the information length K (=code length N−parity length M) corresponding to the code length N and the code rate set by the code rate setting unit 611 in the column direction in 360-column cycles (in accordance with the unit column number P in the cyclic structure). The parity check matrix H is then stored into the storage unit 602.

The information bit read unit 614 reads (extracts) information bits equivalent to the information length K from LDPC target data supplied to the LDPC encoder 115.

The encoding parity calculation unit 615 reads the parity check matrix H generated by the check matrix generation unit 613 from the storage unit 602, and, using the parity check matrix H, calculates the parity bits for the information bits read by the information bit read unit 614 according to a predetermined equation, to generate a code word (an LDPC code).

The control unit 616 controls the respective blocks forming the encoding operation unit 601.

The storage unit 602 stores check matrix initial value tables and the like corresponding to the code rates and the like shown in FIGS. 12 and 13 for the respective code lengths N of 64800 bits and 16200 bits, for example. The storage unit 602 also temporarily stores data necessary in the operation of the encoding operation unit 601.

FIG. 32 is a flowchart for explaining the operation of the LDPC encoder 115 shown in FIG. 31.

In step S201, the code rate setting unit 611 determines (sets) a code length N and a code rate r to be used in LDPC encoding.

In step S202, the initial value table read unit 612 reads, from the storage unit 602, a predetermined check matrix initial value table corresponding to the code length N and the code rate r determined by the code rate setting unit 611.

In step S203, using the check matrix initial value table which the initial value table read unit 612 has read from the storage unit 602, the check matrix generation unit 613 determines (generates) the parity check matrix H of an LDPC code having the code length N and the code rate r determined by the code rate setting unit 611, and supplies and stores the parity check matrix H into the storage unit 602.

In step S204, the information bit read unit 614 reads, from the LDPC target data supplied to the LDPC encoder 115, information bits equivalent to the information length K (=N× r) corresponding to the code length N and the code rate r determined by the code rate setting unit 611, and reads the parity check matrix H determined by the check matrix generation unit 613 from the storage unit 602. The information bits and the parity check matrix H are supplied to the encoding parity calculation unit 615.

In step S205, the encoding parity calculation unit 615 sequentially calculates the parity bits of a code word c satisfying the equation (8).

$$Hc^T=0 \qquad (8)$$

In the equation (8), c represents the row vector as the code word (an LDPC code), and $c^T$ represents a transpose of the row vector c.

Where the information bit portion of the row vector c as an LDPC code (one code word) is represented by a row vector A, and the parity bit portion is represented by a row vector T, as described above, the row vector c can be expressed by the equation, c=[A|T], using the row vector A as the information bits and the row vector T as the parity bits.

The parity check matrix H and the row vector c= [A|T] as an LDPC code need to satisfy the equation, $Hc^T=0$, and the row vector T as the parity bits of the row vector c=[A|T], which satisfies the equation, $Hc^T=0$, can be sequentially determined by changing the element in each row to "0" in the column vector $Hc^T$ in the equation, $Hc^T=0$, starting from the element in the first row, if the parity matrix $H_T$ in the parity check matrix H=[$H_A|H_T$] has the staircase structure shown in FIG. 11.

After determining the parity bits T for the information bits A, the encoding parity calculation unit 615 outputs the code word c=[A|T] expressed with the information bits A and the parity bits T as a result of the LDPC encoding of the information bits A.

After that, in step S206, the control unit 616 determines whether to end the LDPC encoding. If it is determined in step S206 that the LDPC encoding is not to be ended, or if there is more LDPC target data to be subjected to the LDPC encoding, for example, the operation returns to step S201 (or S204), and the procedures of steps S201 (or S204) through S206 are repeated.

If it is determined in step S206 that the LDPC encoding is to be ended, or if there is no more LDPC target data to be subjected to the LDPC encoding, for example, the LDPC encoder 115 ends the operation.

As described above, check matrix initial value tables corresponding to respective code lengths N and respective code rates r are prepared, and the LDPC encoder 115 performs LDPC encoding for a predetermined code length N and a predetermined code rate r, using the parity check matrix H generated from the check matrix initial value table corresponding to the predetermined code length N and the predetermined code rate r.

[Examples of Check Matrix Initial Value Tables]

A check matrix initial value table is a table that shows, at intervals of 360 columns (corresponding to the unit column number P in the cyclic structure), the positions of the elements "1" of an information matrix $H_A$ (FIG. 10) corresponding to the information length K of a parity check matrix H corresponding to the code length N and the code rate r of an LDPC code (the LDPC code defined by the parity check matrix H), and is prepared beforehand for each of the parity check matrixes H having respective code lengths N and respective code rates r.

FIG. 33 is a diagram showing an example of a check matrix initial value table.

Specifically, FIG. 33 shows a check matrix initial value table for a parity check matrix H having a code length N of 16200 bits and a code rate (a code rate expressed according to DVB-T.2) r of 1/4 as specified in the DVB-T.2 standards.

Using the check matrix initial value table, the check matrix generation unit 613 (FIG. 31) determines the parity check matrix H in the following manner.

Figure 34:
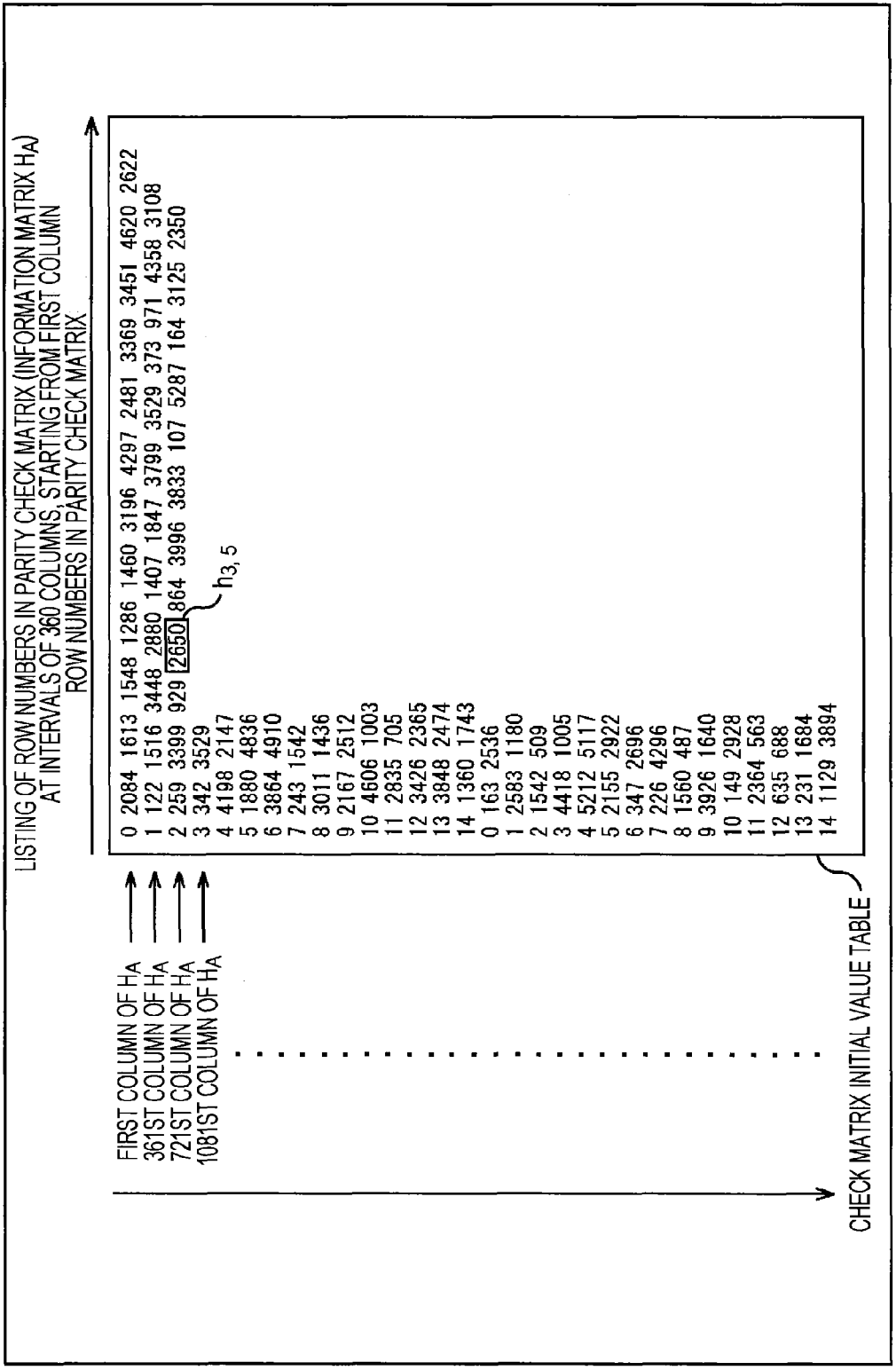
FIG. 34 is a diagram showing a method of determining a parity check matrix H from a check matrix initial value table.

FIG. 34 specifically shows a method of determining a parity check matrix H from a check matrix initial value table.

The check matrix initial value table shown in FIG. 34 is a check matrix initial value table for a parity check matrix H having a code length N of 16200 bits and a code rate r of 2/3 as specified in the DVB-T.2 standards.

As described above, a check matrix initial value table is a table that shows, at intervals of 360 columns (corresponding to the unit column number P of the cyclic structure), the positions of the elements "1" of an information matrix $H_A$ (FIG. 10) in accordance with the information length K corresponding to the code length N and the code rate r of an LDPC code. In the ith row of the table, the row numbers (with "0" being the row number of the first row in the parity check matrix H) of the elements "1" in the (1+360×(i−1))th column in the parity check matrix H are listed by the number of column weights assigned to the (1+360×(i−1))th column.

Since the parity matrix $H_T$ (FIG. 10) corresponding to the parity length M of the parity check matrix H is determined as shown in FIG. 21, the information matrix $H_A$ (FIG. 10) corresponding to the information length K of the parity check matrix H is determined according to the check matrix initial value table.

The number (k+1) of rows in a check matrix initial value table varies with the information length K.

The relationship expressed by the equation (9) is established between the information length K and the number (k+1) of rows in a check matrix initial value table.

$$K=(k+1)\times 360 \quad (9)$$

Here, 360 in the equation (9) is the unit column number P in the cyclic structure described with reference to FIG. 22.

In the check matrix initial value table shown in FIG. 34, 13 numerical values are listed in each of the first through third rows, and three numerical values are listed in each of the fourth through (k+1)th (the 30th in FIG. 34) rows.

Therefore, the column weight in the parity check matrix H determined from the check matrix initial value table shown in FIG. 34 is 13 in each of the first through (1+360×(3−1)−1)th columns, and is 3 in each of the (1+360×(3−1))th through Kth columns.

The first row in the check matrix initial value table shown in FIG. 34 shows 0, 2084, 1613, 1548, 1286, 1460, 3196, 4297, 2481, 3369, 3451, 4620, and 2622, which indicate that, in the first column in the parity check matrix H, the elements are "1" in the rows with the row numbers 0, 2084, 1613, 1548, 1286, 1460, 3196, 4297, 2481, 3369, 3451, 4620, and 2622 (and that the other elements are "0").

Also, the second row in the check matrix initial value table shown in FIG. 34 shows 1, 122, 1516, 3448, 2880, 1407, 1847, 3799, 3529, 373, 971, 4358, and 3108, which indicate that, in the 361st (=(1+360×(2−1))th) column in the parity check matrix H, the elements are "1" in the rows with the row numbers 1, 122, 1516, 3448, 2880, 1407, 1847, 3799, 3529, 373, 971, 4358, and 3108.

As described above, a check matrix initial value table shows the positions of the elements "1" of the information matrix $H_A$ of a parity check matrix H at intervals of 360 columns.

In each of the columns other than the (1+360×(i−1))th column in the parity check matrix H, or in each of the (2+360×(i−1))th through (360×i)th columns, the elements "1" in the (1+360×(i−1))th column which is determined by the check matrix initial value table are cyclically shifted in a downward direction (downward in the column direction) in accordance with the parity length M.

Specifically, the (2+360×(i−1))th column is formed by cyclically shifting the (1+360×(i−1))th column in the downward direction by M/360 (=q), and the next (3+360×(i−1))th column is formed by cyclically shifting the (1+360×(i−1))th column in the downward direction by 2×M/360 (=2×q) (or by cyclically shifting the (2+360×(i−1))th column in the downward direction by M/360 (=q)).

Where the numerical value in the ith row (the ith from the top) and the jth column (the jth from the left) in a check matrix initial value table is represented by $h_{i,j}$, and the row number of the jth element "1" in the wth column in the parity check matrix H is represented by $H_{w-j}$, the row number $H_{w-j}$ of the element "1" in the wth column, which is not the (1+360×(i−1))th column in the parity check matrix H, can be determined by the equation (10).

$$H_{w-j}=\text{mod}\{h_{i,j}+\text{mod}((w-1),P)\times q, M\} \quad (10)$$

Here, mod(x, y) indicates the remainder obtained when x is divided by y.

P represents the unit column number in the above described cyclic structure, and is 360 as described above according to the DVB-T.2 standards, for example. Further, q represents the value M/360 obtained by dividing the parity length M by the unit column number P (=360) in the cyclic structure.

According to the check matrix initial value table, the check matrix generation unit 613 (FIG. 31) identifies the row number of the element "1" in the (1+360×(i−1))th column in the parity check matrix H.

Further, the check matrix generation unit 613 (FIG. 31) also determines the row number $H_{w-j}$ of the element "1" in the wth column, which is not the (1+360×(I−1))th column, in the parity check matrix H, according to the equation (10), and generates the parity check matrix H in which the elements in the rows with the row numbers determined in the above described manner are "1".

[LDPC Codes Suitable for Portable Terminals]

Digital broadcasting for portable terminals that can be conducted with as fewer changes as possible made to the configurations of the transmission device and the reception device compliant with DVB-T.2, which is standards for digital broadcasting intended for fixed terminals, for example, would be beneficial in terms of costs.

Here, DVB-T.2 specifies LDPC codes having the two code lengths N of 64 kbits and 16 kbits.

If LDPC codes specified in DVB-T.2 are used in digital broadcasting intended for portable terminals, the use of LDPC codes having the shorter code length of 16 kbits between the two code lengths specified in DVB-T.2 is more suitable for digital broadcasting intended for portable terminals, because LDPC codes having the shorter code length can reduce the required memory and the delay at the time of decoding of the LDPC codes, compared with LDPC codes having the longer code length.

However, in portable terminals, there are cases where, to reduce the required load in operations such as decoding of LDPC codes, the number of repetitions of LDPC code decoding (the number C of decoding repetitions) is restricted to a smaller number than in cases of fixed terminals, for example. In digital broadcasting intended for portable terminals, 16-kbit LDPC codes specified in DVB-T.2 may not have sufficient high tolerance for errors.

In view of this, the transmission device 11 (FIG. 7) can perform digital broadcasting for portable terminals, by using novel 16-kbit LDPC codes that have higher error tolerance than the 16-kbit LDPC codes specified in DVB-T.2, as the LDPC codes suitable for digital broadcasting for portable terminals (hereinafter also referred to as LDPC codes for portable terminals).

As for the LDPC codes for portable terminals, to maintain as high compatibility with DVB-T.2 as possible, the parity matrix $H_T$ in each parity check matrix H has a staircase structure (FIG. 11), as in the LDPC codes specified in DVB-T.2.

Further, as for the LDPC codes for portable terminals, the information matrix $H_A$ in each parity check matrix H has a cyclic structure, and the unit column number P in the cyclic structure is 360, as in the LDPC codes specified in DVB-T.2.

FIGS. 35 through 43 are diagrams showing examples of check matrix initial value tables for LDPC codes that have the code length N of 16 kbits (for portable terminals) as described above.

Figure 35:
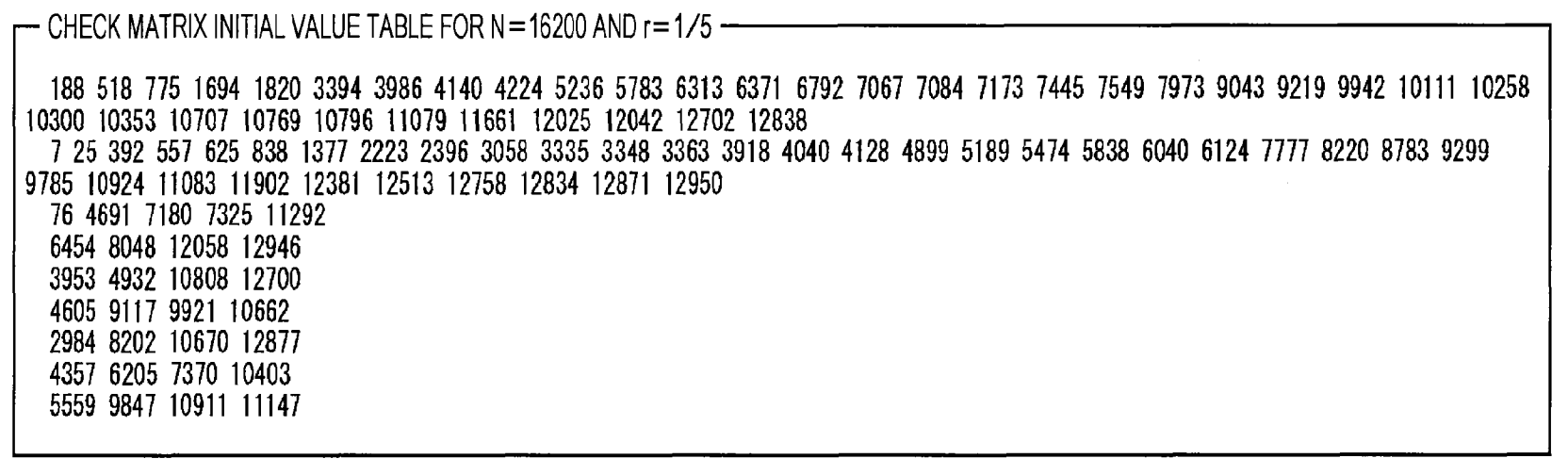

Specifically, FIG. 35 shows a check matrix initial value table for a parity check matrix H having a code length N of 16 kbits and a code rate r of 1/5.

FIG. 36 shows a check matrix initial value table for a parity check matrix H having a code length N of 16 kbits and a code rate r of 4/15.

FIG. 37 shows a check matrix initial value table for a parity check matrix H having a code length N of 16 kbits and a code rate r of 1/3.

Figure 38:
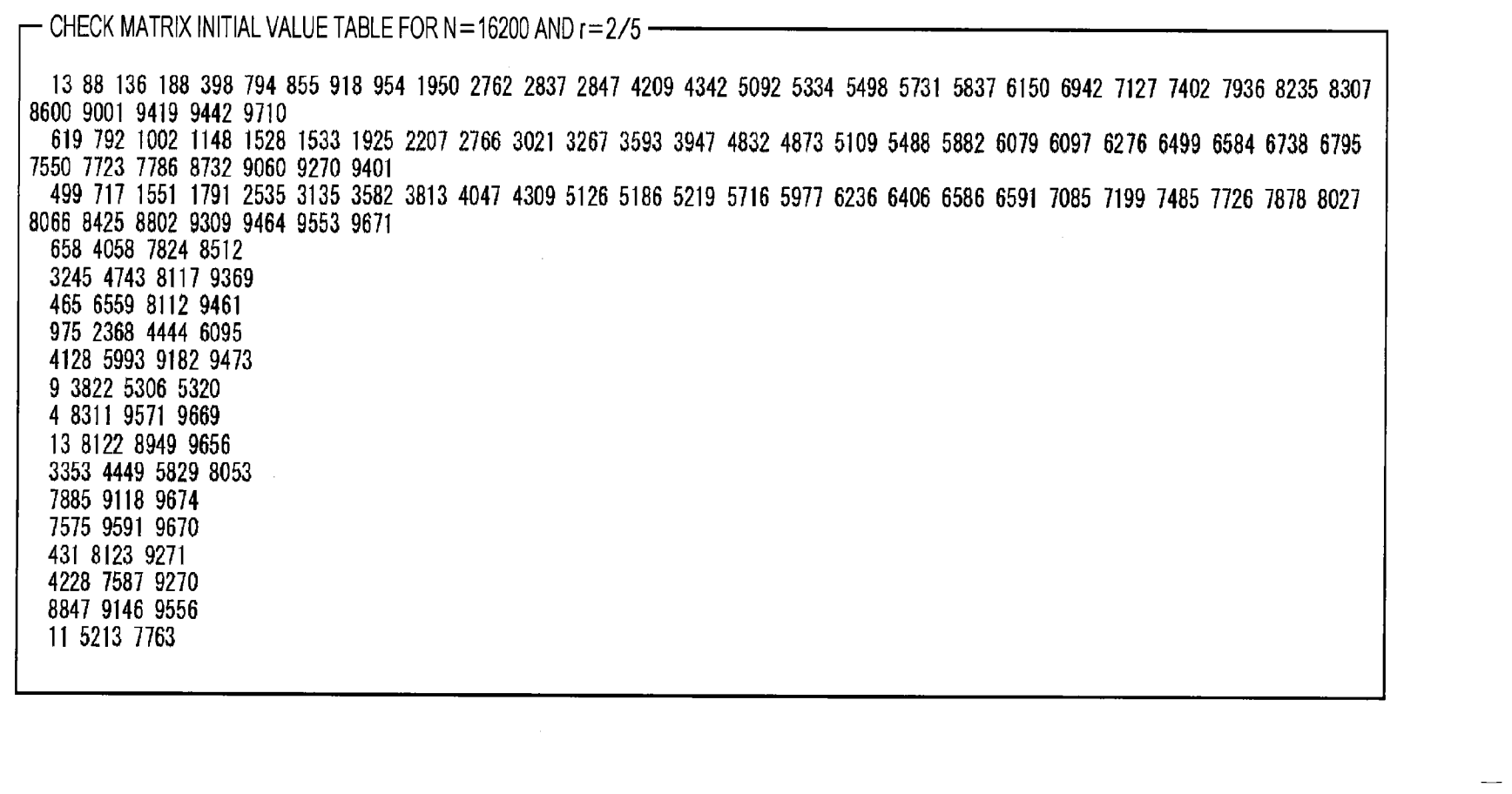

FIG. 38 shows a check matrix initial value table for a parity check matrix H having a code length N of 16 kbits and a code rate r of 2/5.

Figure 39:
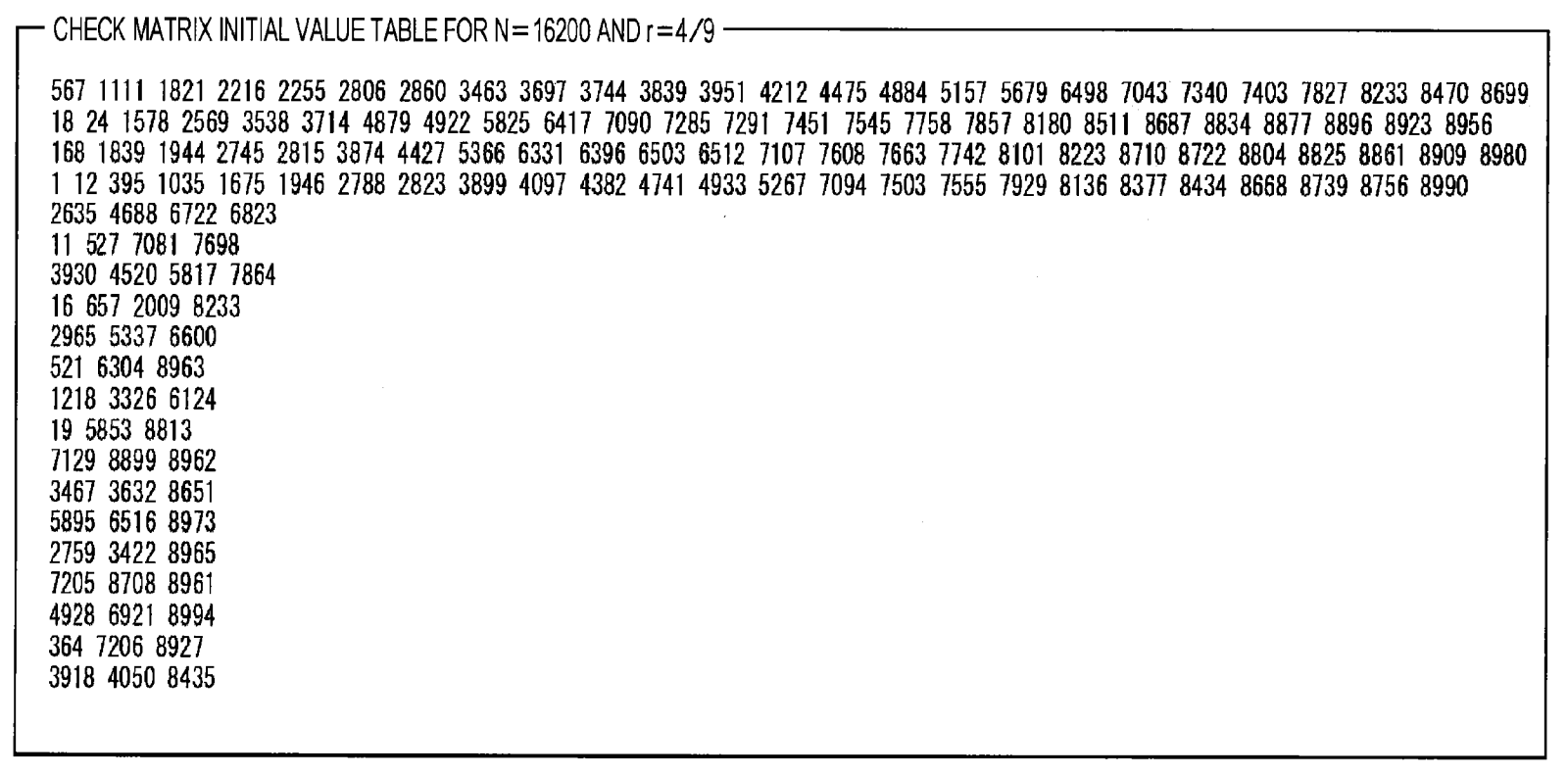

FIG. 39 shows a check matrix initial value table for a parity check matrix H having a code length N of 16 kbits and a code rate r of 4/9.

FIG. 40 shows a check matrix initial value table for a parity check matrix H having a code length N of 16 kbits and a code rate r of 7/15.

FIG. 41 shows a check matrix initial value table for a parity check matrix H having a code length N of 16 kbits and a code rate r of 8/15.

FIG. 42 shows a check matrix initial value table for a parity check matrix H having a code length N of 16 kbits and a code rate r of 3/5.

FIG. 43 shows a check matrix initial value table for a parity check matrix H having a code length N of 16 kbits and a code rate r of 2/3.

In digital broadcasting intended for portable terminals, the LDPC encoder 115 (FIGS. 8 and 31) performs encoding on LDPC codes having the code length N of 16 kbits and one of the nine code rates r of 1/5, 4/15, 1/3, 2/5, 4/9, 7/15, 8/15, 3/5, and 2/3, using a parity check matrix H determined from the corresponding one of the check matrix initial value tables shown in FIGS. 35 through 43.

The LDPC codes obtained by using parity check matrixes H determined from the check matrix initial value tables shown in FIGS. 35 through 43 are high-performance LDPC codes.

Here, high-performance LDPC codes are LDPC codes obtained from appropriate parity check matrixes H.

An appropriate parity check matrix H is a parity check matrix that satisfies predetermined conditions under which LDPC codes obtained from the parity check matrix H have a lower BER (Bit Error Rate) when transmitted at a low $E_s/N_0$ (the ratio of signal power to noise power per symbol) or $E_b/N_o$ (the ratio of signal power to noise power per bit).

An appropriate parity check matrix H can be determined by performing a simulation to measure the BER when LDPC codes obtained from various parity check matrixes satisfying predetermined conditions are transmitted at a low $E_s/N_o$, for example.

The predetermined conditions to be satisfied by an appropriate parity check matrix H should satisfy are that the result of an analysis carried out by a code performance analysis method called "density evolution" is good, and there are no element "1" loops called "cycle 4", for example.

It is known that LDPC code decoding performance is degraded if the density of elements "1" is high in the information matrix $H_A$ as in "cycle 4". Therefore, one of the predetermined conditions to be satisfied by an appropriate parity check matrix H should satisfy is that there should be no "cycle 4".

The predetermined conditions to be satisfied by an appropriate parity check matrix H can be appropriately determined so as to improve LDPC code decoding performance and facilitate (simplify) the LDPC code decoding operation.

Figure 44:
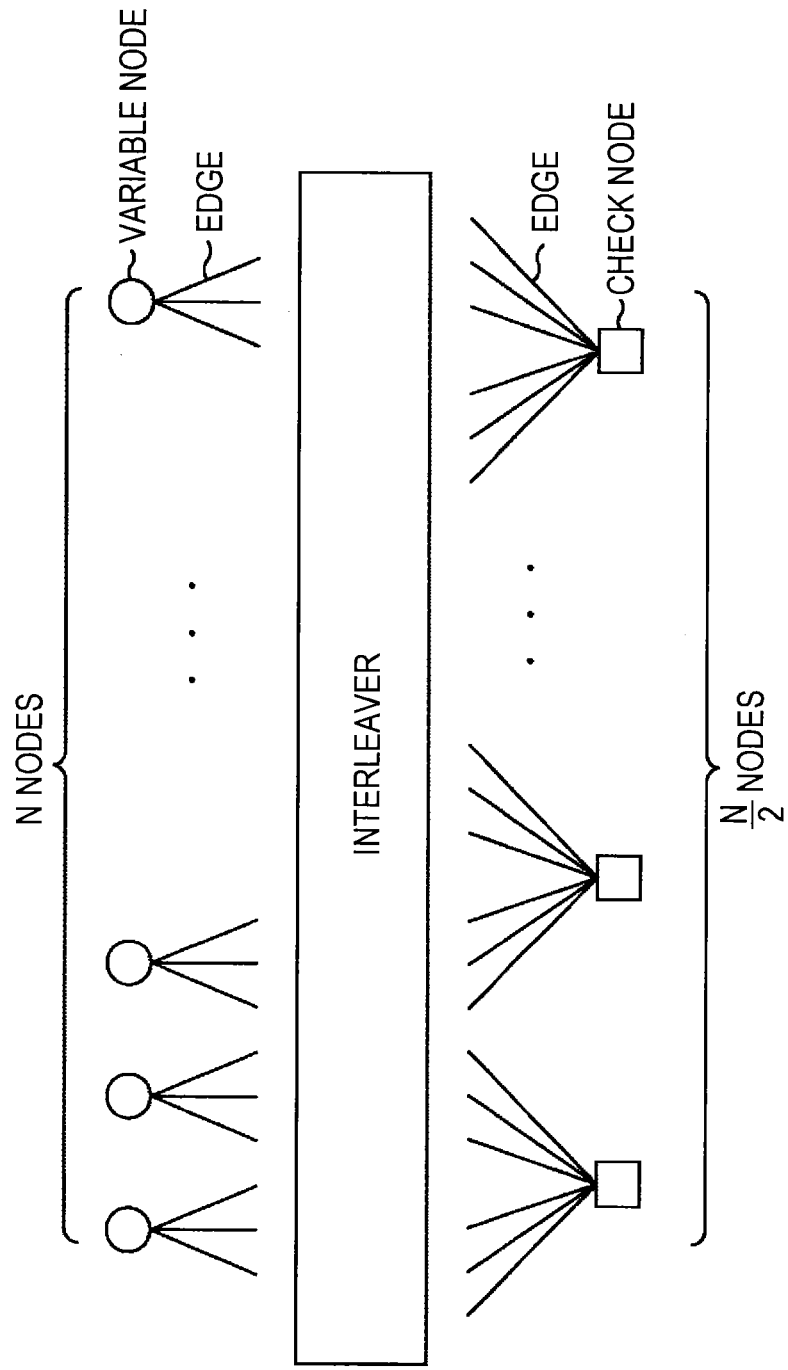
FIG. 44 is a diagram showing an example of a Tanner graph of an ensemble in a degree sequence in which the column weight is 3 and the row weight is 6.
Figure 45:
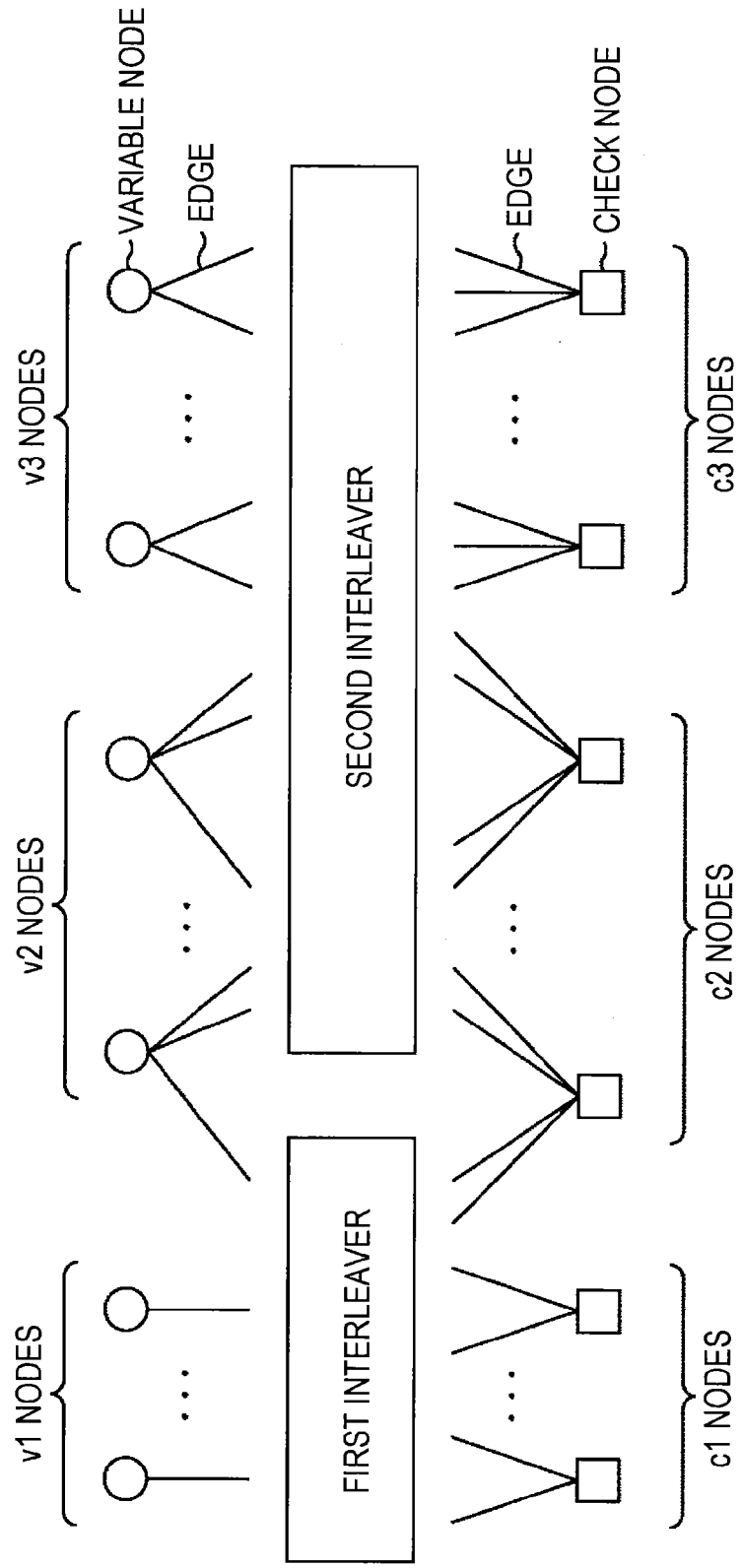
FIG. 45 is a diagram showing an example of a Tanner graph of an ensemble of a multi-edge type.

FIGS. 44 and 45 are diagrams for explaining the density evolution that can achieve an analysis result as a predetermined condition to be satisfied by an appropriate parity check matrix H.

The density evolution is a code analysis method for calculating an expected value of the error probability of an entire LDPC code (an ensemble) that has a code length N of ∞ and is characterized by the later described degree sequence.

Where the noise dispersion value is gradually increased from 0 in an AWGN channel, the expected value of the error probability of an ensemble is 0 at first, but is not 0 when the noise dispersion values becomes equal to or larger than a threshold value.

By the density evolution, the noise dispersion threshold values (hereinafter also referred to as performance threshold values) at which the expected values of error probabilities is not 0 are compared with one another, to determine the level of performance of each ensemble (the appropriateness of each parity check matrix).

The ensemble to which a certain LDPC code belongs is determined, and the density evolution is performed on the ensemble. In this manner, performance of the LDPC code can be roughly estimated.

Accordingly, if a high-performance ensemble is found, high-performance LDPC codes can be found among the LDPC codes belonging to the ensemble.

Here, the above mentioned degree sequence indicates the proportions of the variable nodes and the check nodes having weights of respective values to the code length N of LDPC codes.

For example, a regular (3, 6) LDPC code having a code rate of 1/2 belongs to an ensemble characterized by a degree sequence indicating that the weight of all the variable nodes (the column weight) is 3, and the weight of all the check nodes (the row weight) is 6.

FIG. 44 shows a Tanner graph of such an ensemble.

In the Tanner graph shown in FIG. 44, there are N variable nodes indicated by circles (○), N being the same as the code length N. There are N/2 check nodes indicated by squares (□), N/2 being the value obtained by multiplying the code length N by the code rate 1/2.

Three edges are connected to each variable node, three being equal to the column weight. Accordingly, a total of 3N edges are connected to the N variable nodes.

Meanwhile, six edges are connected to each check node, six being equal to the row weight. Accordingly, a total of 3N edges are connected to the N/2 check nodes.

Further, in the Tanner graph shown in FIG. 44, there is one interleaver.

The interleaver randomly rearranges the 3N edges connected to the N variable nodes, and each of the rearranged edges is connected to one of the 3N edges connected to the N/2 check nodes.

There are (3N)! (=(3N)×(3N−1)× . . . ×1) rearrangement patterns in which the interleaver rearranges the 3N edges connected to the N variable nodes. Accordingly, an ensemble characterized by a degree sequence in which all the variable nodes have a weight of 3, and all the check nodes have a weight of 6 is a set of (3N)! LDPC codes.

In a simulation to determine high-performance LDPC codes (appropriate parity check matrixes), an ensemble of a multi-edge type is used in the density evolution.

By the multi-edge type, the interleaver through which the edges connected to the variable nodes and the edges connected to the check nodes extend is divided into two or more interleavers (multi edges). With this, the ensemble is characterized in greater detail.

FIG. 45 shows an example of a Tanner graph of an ensemble of the multi-edge type.

In the Tanner graph shown in FIG. 45, there are the two interleavers of a first interleaver and a second interleaver.

Also, in the Tanner graph shown in FIG. 45, there are v1 variable nodes each having one edge connected to the first interleaver and no edges connected to the second interleaver, there are v2 variable nodes each having one edge connected to the first interleaver and two edges connected to the second interleaver, and there are v3 variable nodes each having no edges connected to the first interleaver and two edges connected to the second interleaver.

Further, in the Tanner graph shown in FIG. 45, there are c1 check nodes each having two edges connected to the first interleaver and no edges connected to the second interleaver, there are c2 check nodes each having two edges connected to the first interleaver and two edges connected to the second interleaver, and there are c3 check nodes each having no edges connected to the first interleaver and three edges connected to the second interleaver.

The density evolution and implementation thereof are disclosed in "On the Design of Low-Density Parity-Check Codes within 0.0045 dB of the Shannon Limit", S. Y. Chung, G. D. Formey, T. J. Richardson, R. Urbanke, IEEE Communications Leggers, VOL. 5, NO. 2, February 2001, for example.

In each of the simulations to determine (the check matrix initial value tables) of LDPC codes for portable terminals shown in FIGS. 35 through 43, an ensemble that has a predetermined value or a smaller value than the predetermined value as the performance threshold value $E_b/N_0$ at which the BER starts dropping (becoming smaller) through the density evolution of the multi-edge type, and LDPC codes that lower the BER by modulation methods used in digital broadcasting for portable terminals, such as 16QAM and 64QAM, are selected as high-performance LDPC codes among the LDPC codes belonging to the ensemble.

Since a portable terminal has lower tolerance for errors than a fixed terminal, a modulation method that involves a relatively smaller number of signal points, such as QPSK, 16QAM, 64QAM, or 256QAM is used in digital broadcasting for portable terminals, so as to increase the tolerance for errors.

The above described check matrix initial value tables shown in FIGS. 35 through 43 are check matrix initial value tables of LDPC codes having the code length N of 16 kbits that are determined through the above described simulations.

Figures 46, 47:
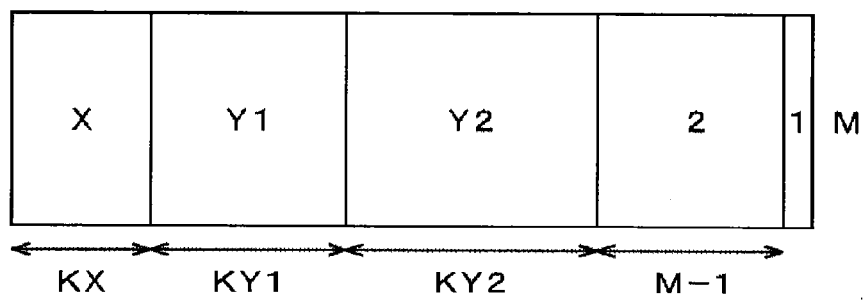
FIG. 46 is a diagram showing the minimum cycle lengths and the performance threshold values of the parity check matrixes of LDPC codes having the code length of 16200.
FIG. 47 is a diagram for explaining the parity check matrix of an LDPC code having the code length of 16200.

FIG. 46 is a diagram showing the minimum cycle lengths and the performance threshold values of the parity check matrixes H determined from the check matrix initial value tables of nine LDPC codes that have the code lengths N of 16 kbits and have the code rates of 1/5, 4/15, 1/3, 2/5, 4/9, 7/15, 8/15, 3/5, and 2/3, as shown in FIGS. 35 through 43.

Among the parity check matrixes H determined from the check matrix initial value tables shown in FIGS. 35 through 43, the minimum cycle lengths of the parity check matrixes H of the code rates r of 1/5, 4/15, and 3/5 are eight cycles, and the minimum cycle lengths of the parity check matrixes H of the code rates r of 1/3, 2/5, 4/9, 7/15, 8/15, and 2/3 are six cycles.

Therefore, there is no "cycle 4" among the parity check matrixes H determined from the check matrix initial value tables shown in FIGS. 35 through 43.

The lower the code rate r, the higher the redundancy of the LDPC code. Therefore, the performance threshold value tends to improve (become smaller) as the code rate r becomes lower.

FIG. 47 is a diagram for explaining the parity check matrixes H (determined from the check matrix initial value tables) of FIGS. 35 through 43 (hereinafter also referred to as the parity check matrixes H of LDPC codes for portable terminals).

In the KX columns starting from the first row of the parity check matrix H of an LDPC code for portable terminals, the column weight is X. In the KY1 columns following the KX columns, the column weight is Y1. In the KY2 columns following the KY1 columns, the column weight is Y2. In the (M−1) columns following the KY2 columns, the column weight is 2. In the last one column, the column weight is 1.

Here, KX+KY1++KY2+M−1+1 is equal to the code length N=16200 bits.

FIG. 48 is a diagram showing the column numbers KX, KY1, KY2, and M shown in FIG. 47, and the column weights X, Y1, and Y2 at the respective code rates r (=1/5, 4/15, 1/3, 2/5, 4/9, 7/15, 8/15, 3/5, and 2/3) of LDPC codes for portable terminals.

In the parity check matrixes H of LDPC codes for portable terminals having the code length N of 16 k, columns closer to the top (the left side) tend to have larger column weights, as in parity check matrixes specified in DVB-T.2 described in FIGS. 12 and 13. Therefore, the sign bit at the top in an LDPC code for portable terminal tends to be strong against errors (have tolerance for errors).

Figure 49:
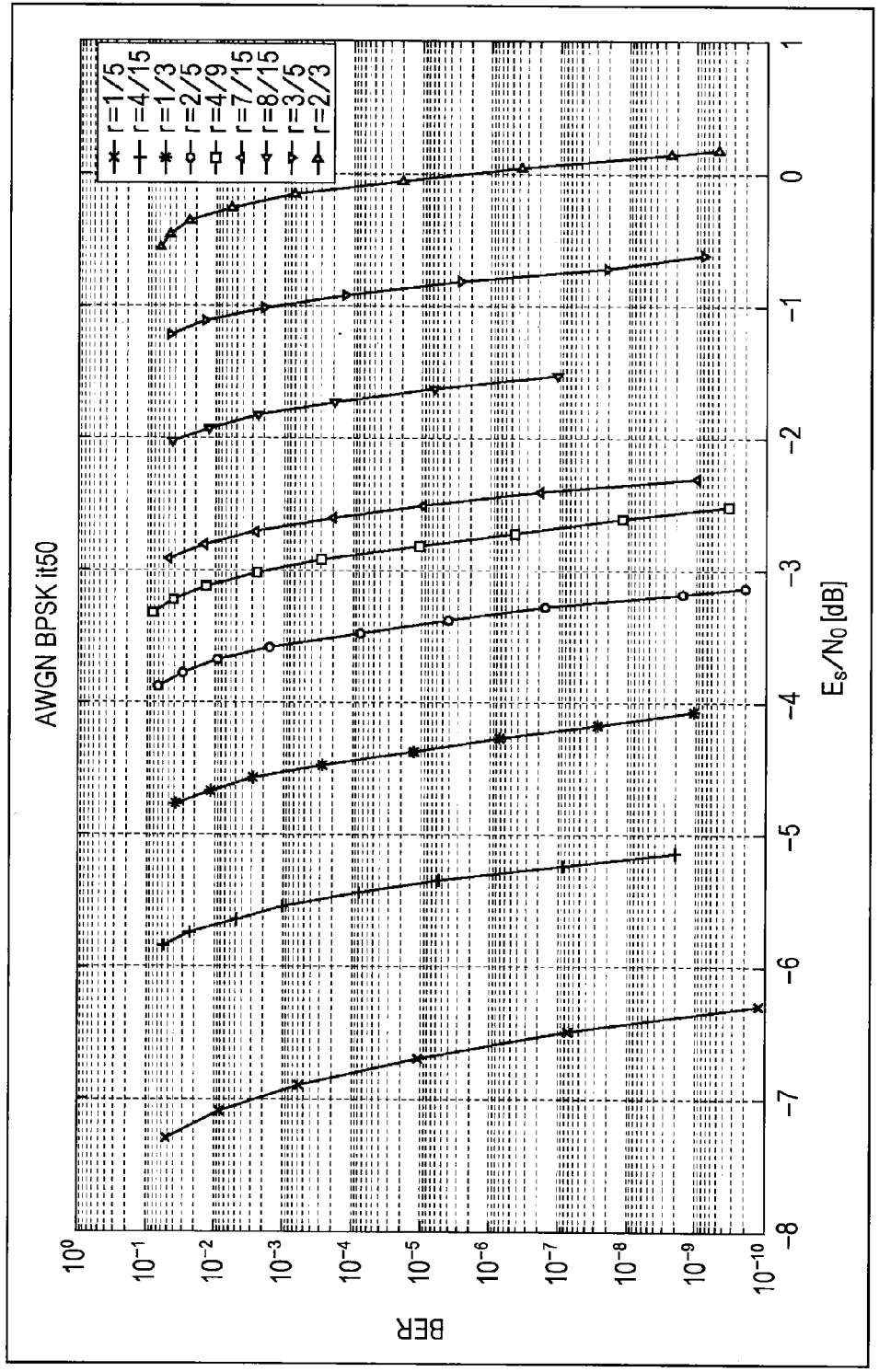
FIG. 49 is a diagram showing the results of simulations performed to measure the BERs of LDPC codes having the code length of 16200.

FIG. 49 is a diagram showing the results of simulations performed to measure the BERs of the LDPC codes for portable terminals shown in FIGS. 35 through 43.

In the simulations, AWGN channels were simulated. BPSK was used as the modulation method, and the number C of repetitions of decoding was 50.

In FIG. 49, the abscissa axis indicates $E_s/N_0$ (the ratio of signal power to noise power per symbol), and the ordinate axis indicates BER.

For the code rates of 1/5, 1/3, 2/5, 4/9, 3/5, and 2/3 among the code rates r of 1/5, 4/15, 1/3, 2/5, 4/9, 7/15, 8/15, 3/5, and 2/3 of LDPC codes for portable terminals, LDPC codes that have the respective code rates and a code length N of 16 k (hereinafter also referred to as standard 16 k codes) are specified in DVB-T.2.

As is confirmed by the simulations, the BER of an LDPC code for portable terminals having any of the code rates r of 1/5, 1/3, 2/5, 4/9, 3/5, and 2/3 is better than the BER of a standard 16 k code that is specified in DVB-T.2 and has the same code rate. Accordingly, with LDPC codes for portable terminals, tolerance for errors can be increased.

No standard 16 k codes have the same code rates as 4/15, 7/15, and 8/15 among the code rates r of 1/5, 4/15, 1/3, 2/5, 4/9, 7/15, 8/15, 3/5, and 2/3 of LDPC codes for portable terminals.

In other words, LDPC codes for portable terminals include LDPC codes having the code rates r of 4/15, 7/15, and 8/15, which do not exist among the standard 16 k codes.

Since LDPC codes for portable terminals include LDPC codes having the code rates r of 4/15, 7/15, and 8/15, which do not exist among the standard 16 k codes, as described above, the BERs with respect to the respective code rates r (=1/5, 4/15, 1/3, 2/5, 4/9, 7/15, 8/15, 3/5, and 2/3) of the LDPC codes for portable terminals are plotted at relatively regular intervals that are equal to or shorter than a predetermined interval of approximately 1 dB in the direction of $E_s/N_0$, as shown in FIG. 49.

As for the standard 16 k codes, on the other hand, the code rates r of 4/15, 7/15, and 8/15 do not exist among the standard 16 k codes. Therefore, relatively wide gaps of about 2 dB in the direction of $E_s/N_0$ appear between the BER with respect to the code rate r of 1/5 (expressed as 1/4 compliant with DVB-T.2) and the BER with respect to the code rate r of 1/3, and between the BER with respect to the code rate r of 4/9 (expressed as 1/2 compliant with DVB-T.2) and the BER with respect to the code rate r of 3/5. Due to such wide gaps, the BERs of the standard 16 k codes appear at irregular intervals.

From the standpoint of a broadcasting organization that broadcasts shows with the transmission device 11, LDPC codes for portable terminals that have BERs appearing at relatively regular intervals equal to or shorter than approximately 1 db have the advantage that a code rate to be used for broadcasting can be more easily selected in accordance with the status of the channel (the channel 13) than standard 16 k codes that have wide gaps of approximately 2 db among the BERs appearing at irregular intervals.

[Shuffling Operations for 16200-Bit LDPC Codes with Code Length N]

In a case where the above described LDPC codes for portable terminals or 16200-bit LDPC codes having a code length N are used in digital broadcasting directed to portable terminals, the tolerance for errors in the channel 13 (FIG. 7) is lower than that in a case where 64800-bit LDPC codes having a long code length N as specified in DVB-T.2 are used, for example.

In view of this, it is desirable to take measures to increase the tolerance for errors in digital broadcasting for portable terminals.

Examples of measures to increase the tolerance for errors include a shuffling operation to be performed by the demultiplexer 25 (FIG. 9).

Examples of shuffling methods for shuffling sign bits of an LDPC code specified in standards such as DVB-T.2 in a shuffling operation include the above described first through fourth shuffling methods, and shuffling methods specified in standards such as DVB-T.2, for example.

In a case where digital broadcasting directed to portable terminals is performed with the above described 16200-bit LDPC codes for portable terminals having a code length N, it is preferable to perform a shuffling operation suitable for the LDPC codes for portable terminals.

That is, in a shuffling operation to be performed on LDPC codes for portable terminals, it is preferable to perform a shuffling operation by a method to further increase the tolerance for errors.

In view of this, the demultiplexer 25 (FIG. 9) is designed to be capable of performing a shuffling operation in accordance with the assignment rule described above with reference to FIG. 27.

Shuffling operations in accordance with the assignment rule will be described later. Prior to the description of such shuffling operations, shuffling operations according to already suggested shuffling methods (hereinafter referred to as existing methods) are described.

Figure 50:
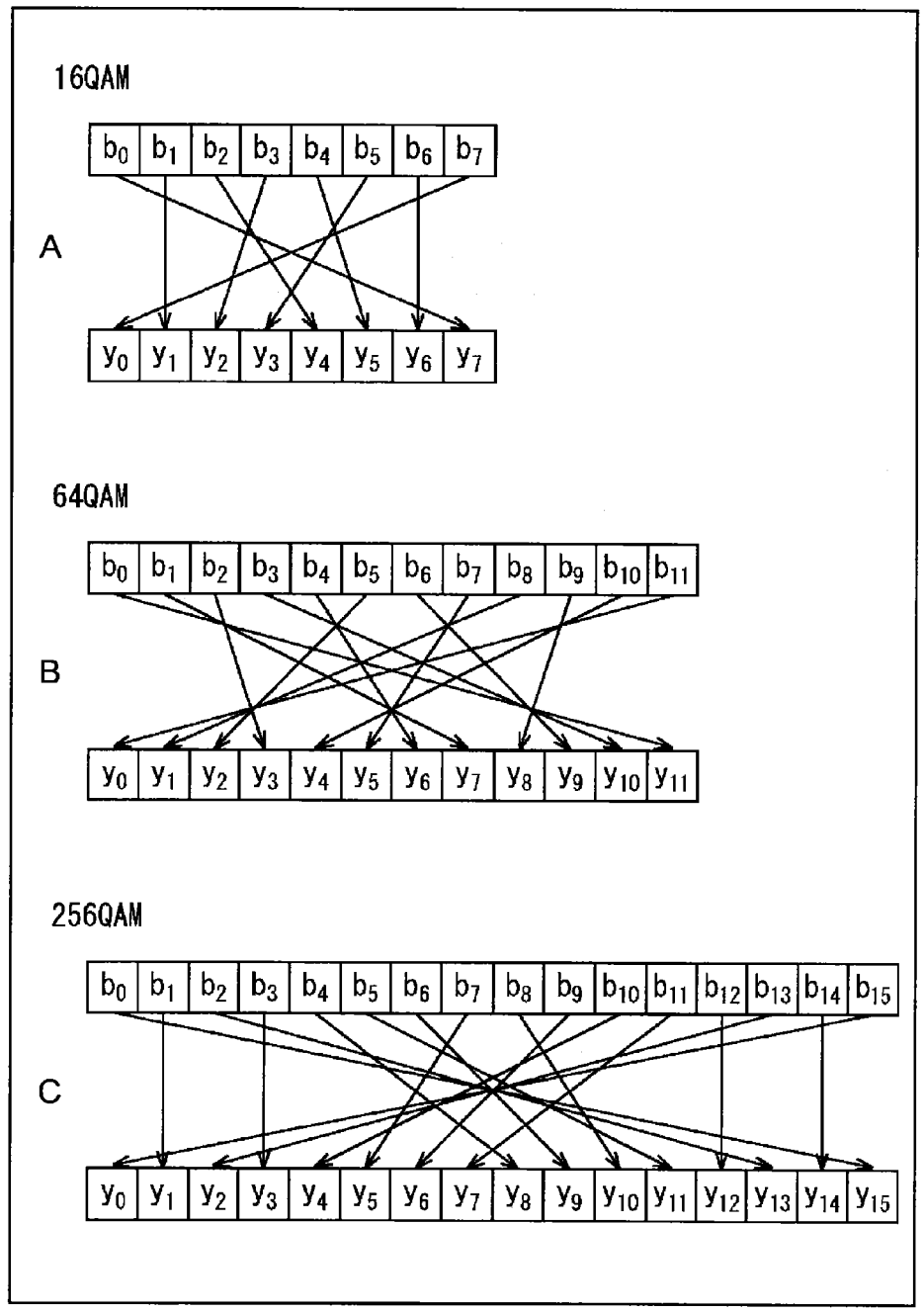
FIG. 50 is a diagram for explaining shuffling operations according to existing methods.
Figure 51:
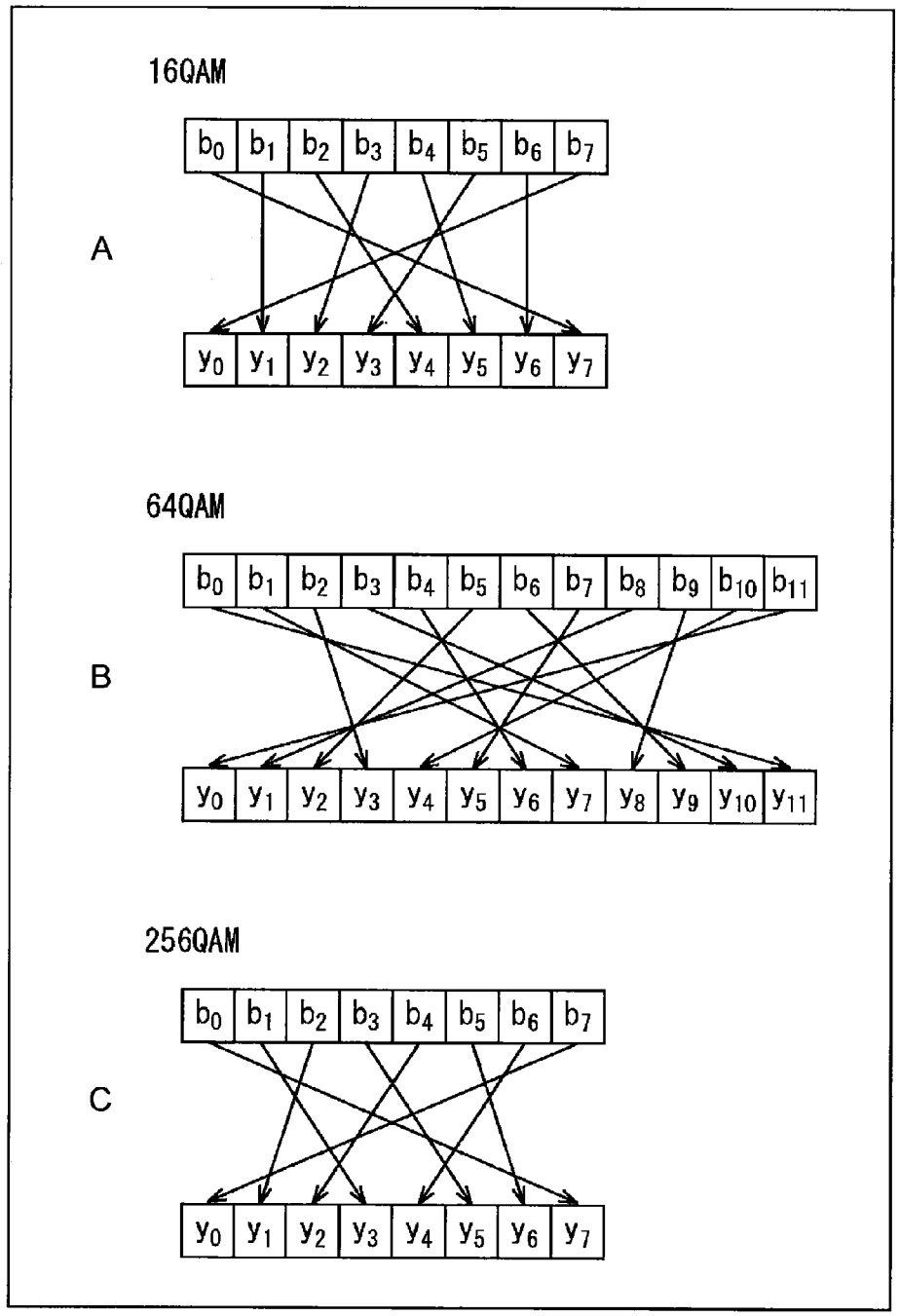
FIG. 51 is a diagram for explaining shuffling operations according to existing methods.

Referring now to FIGS. 50 and 51, shuffling operations to be performed by the demultiplexer 25 on LDPC codes specified in DVB-T.2 or the like (hereinafter also referred to as specified codes) according to existing methods are described.

FIG. 50 shows an example of a shuffling operation according to an existing method in a case where each LDPC code is specified in DVB-T.2, has a code length N of 64800 bits, and a code rate of 3/5.

Specifically, A of FIG. 50 shows an example of a shuffling operation according to an existing method in a case where each LDPC code is a specified code having the code length N of 64800 bits and the code rate of 3/5, the modulation method is 16QAM, and the multiple number b is 2.

Where the modulation method is 16QAM, four (=m) bits among the sign bits are mapped as one symbol on one of the 16 signal points defined by 16QAM.

Further, where the code length N is 64800 bits, and the multiple number b is 2, the memory 31 (FIGS. 18 and 19) of the demultiplexer 25 has eight columns storing 4×2 (=mb) bits in the row direction, and stores 64800/(4×2) bits in the column direction.

After the sign bits of the LDPC code have been written in the column direction of the memory 31, and writing of the sign bits (one code word) of the 64800 bits has been completed in the demultiplexer 25, the sign bits written in the memory 31 are read in the row direction 4×2 (=mb) bits at a time, and are supplied to the shuffling unit 32 (FIGS. 18 and 19).

The shuffling unit 32 shuffles 4×2 (=mb) sign bits $b_0$ through $b_7$, so that the 4×2 (=mb) sign bits $b_0$, $b_1$, $b_2$, $b_3$, $b_4$, $b_5$, $b_6$, and $b_7$, which are read from the memory 31, are assigned to the 4×2 (=mb) symbol bits $y_0$, $y_1$, $y_2$, $y_3$, $y_4$, $y_5$, $y_6$, and $y_7$ of two (=b) successive symbols, for example, as shown in A of FIG. 50.

Specifically, the shuffling unit 32 performs the shuffling, so that the sign bit $b_0$ is assigned to the symbol bit $y_7$,
the sign bit $b_1$ is assigned to the symbol bit $y_1$,
the sign bit $b_2$ is assigned to the symbol bit $y_4$,
the sign bit $b_3$ is assigned to the symbol bit $y_2$,
the sign bit $b_4$ is assigned to the symbol bit $y_s$,
the sign bit $b_5$ is assigned to the symbol bit $y_3$,
the sign bit $b_6$ is assigned to the symbol bit $y_6$, and
the sign bit $b_7$ is assigned to the symbol bit $y_0$.

B of FIG. 50 shows an example of a shuffling operation according to an existing method in a case where each LDPC code is a specified code having the code length N of 64800 bits and the code rate of 3/5, the modulation method is 64QAM, and the multiple number b is 2.

Where the modulation method is 64QAM, six (=m) bits among the sign bits are mapped as one symbol on one of the 64 signal points defined by 64QAM.

Further, where the code length N is 64800 bits, and the multiple number b is 2, the memory 31 (FIGS. 18 and 19) of the demultiplexer 25 has 12 columns storing 6×2 (=mb) bits in the row direction, and stores 64800/(6×2) bits in the column direction.

After the sign bits of the LDPC code have been written in the column direction of the memory 31, and writing of the sign bits (one code word) of the 64800 bits has been completed in the demultiplexer 25, the sign bits written in the memory 31 are read in the row direction 6×2 (=mb) bits at a time, and are supplied to the shuffling unit 32 (FIGS. 18 and 19).

The shuffling unit 32 shuffles 6×2 (=mb) sign bits $b_0$ through $b_{11}$, so that the 6×2 (=mb) sign bits $b_0$, $b_1$, $b_2$, $b_3$, $b_4$, $b_5$, $b_6$, $b_7$, $b_8$, $b_9$, $b_{10}$, and $b_{11}$, which are read from the memory 31, are assigned to the 6×2 (=mb) symbol bits $y_0$, $y_1$, $y_2$, $y_3$, $y_4$, $y_5$, $y_6$, $y_7$, $y_8$, $y_9$, $y_{10}$, and $y_{11}$ of two (=b) successive symbols, for example, as shown in B of FIG. 50.

Specifically, the shuffling unit 32 performs the shuffling, so that the sign bit $b_0$ is assigned to the symbol bit $y_{11}$,
the sign bit $b_1$ is assigned to the symbol bit $y_7$,
the sign bit $b_2$ is assigned to the symbol bit $y_3$,
the sign bit $b_3$ is assigned to the symbol bit $y_{10}$,
the sign bit $b_4$ is assigned to the symbol bit $y_6$,
the sign bit $b_5$ is assigned to the symbol bit $y_2$,
the sign bit $b_6$ is assigned to the symbol bit $y_9$,
the sign bit $b_7$ is assigned to the symbol bit $y_5$,
the sign bit $b_8$ is assigned to the symbol bit $y_1$,
the sign bit $b_9$ is assigned to the symbol bit $y_8$,
the sign bit $b_{10}$ is assigned to the symbol bit $y_4$, and
the sign bit $b_{11}$ is assigned to the symbol bit $y_0$.

C of FIG. 50 shows an example of a shuffling operation according to an existing method in a case where each LDPC code is a specified code having the code length N of 64800 bits and the code rate of 3/5, the modulation method is 256QAM, and the multiple number b is 2.

Where the modulation method is 256QAM, eight (=m) bits among the sign bits are mapped as one symbol on one of the 256 signal points defined by 256QAM.

Further, where the code length N is 64800 bits, and the multiple number b is 2, the memory 31 (FIGS. 18 and 19) of the demultiplexer 25 has 16 columns storing 8×2 (=mb) bits in the row direction, and stores 64800/(8×2) bits in the column direction.

After the sign bits of the LDPC code have been written in the column direction of the memory 31, and writing of the sign bits (one code word) of the 64800 bits has been completed in the demultiplexer 25, the sign bits written in the memory 31 are read in the row direction 8×2 (=mb) bits at a time, and are supplied to the shuffling unit 32 (FIGS. 18 and 19).

The shuffling unit 32 shuffles 8×2 (=mb) sign bits $b_0$ through $b_{15}$, so that the 8×2 (=mb) sign bits $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, and $b_{15}$, which are read from the memory 31, are assigned to the 8×2 (=mb) symbol bits $y_0$, $y_1$, $y_2$, $y_3$, $y_4$, $y_5$, $y_6$, $y_7$, $y_8$, $y_9$, $y_{10}$, $y_{11}$, $y_{12}$, $y_{13}$, $y_{14}$ and $y_{15}$ of two (=b) successive symbols, for example, as shown in C of FIG. 50.

Specifically, the shuffling unit 32 performs the shuffling, so that the sign bit $b_0$ is assigned to the symbol bit $y_{15}$,
the sign bit $b_1$ is assigned to the symbol bit $y_1$,
the sign bit $b_2$ is assigned to the symbol bit $y_{13}$,
the sign bit $b_3$ is assigned to the symbol bit $y_3$,
the sign bit $b_4$ is assigned to the symbol bit $y_8$,
the sign bit $b_5$ is assigned to the symbol bit $y_{11}$,
the sign bit $b_6$ is assigned to the symbol bit $y_9$,
the sign bit $b_7$ is assigned to the symbol bit $y_5$,
the sign bit $b_8$ is assigned to the symbol bit $y_{10}$,
the sign bit $b_9$ is assigned to the symbol bit $y_6$,
the sign bit $b_{10}$ is assigned to the symbol bit $y_4$,
the sign bit $b_{11}$ is assigned to the symbol bit $y_7$,
the sign bit $b_{12}$ is assigned to the symbol bit $y_{12}$,
the sign bit $b_{13}$ is assigned to the symbol bit $y_2$,
the sign bit $b_{14}$ is assigned to the symbol bit $y_{14}$, and
the sign bit $b_{15}$ is assigned to the symbol bit $y_0$.

FIG. 51 shows an example of a shuffling operation according to an existing method in a case where each LDPC code is a specified code that has a code length N of 16200 bits and a code rate of 3/5.

Specifically, A of FIG. 51 shows an example of a shuffling operation according to an existing method in a case where each LDPC code has the code length N of 16200 bits and the code rate of 3/5, the modulation method is 16QAM, and the multiple number b is 2.

Where the modulation method is 16QAM, four (=m) bits among the sign bits are mapped as one symbol on one of the 16 signal points defined by 16QAM.

Further, where the code length N is 16200 bits, and the multiple number b is 2, the memory 31 (FIGS. 18 and 19) of the demultiplexer 25 has eight columns storing 4×2 (=mb) bits in the row direction, and stores 16200/(4×2) bits in the column direction.

After the sign bits of the LDPC code have been written in the column direction of the memory 31, and writing of the sign bits (one code word) of the 16200 bits has been completed in the demultiplexer 25, the sign bits written in the memory 31 are read in the row direction 4×2 (=mb) bits at a time, and are supplied to the shuffling unit 32 (FIGS. 18 and 19).

The shuffling unit 32 shuffles 4×2 (=mb) sign bits $b_0$ through $b_7$, so that the 4×2 (=mb) sign bits $b_0$, $b_1$, $b_2$, $b_3$, $b_4$, $b_5$, $b_6$, and $b_7$, which are read from the memory 31, are assigned to the 4×2 (=mb) symbol bits $y_0$, $y_1$, $y_2$, $y_3$, $y_4$, $y_5$, $y_6$, and $y_7$ of two (=b) successive symbols, for example, as shown in A of FIG. 51.

Specifically, the shuffling unit 32 performs shuffling to assign the sign bits $b_0$ through $b_7$ to the symbol bits $y_0$ through $y_7$ in the same manner as in the above described case of A of FIG. 50.

B of FIG. 51 shows an example of a shuffling operation according to an existing method in a case where each LDPC code is a specified code having the code length N of 16200 bits and the code rate of 3/5, the modulation method is 64QAM, and the multiple number b is 2.

Where the modulation method is 64QAM, six (=m) bits among the sign bits are mapped as one symbol on one of the 64 signal points defined by 64QAM.

Further, where the code length N is 16200 bits, and the multiple number b is 2, the memory 31 (FIGS. 18 and 19) of the demultiplexer 25 has 12 columns storing 6×2 (=mb) bits in the row direction, and stores 16200/(6×2) bits in the column direction.

After the sign bits of the LDPC code have been written in the column direction of the memory 31, and writing of the sign bits (one code word) of the 16200 bits has been completed in the demultiplexer 25, the sign bits written in the memory 31 are read in the row direction 6×2 (=mb) bits at a time, and are supplied to the shuffling unit 32 (FIGS. 18 and 19).

The shuffling unit 32 shuffles 6×2 (=mb) sign bits $b_0$ through $b_{11}$, so that the 6×2 (=mb) sign bits $b_0$, $b_1$, $b_2$, $b_3$, $b_4$, $b_5$, $b_6$, $b_7$, $b_8$, $b_9$, $b_{10}$, and $b_{11}$, which are read from the memory 31, are assigned to the 6×2 (=mb) symbol bits $y_0$, $y_1$, $y_2$, $y_3$, $y_4$, $y_5$, $y_6$, $y_7$, $y_8$, $y_9$, $y_{10}$, and $y_{11}$ of two (=b) successive symbols, for example, as shown in B of FIG. 51.

Specifically, the shuffling unit 32 performs shuffling to assign the sign bits $b_0$ through $b_{11}$ to the symbol bits $y_0$ through $y_{11}$ in the same manner as in the above described case of B of FIG. 50.

C of FIG. 51 shows an example of a shuffling operation according to an existing method in a case where each LDPC code is a specified code having the code length N of 16200 bits and the code rate of 3/5, the modulation method is 256QAM, and the multiple number b is 1.

Where the modulation method is 256QAM, eight (=m) bits among the sign bits are mapped as one symbol on one of the 256 signal points defined by 256QAM.

Further, where the code length N is 16200 bits, and the multiple number b is 1, the memory 31 (FIGS. 18 and 19) of the demultiplexer 25 has eight columns storing 8×1 (=mb) bits in the row direction, and stores 16200/(8×1) bits in the column direction.

After the sign bits of the LDPC code have been written in the column direction of the memory 31, and writing of the sign bits (one code word) of the 16200 bits has been completed in the demultiplexer 25, the sign bits written in the memory 31 are read in the row direction 8×1 (=mb) bits at a time, and are supplied to the shuffling unit 32 (FIGS. 18 and 19).

The shuffling unit 32 shuffles 8×1 (=mb) sign bits $b_0$ through $b_7$, so that the 8×1 (=mb) sign bits $b_0$, $b_1$, $b_2$, $b_3$, $b_4$, $b_5$, $b_6$, and $b_7$, which are read from the memory 31, are assigned to the 8×1 (=mb) symbol bits $y_0$, $y_1$, $y_2$, $y_3$, $y_4$, $y_5$, $y_6$, and $y_7$ of one (=b) symbol, for example, as shown in C of FIG. 51.

Specifically, the shuffling unit 32 performs the shuffling, so that the sign bit $b_0$ is assigned to the symbol bit $y_7$,
the sign bit $b_1$ is assigned to the symbol bit $y_3$,
the sign bit $b_2$ is assigned to the symbol bit $y_1$,
the sign bit $b_3$ is assigned to the symbol bit $y_5$,
the sign bit $b_4$ is assigned to the symbol bit $y_2$,
the sign bit $b_5$ is assigned to the symbol bit $y_6$,
the sign bit $b_6$ is assigned to the symbol bit $y_4$, and
the sign bit $b_7$ is assigned to the symbol bit $y_0$.

Next, shuffling operations according to assignment rules (hereinafter also referred to as shuffling operations according to novel shuffling methods) are described.

Figure 52:
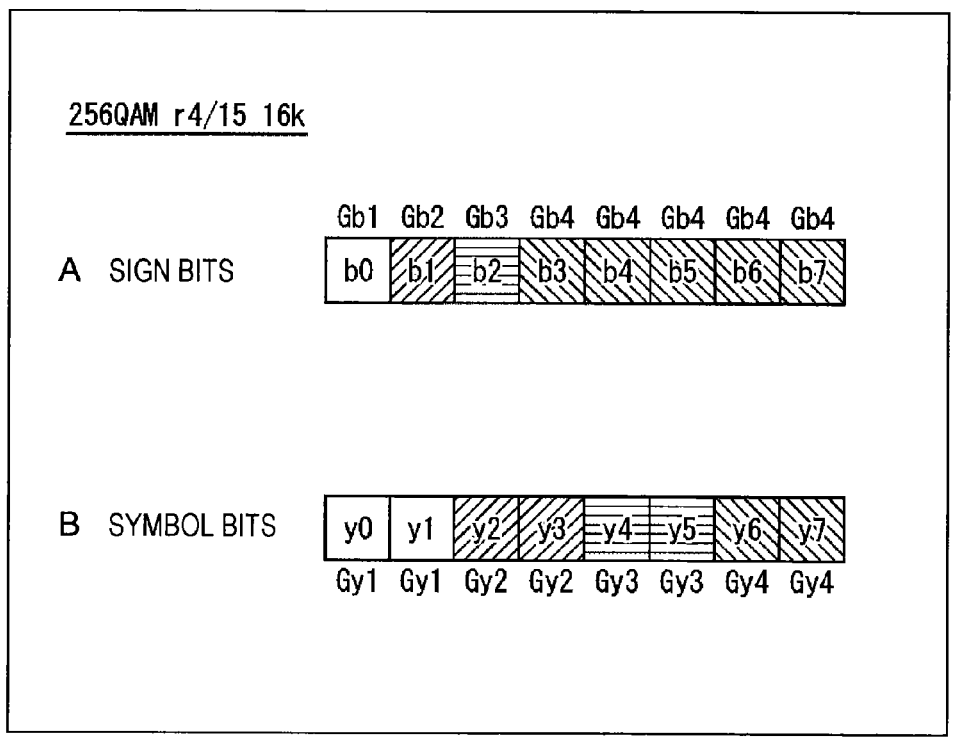
FIG. 52 is a diagram showing sign bit groups and symbol bit groups in cases where an LDPC code having a code length of 16200 and a code rate of 4/15 is modulated by 256QAM, and the multiple number b is 1.
Figure 53:
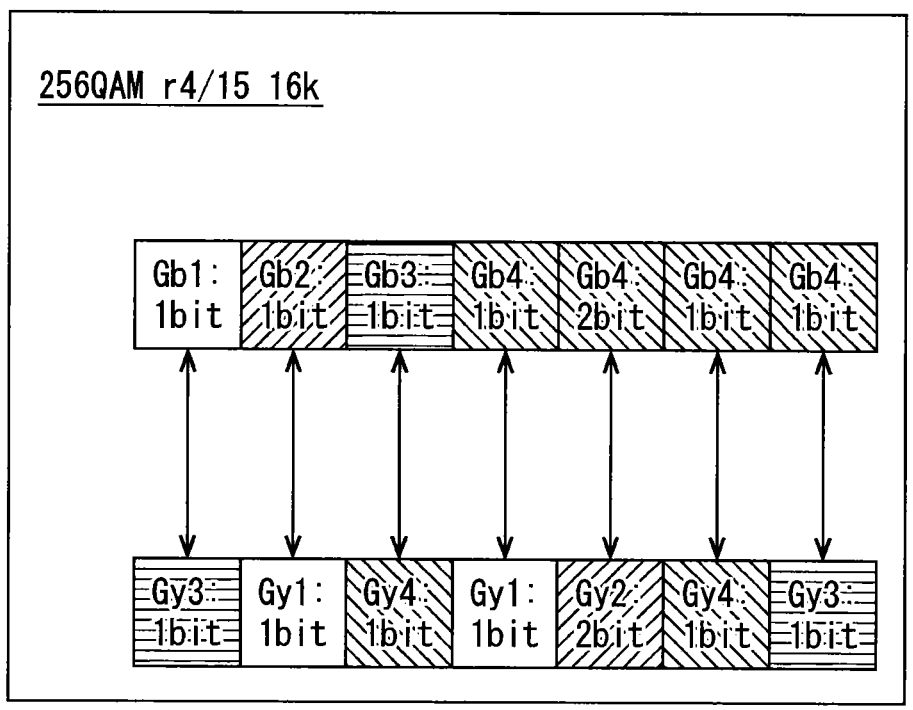
FIG. 53 is a diagram showing an assignment rule in cases where an LDPC code having a code length of 16200 and a code rate of 4/15 is modulated by 256QAM, and the multiple number b is 1.
Figure 54:
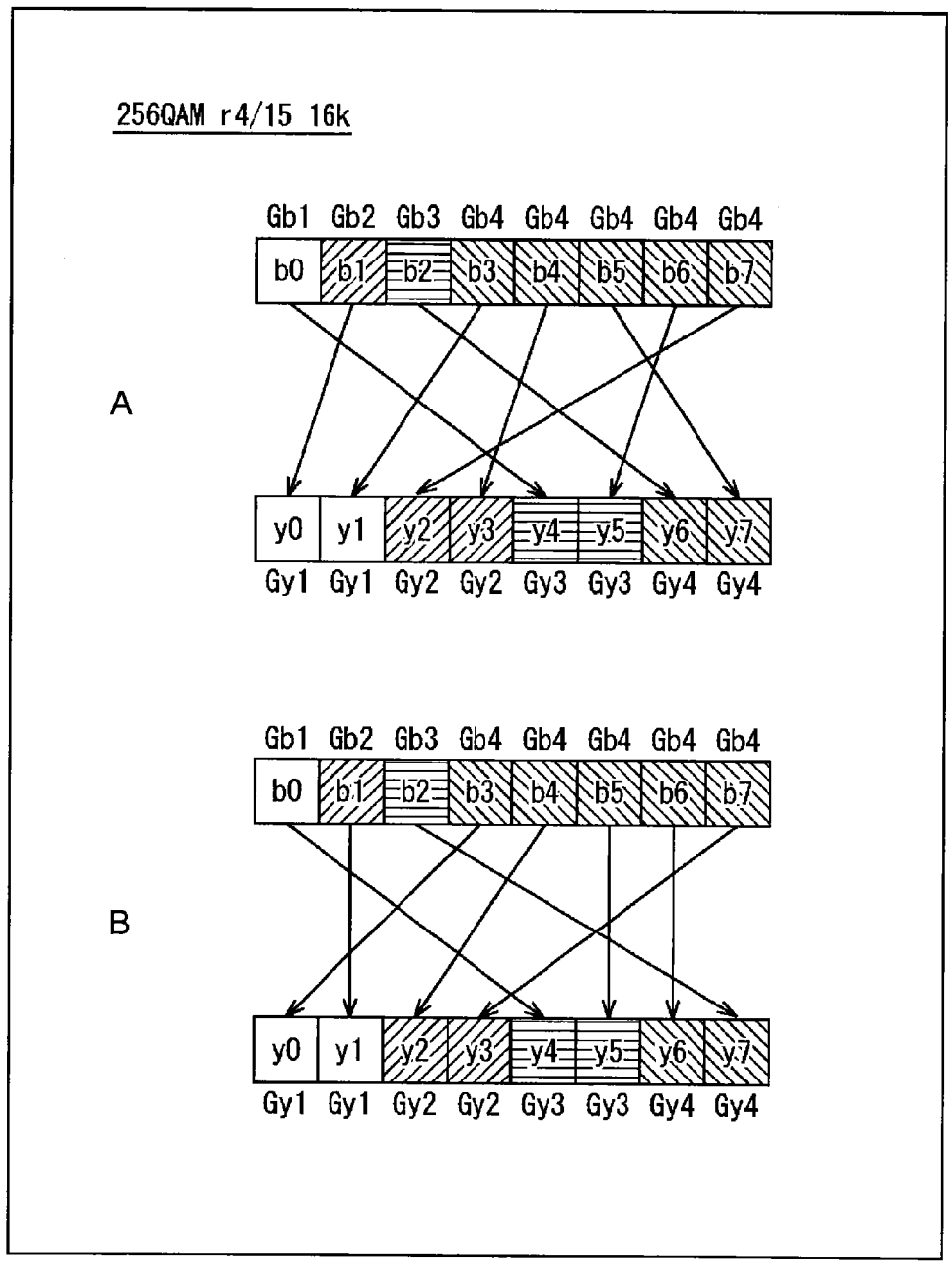
FIG. 54 is a diagram showing sign bit shuffling according to the assignment rule in cases where an LDPC code having a code length of 16200 and a code rate 4/15 is modulated by 256QAM, and the multiple number b is 1.

FIGS. 52 through 54 are diagrams for explaining the novel shuffling methods.

By a novel shuffling method, the shuffling unit 32 of the demultiplexer 25 shuffles mb sign bits in accordance with a predetermined assignment rule.

An assignment rule is a rule for assigning the sign bits of an LDPC code to the symbol bits. According to an assignment rule, group sets are specified as combinations of sign bit groups formed with sign bits and symbol bit groups formed with the symbol bits to which the sign bits of the sign bit groups are to be assigned, and the numbers of the respective sign bits of the sign bit groups and the respective symbol bits of the symbol bit groups of the group sets (hereinafter also referred to as the group bit numbers) are specified.

Here, the sign bits have different error probabilities as described above, and the symbol bits also have different error probabilities. The sign bit groups are groups into which sign bits are divided in accordance with error probabilities, and the symbol bit groups are groups into which symbol bits are divided in accordance with error probabilities.

FIG. 52 shows sign bit groups and symbol bit groups in a case where each LDPC code is an LDPC code for portable terminals that has a code length N of 16200 bits and a code rate of 4/15, the modulation method is 256QAM (accordingly, m=8), and the multiple number b is 1.

In this case, the 8×1 (=mb) sign bits that are read from the memory 31 can be divided into four sign bit groups Gb1, Gb2, Gb3, and Gb4 in accordance with differences in error probability, as shown in A of FIG. 52.

Here, a sign bit group Gb#i with a smaller suffix #i is a group to which one or more sign bits having a better (lower) error probability belong.

In the following, the (#i+1)th bit counted from the uppermost bit among the mb sign bits that are read from the memory 31 in the row direction is also expressed as a bit b#i, and the (#i+1)th bit counted from the uppermost bit among the mb symbol bits of b successive symbols is also expressed as a bit y#i.

In A of FIG. 52, a sign bit b0 belongs to the sign bit group Gb1, a sign bit b1 belongs to the sign bit group Gb2, a sign bit b2 belongs to the sign bit group Gb3, and sign bits b3, b4, b5, b6, and b7 belong to the sign bit group Gb4.

In a case where the modulation method is 256QAM, and the multiple number b is 1, the 8×1 (=mb) symbol bits can be divided into four symbol bit groups Gy1, Gy2, Gy3, and Gy4 in accordance with differences in error probability, as shown in B of FIG. 52.

Like the sign bit groups, a symbol bit group Gy#i with a smaller suffix #i is a group to which one or more symbol bits having a better error probability belong.

In B of FIG. 52, symbol bits y0 and y1 belong to the symbol bit group Gy1, symbol bits y2 and y3 belong to the symbol bit group Gy2, symbol bits y4 and y5 belong to the symbol bit group Gy3, and symbol bits y6 and y7 belong to the symbol bit group Gy4.

FIG. 53 shows the assignment rule in a case where each LDPC code is an LDPC code for portable terminals that has the code length N of 16200 bits and the code rate of 4/15, the modulation method is 256QAM, and the multiple number b is 1.

In the assignment rule shown in FIG. 53, the combination of the sign bit group Gb1 and the symbol bit group Gy3 is specified as one group set. The group bit number of the group set is specified as 1.

Hereinafter, a group set and its group bit number will be collectively referred to as group set information. For example, the group set of the sign bit group Gb1 and the symbol bit group Gy3, and the group bit number 1 of the group set are written as the group set information (Gb1, Gy3, 1).

The assignment rule shown in FIG. 53 specifies group set information (Gb2, Gy1, 1), (Gb3, Gy4, 1), (Gb4, Gy1, 1), (Gb4, Gy2, 2), (Gb4, Gy4, 1), and (Gb4, Gy3, 1), as well as the group set information (Gb1, Gy3, 1).

For example, the group set information (Gb1, Gy3, 1) means that one sign bit belonging to the sign bit group Gb1 is assigned to one symbol bit belonging to the symbol bit group Gy2.

Accordingly, the assignment rule shown in FIG. 53 specifies that one sign bit of the sign bit group Gb1 having the best error probability is assigned to one symbol bit of the symbol bit group Gy3 having the third best error probability in accordance with the group set information (Gb1, Gy3, 1), one sign bit of the sign bit group Gb2 having the second best error probability is assigned to one symbol bit of the symbol bit group Gy1 having the best error probability in accordance with the group set information (Gb2, Gy1, 1), one sign bit of the sign bit group Gb3 having the third best error probability is assigned to one symbol bit of the symbol bit group Gy4 having the fourth best error probability in accordance with the group set information (Gb3, Gy4, 1), one sign bit of the sign bit group Gb4 having the fourth best error probability is assigned to one symbol bit of the symbol bit group Gy1 having the best error probability in accordance with the group set information (Gb4, Gy1, 1), two sign bits of the sign bit group Gb4 having the fourth best error probability are assigned to two symbol bits of the symbol bit group Gy2 having the second best error probability in accordance with the group set information (Gb4, Gy2, 2), one sign bit of the sign bit group Gb4 having the fourth best error probability is assigned to one symbol bit of the symbol bit group Gy4 having the fourth best error probability in accordance with the group set information (Gb4, Gy4, 1), and one sign bit of the sign bit group Gb4 having the fourth best error probability is assigned to one symbol bit of the symbol bit group Gy3 having the third best error probability in accordance with the group set information (Gb4, Gy3, 1).

As described above, the sign bit groups are groups into which sign bits are divided in accordance with error probabilities, and the symbol bit groups are groups into which symbol bits are divided in accordance with error probabilities. In view of this, it can be said that the assignment rule specifies combinations of the error probabilities of sign bits and the error probabilities of the symbol bits to which the sign bits are to be assigned.

The assignment rule that specifies combinations of the error probabilities of sign bits and the error probabilities of the symbol bits to which the sign bits are to be assigned is determined so as to increase the tolerance for errors (tolerance for noise) through a simulation performed to measure BERs, for example.

If the assignment destinations of the sign bits of a sign bit group are changed among the bits of a single symbol bit group, the tolerance for errors is not affected (or hardly affected).

Therefore, to increase the tolerance for errors, the group set information that minimizes BER (Bit Error Rate), or combinations (group sets) of sign bit groups formed with sign bits and symbol bit groups formed with the symbol bits to which the sign bits of the sign bit groups are to be assigned, and the numbers (the group bit numbers) of the sign bits and the symbol bits of the sign bit groups and the symbol bit groups of the group set are specified as the assignment rule, and the sign bits should be shuffled to assign the sign bits to the symbol bits in accordance with the assignment rule.

However, a specific assignment method specifying which sign bits are to be assigned to which symbol bits in accordance with the assignment rule needs to be determined beforehand between the transmission device 11 and the reception device 12 (FIG. 7).

FIG. 54 shows an example of sign bit shuffling in accordance with the assignment rule shown in FIG. 53.

Specifically, A of FIG. 54 shows a first example of sign bit shuffling in accordance with the assignment rule shown in FIG. 53 in a case where each LDPC code is an LDPC code for portable terminals that has the code length N of 16200 bits and the code rate of 4/15, the modulation method is 256QAM, and the multiple number b is 1.

In a case where each LDPC code is an LDPC code for portable terminals having the code length N of 16200 bits and the code rate of 4/15, the modulation method is 256QAM, and the multiple number b is 1, sign bits written in the memory 31 that stores (16200/(8×1))×(8×1) bits in the column direction and the row direction are read in the row direction 8×1 (=mb) bits at a time, and are supplied to the shuffling unit 32 (FIGS. 18 and 19) in the demultiplexer 25.

According to the assignment rule shown in FIG. 53, the shuffling unit 32 shuffles 8×1 (=mb) sign bits b0 through b7, so that the 8×1 (=mb) sign bits b0 through b7, which are read from the memory 31, are assigned to the 8×1 (=mb) symbol bits y0 through y7 of one (=b) symbol, for example, as shown in A of FIG. 54.

Specifically, the shuffling unit 32 performs the shuffling, so that the sign bit b0 is assigned to the symbol bit y4,
the sign bit b1 is assigned to the symbol bit y0,
the sign bit b2 is assigned to the symbol bit y6,
the sign bit b3 is assigned to the symbol bit y1,
the sign bit b4 is assigned to the symbol bit y3,
the sign bit b5 is assigned to the symbol bit y7,
the sign bit b6 is assigned to the symbol bit y5, and
the sign bit b7 is assigned to the symbol bit y2.

B of FIG. 54 shows a second example of sign bit shuffling in accordance with the assignment rule shown in FIG. 53 in a case where each LDPC code is an LDPC code for portable terminals that has the code length N of 16200 bits and the code rate of 4/15, the modulation method is 256QAM, and the multiple number b is 1.

In B of FIG. 54, the shuffling unit 32 shuffles the 8×1 (=mb) sign bits b0 through b7 read from the memory 31 in accordance with the assignment rule shown in FIG. 53, so that the sign bit b0 is assigned to the symbol bit y4,
the sign bit b1 is assigned to the symbol bit y1,
the sign bit b2 is assigned to the symbol bit y7,
the sign bit b3 is assigned to the symbol bit y0,
the sign bit b4 is assigned to the symbol bit y2,
the sign bit b5 is assigned to the symbol bit y5,
the sign bit b6 is assigned to the symbol bit y6, and
the sign bit b7 is assigned to the symbol bit y3.

Here, the assignment of each sign bit b#i to a symbol bit y#i shown in A of FIG. 54 and B of FIG. 54 is performed by following the assignment rule shown in FIG. 53 (or complying with the assignment rule).

Figure 55:
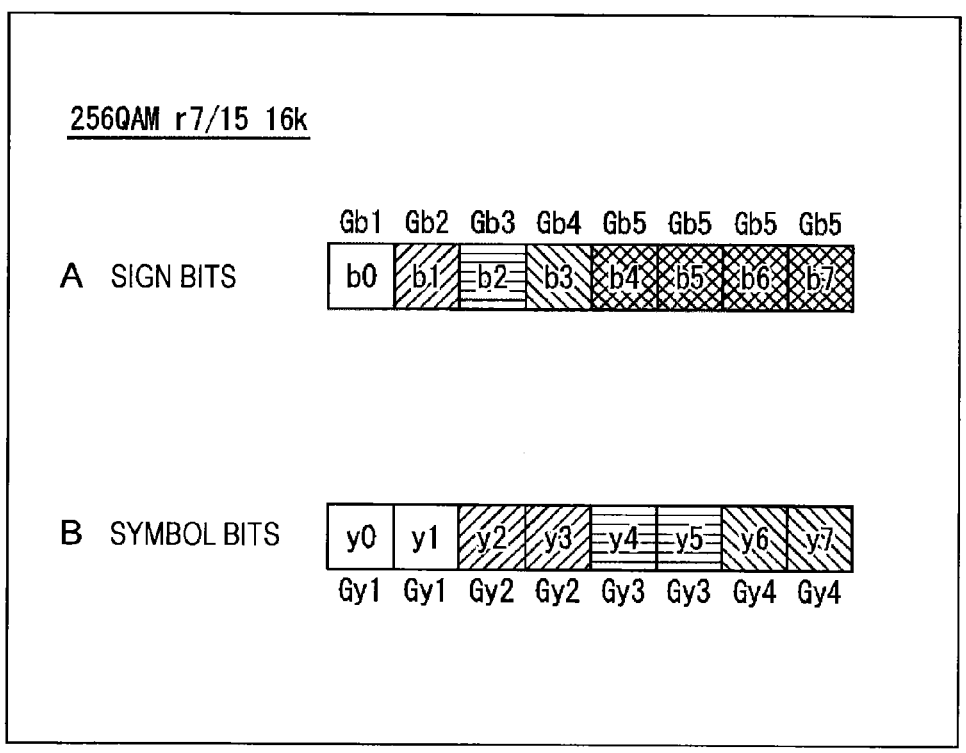
FIG. 55 is a diagram showing sign bit groups and symbol bit groups in cases where an LDPC code having a code length of 16200 and a code rate of 7/15 is modulated by 256QAM, and the multiple number b is 1.

FIG. 55 shows sign bit groups and symbol bit groups in a case where each LDPC code is an LDPC code for portable terminals that has a code length N of 16200 bits and a code rate of 7/15, the modulation method is 256QAM, and the multiple number b is 1.

In this case, the 8×1 (=mb) sign bits that are read from the memory 31 can be divided into five sign bit groups Gb1, Gb2, Gb3, Gb4, and Gb5 in accordance with differences in error probability, as shown in A of FIG. 55.

In A of FIG. 55, a sign bit b0 belongs to the sign bit group Gb1, a sign bit b1 belongs to the sign bit group Gb2, a sign bit b2 belongs to the sign bit group Gb3, a sign bit b3 belongs to the sign bit group Gb4, and sign bits b4 through b7 belong to the sign bit group Gb5.

In a case where the modulation method is 256QAM, and the multiple number b is 1, the 8×1 (=mb) symbol bits can be divided into four symbol bit groups Gy1, Gy2, Gy3, and Gy4 in accordance with differences in error probability, as shown in B of FIG. 55.

In B of FIG. 55, symbol bits y0 and y1 belong to the symbol bit group Gy1, symbol bits y2 and y3 belong to the symbol bit group Gy2, symbol bits y4 and y5 belong to the symbol bit group Gy3, and symbol bits y6 and y7 belong to the symbol bit group Gy4.

Figure 56:
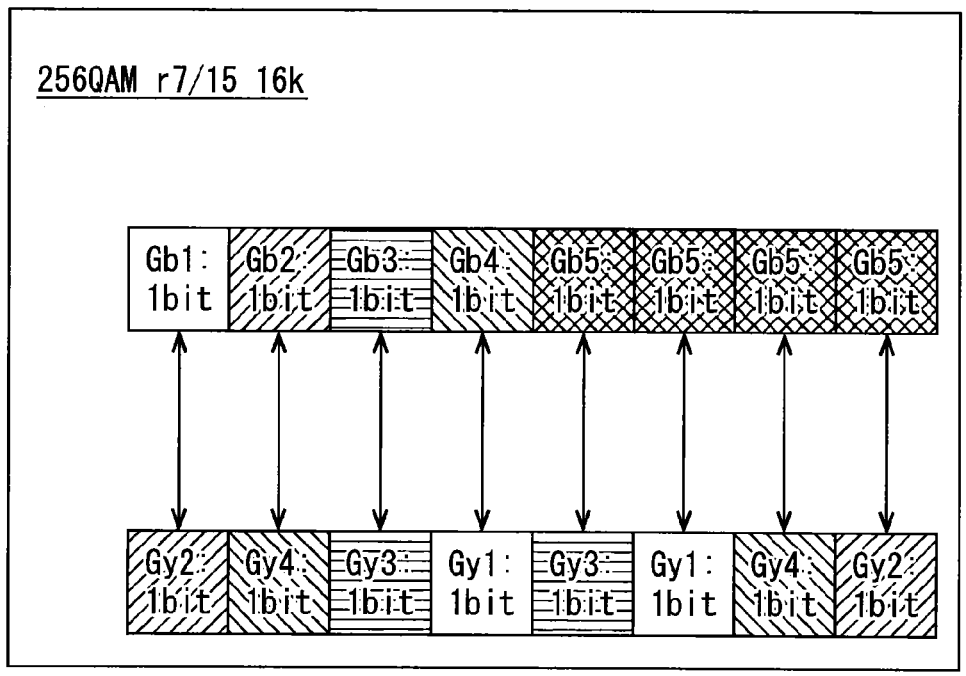
FIG. 56 is a diagram showing an assignment rule in cases where an LDPC code having a code length of 16200 and a code rate of 7/15 is modulated by 256QAM, and the multiple number b is 1.

FIG. 56 shows the assignment rule in a case where each LDPC code is an LDPC code for portable terminals that has the code length N of 16200 bits and the code rate of 7/15, the modulation method is 256QAM, and the multiple number b is 1.

The assignment rule shown in FIG. 56 specifies group set information (Gb1, Gy2, 1), (Gb2, Gy4, 1), (Gb3, Gy3, 1), (Gb4, Gy1, 1), (Gb5, Gy3, 1), (Gb5, Gy1, 1), (Gb5, Gy4, 1), and (Gb5, Gy2, 1).

Specifically, the assignment rule shown in FIG. 56 specifies that one sign bit of the sign bit group Gb1 having the best error probability is assigned to one symbol bit of the symbol bit group Gy2 having the second best error probability in accordance with the group set information (Gb1, Gy2, 1), one sign bit of the sign bit group Gb2 having the second best error probability is assigned to one symbol bit of the symbol bit group Gy4 having the fourth best error probability in accordance with the group set information (Gb2, Gy4, 1), one sign bit of the sign bit group Gb3 having the third best error probability is assigned to one symbol bit of the symbol bit group Gy3 having the third best error probability in accordance with the group set information (Gb3, Gy3, 1), one sign bit of the sign bit group Gb4 having the fourth best error probability is assigned to one symbol bit of the symbol bit group Gy1 having the best error probability in accordance with the group set information (Gb4, Gy1, 1), one sign bit of the sign bit group Gb5 having the fifth best error probability is assigned to one symbol bit of the symbol bit group Gy3 having the third best error probability in accordance with the group set information (Gb5, Gy3, 1), one sign bit of the sign bit group Gb5 having the fifth best error probability is assigned to one symbol bit of the symbol bit group Gy1 having the best error probability in accordance with the group set information (Gb5, Gy1, 1), one sign bit of the sign bit group Gb5 having the fifth best error probability is assigned to one symbol bit of the symbol bit group Gy4 having the fourth best error probability in accordance with the group set information (Gb5, Gy4, 1), and one sign bit of the sign bit group Gb5 having the fifth best error probability is assigned to one symbol bit of the symbol bit group Gy2 having the second best error probability in accordance with the group set information (Gb5, Gy2, 1).

Figure 57:
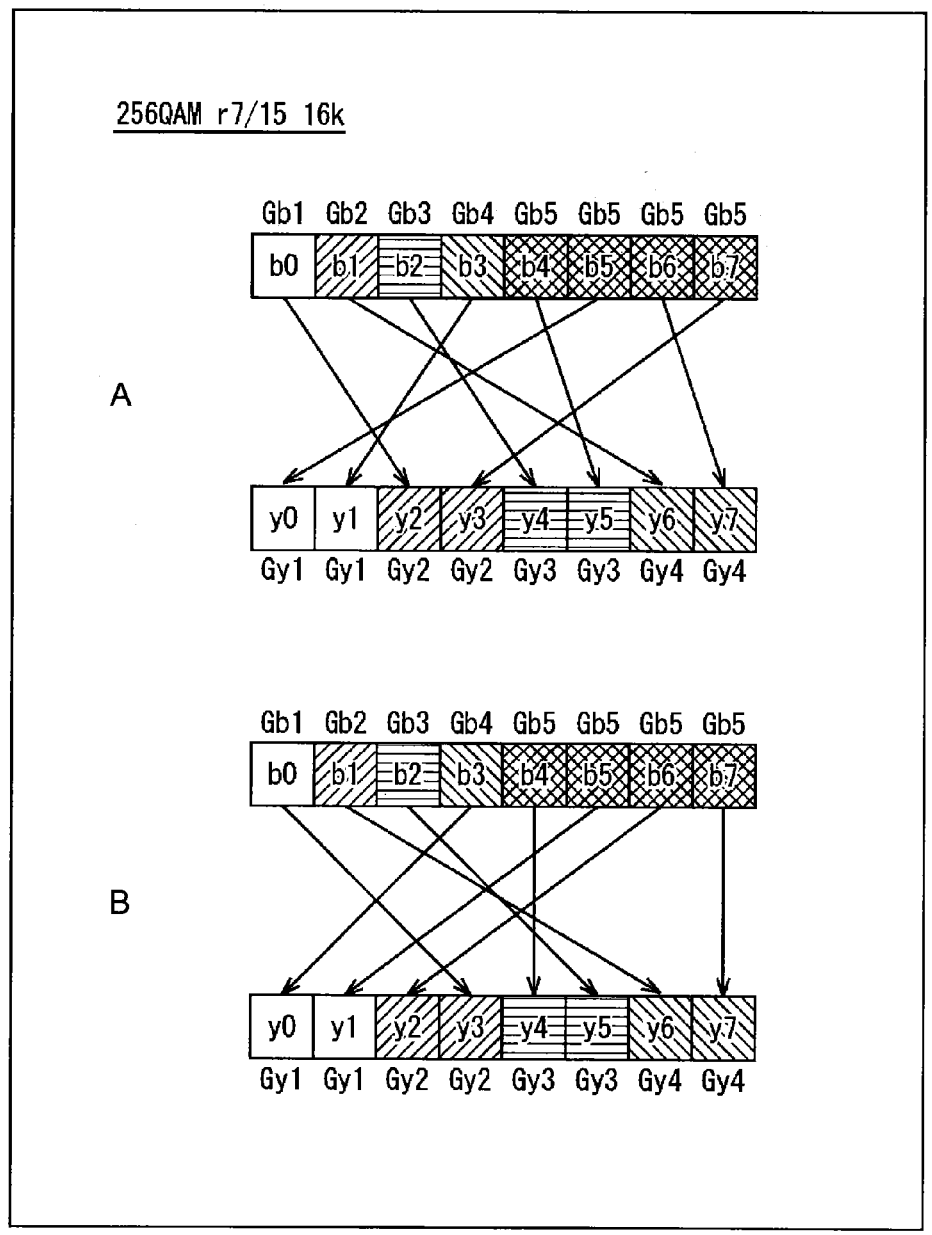
FIG. 57 is a diagram showing sign bit shuffling according to the assignment rule in cases where an LDPC code having a code length of 16200 and a code rate 7/15 is modulated by 256QAM, and the multiple number b is 1.

FIG. 57 shows an example of sign bit shuffling in accordance with the assignment rule shown in FIG. 56.

Specifically, A of FIG. 57 shows a first example of sign bit shuffling in accordance with the assignment rule shown in FIG. 56 in a case where each LDPC code is an LDPC code for portable terminals that has the code length N of 16200 bits and the code rate of 7/15, the modulation method is 256QAM, and the multiple number b is 1.

In a case where each LDPC code is an LDPC code for portable terminals having the code length N of 16200 bits and the code rate of 7/15, the modulation method is 256QAM, and the multiple number b is 1, sign bits written in the memory 31 that stores (16200/(8×1))×(8×1) bits in the column direction and the row direction are read in the row direction 8×1 (=mb) bits at a time, and are supplied to the shuffling unit 32 (FIGS. 18 and 19) in the demultiplexer 25.

According to the assignment rule shown in FIG. 56, the shuffling unit 32 shuffles 8×1 (=mb) sign bits b0 through b7, so that the 8×1 (=mb) sign bits b0 through b7, which are read from the memory 31, are assigned to the 8×1 (=mb) symbol bits y0 through y7 of one (=b) symbol, for example, as shown in A of FIG. 57.

Specifically, the shuffling unit 32 performs the shuffling, so that the sign bit b0 is assigned to the symbol bit y2,
the sign bit b1 is assigned to the symbol bit y6,
the sign bit b2 is assigned to the symbol bit y4,
the sign bit b3 is assigned to the symbol bit y1,
the sign bit b4 is assigned to the symbol bit y5,
the sign bit b5 is assigned to the symbol bit y0,
the sign bit b6 is assigned to the symbol bit y7, and
the sign bit b7 is assigned to the symbol bit y3.

B of FIG. 57 shows a second example of sign bit shuffling in accordance with the assignment rule shown in FIG. 56 in a case where each LDPC code is an LDPC code for portable terminals that has the code length N of 16200 bits and the code rate of 7/15, the modulation method is 256QAM, and the multiple number b is 1.

In B of FIG. 57, the shuffling unit 32 shuffles the 8×1 (=mb) sign bits b0 through b7 read from the memory 31 in accordance with the assignment rule shown in FIG. 56, so that the sign bit b0 is assigned to the symbol bit y3,
the sign bit b1 is assigned to the symbol bit y6,
the sign bit b2 is assigned to the symbol bit y5,
the sign bit b3 is assigned to the symbol bit y0,
the sign bit b4 is assigned to the symbol bit y4,
the sign bit b5 is assigned to the symbol bit y1,
the sign bit b6 is assigned to the symbol bit y2, and
the sign bit b7 is assigned to the symbol bit y7.

Figure 58:
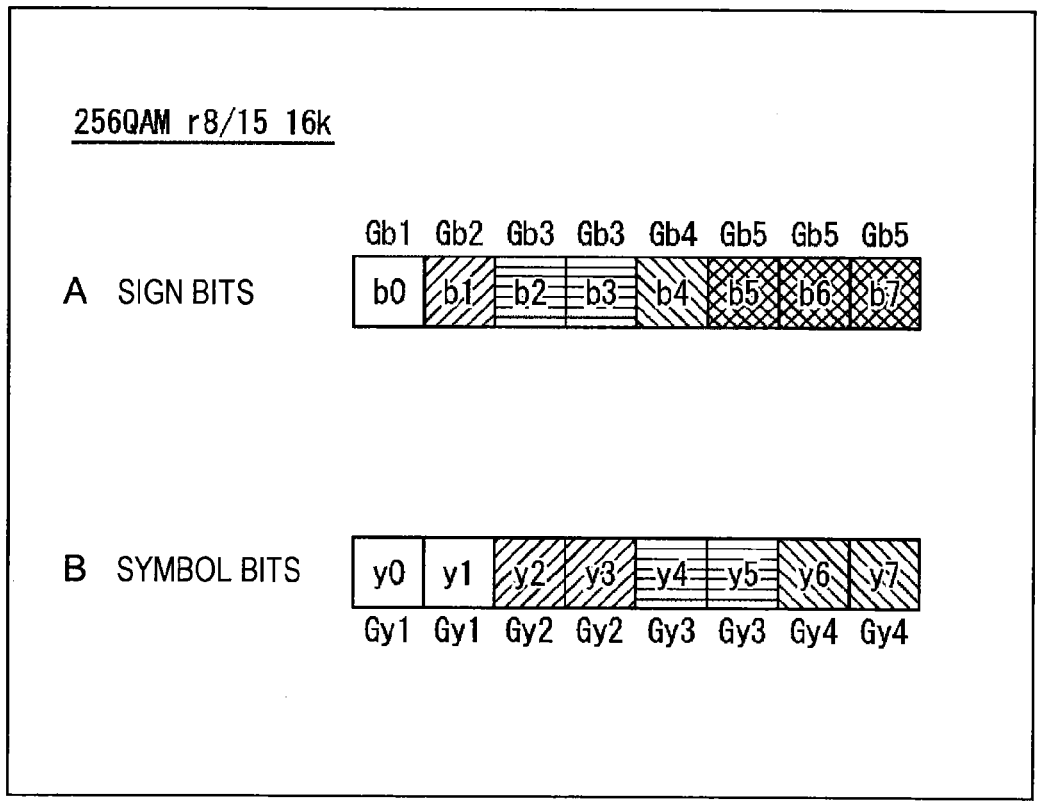
FIG. 58 is a diagram showing sign bit groups and symbol bit groups in cases where an LDPC code having a code length of 16200 and a code rate of 8/15 is modulated by 256QAM, and the multiple number b is 1.

FIG. 58 shows sign bit groups and symbol bit groups in a case where each LDPC code is an LDPC code for portable terminals that has a code length N of 16200 bits and a code rate of 8/15, the modulation method is 256QAM, and the multiple number b is 1.

In this case, the 8×1 (=mb) sign bits that are read from the memory 31 can be divided into five sign bit groups Gb1, Gb2, Gb3, Gb4, and Gb5 in accordance with differences in error probability, as shown in A of FIG. 58.

In A of FIG. 58, a sign bit b0 belongs to the sign bit group Gb1, a sign bit b1 belongs to the sign bit group Gb2, sign bits b2 and b3 belong to the sign bit group Gb3, a sign bit b4 belongs to the sign bit group Gb4, and sign bits b5 through b7 belong to the sign bit group Gb5.

In a case where the modulation method is 256QAM, and the multiple number b is 1, the 8×1 (=mb) symbol bits can be divided into four symbol bit groups Gy1, Gy2, Gy3, and Gy4 in accordance with differences in error probability, as shown in B of FIG. 58.

In B of FIG. 58, symbol bits y0 and y1 belong to the symbol bit group Gy1, symbol bits y2 and y3 belong to the symbol bit group Gy2, symbol bits y4 and y5 belong to the symbol bit group Gy3, and symbol bits y6 and y7 belong to the symbol bit group Gy4.

Figure 59:
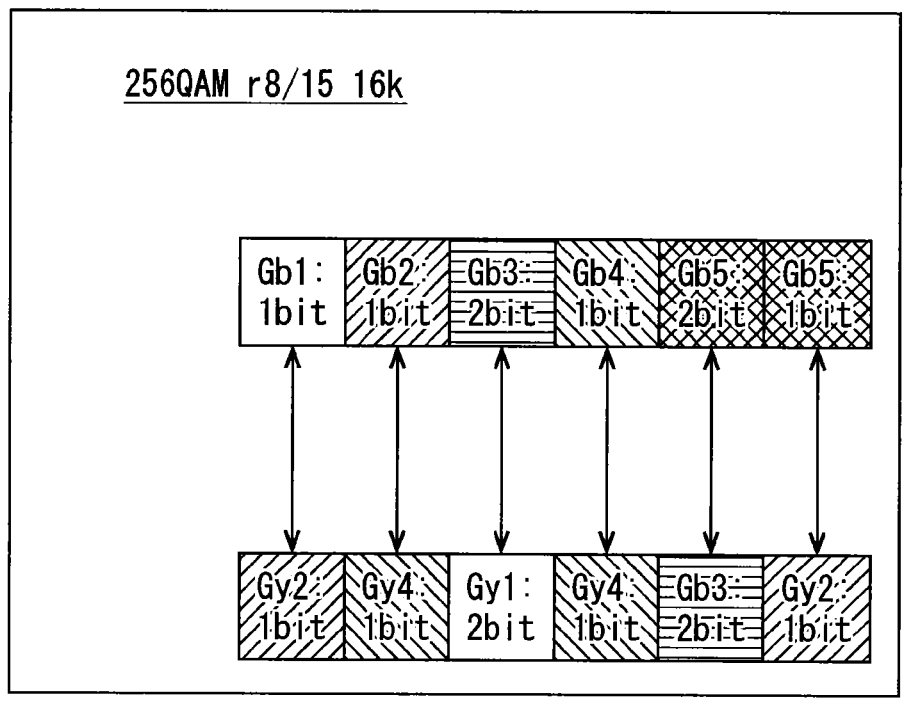
FIG. 59 is a diagram showing an assignment rule in cases where an LDPC code having a code length of 16200 and a code rate of 8/15 is modulated by 256QAM, and the multiple number b is 1.

FIG. 59 shows the assignment rule in a case where each LDPC code is an LDPC code for portable terminals that has the code length N of 16200 bits and the code rate of 8/15, the modulation method is 256QAM, and the multiple number b is 1.

The assignment rule shown in FIG. 59 specifies group set information (Gb1, Gy2, 1), (Gb2, Gy4, 1), (Gb3, Gy1, 2), (Gb4, Gy4, 1), (Gb5, Gy3, 2), and (Gb5, Gy2, 1).

Specifically, the assignment rule shown in FIG. 59 specifies that one sign bit of the sign bit group Gb1 having the best error probability is assigned to one symbol bit of the symbol bit group Gy2 having the second best error probability in accordance with the group set information (Gb1, Gy2, 1), one sign bit of the sign bit group Gb2 having the second best error probability is assigned to one symbol bit of the symbol bit group Gy4 having the fourth best error probability in accordance with the group set information (Gb2, Gy4, 1), two sign bits of the sign bit group Gb3 having the third best error probability are assigned to two symbol bits of the symbol bit group Gy1 having the best error probability in accordance with the group set information (Gb3, Gy1, 2), one sign bit of the sign bit group Gb4 having the fourth best error probability is assigned to one symbol bit of the symbol bit group Gy4 having the fourth best error probability in accordance with the group set information (Gb4, Gy4, 1), two sign bits of the sign bit group Gb5 having the fifth best error probability are assigned to two symbol bits of the symbol bit group Gy3 having the third best error probability in accordance with the group set information (Gb5, Gy3, 2), and one sign bit of the sign bit group Gb5 having the fifth best error probability is assigned to one symbol bit of the symbol bit group Gy2 having the second best error probability in accordance with the group set information (Gb5, Gy2, 1).

Figure 60:
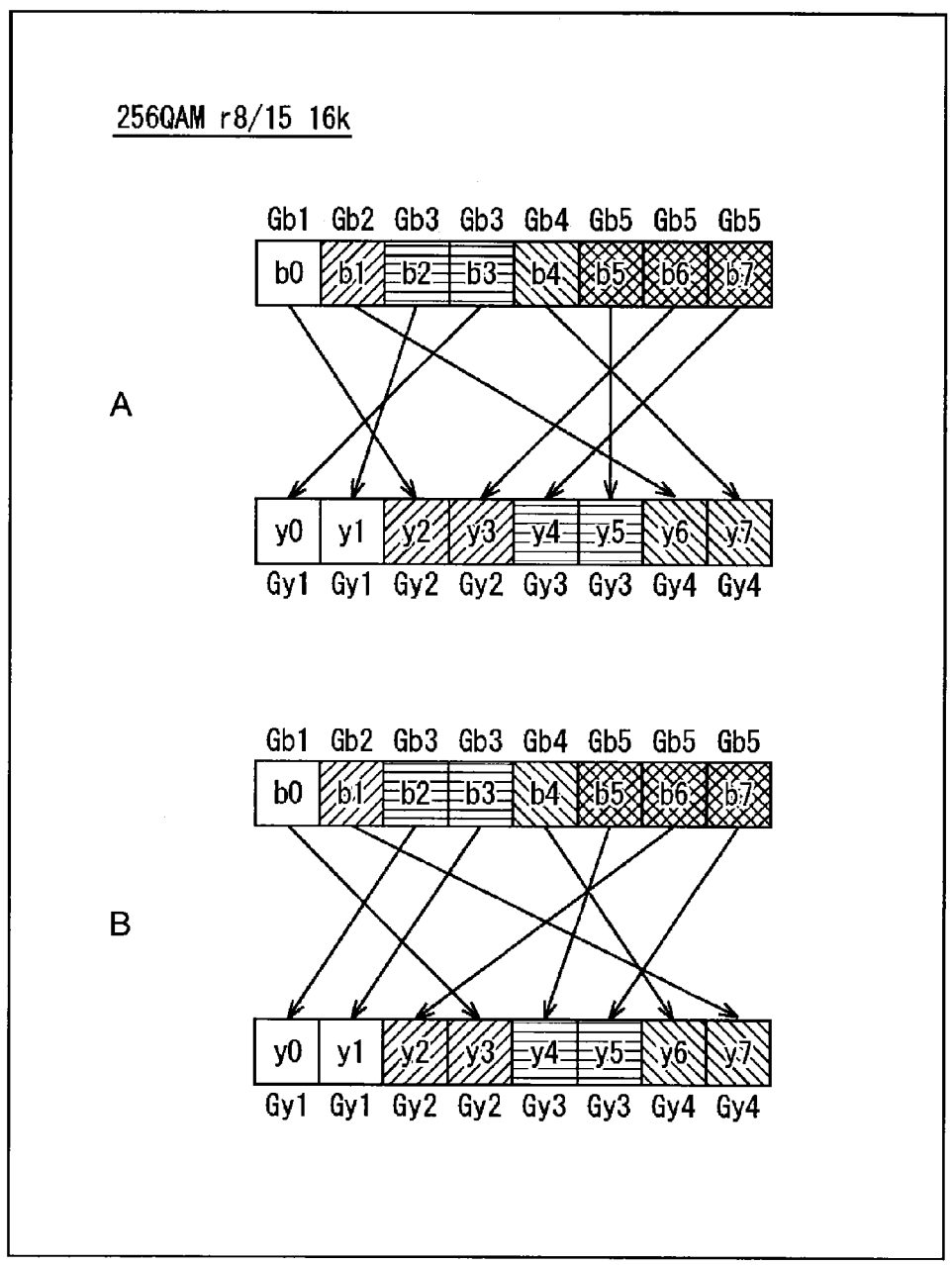
FIG. 60 is a diagram showing sign bit shuffling according to the assignment rule in cases where an LDPC code having a code length of 16200 and a code rate 8/15 is modulated by 256QAM, and the multiple number b is 1.

FIG. 60 shows an example of sign bit shuffling in accordance with the assignment rule shown in FIG. 59.

Specifically, A of FIG. 60 shows a first example of sign bit shuffling in accordance with the assignment rule shown in FIG. 59 in a case where each LDPC code is an LDPC code for portable terminals that has the code length N of 16200 bits and the code rate of 8/15, the modulation method is 256QAM, and the multiple number b is 1.

In a case where each LDPC code is an LDPC code for portable terminals having the code length N of 16200 bits and the code rate of 8/15, the modulation method is 256QAM, and the multiple number b is 1, sign bits written in the memory 31 that stores (16200/(8×1))×(8×1) bits in the column direction and the row direction are read in the row direction 8×1 (=mb) bits at a time, and are supplied to the shuffling unit 32 (FIGS. 18 and 19) in the demultiplexer 25.

According to the assignment rule shown in FIG. 59, the shuffling unit 32 shuffles 8×1 (=mb) sign bits b0 through b7, so that the 8×1 (=mb) sign bits b0 through b7, which are read from the memory 31, are assigned to the 8×1 (=mb) symbol bits y0 through y7 of one (=b) symbol, for example, as shown in A of FIG. 60.

Specifically, the shuffling unit 32 performs the shuffling, so that the sign bit b0 is assigned to the symbol bit y2,
the sign bit b1 is assigned to the symbol bit y6,
the sign bit b2 is assigned to the symbol bit y1,
the sign bit b3 is assigned to the symbol bit y0,
the sign bit b4 is assigned to the symbol bit y7,
the sign bit b5 is assigned to the symbol bit y5,
the sign bit b6 is assigned to the symbol bit y3, and
the sign bit b7 is assigned to the symbol bit y4.

B of FIG. 60 shows a second example of sign bit shuffling in accordance with the assignment rule shown in FIG. 59 in a case where each LDPC code is an LDPC code for portable terminals that has the code length N of 16200 bits and the code rate of 8/15, the modulation method is 256QAM, and the multiple number b is 1.

In B of FIG. 60, the shuffling unit 32 shuffles the 8×1 (=mb) sign bits b0 through b7 read from the memory 31 in accordance with the assignment rule shown in FIG. 59, so that the sign bit b0 is assigned to the symbol bit y3,
the sign bit b1 is assigned to the symbol bit y7,
the sign bit b2 is assigned to the symbol bit y0,
the sign bit b3 is assigned to the symbol bit y1,
the sign bit b4 is assigned to the symbol bit y6,
the sign bit b5 is assigned to the symbol bit y4,
the sign bit b6 is assigned to the symbol bit y2, and
the sign bit b7 is assigned to the symbol bit y5.

In the simulations performed by the inventor, it was confirmed that the BERs were better in a case where a shuffling operation according to a novel shuffling method was performed than in a case where a shuffling operation was not performed. Accordingly, tolerance for errors can be increased by a shuffling operation according to a novel shuffling method.

In this embodiment, the shuffling unit 32 performs shuffling operations on sign bits read from the memory 31 in the demultiplexer 25, for ease of explanation. However, shuffling operations can be performed by controlling the writing and reading of sign bits into and from the memory 31.

That is, shuffling operations can be performed by controlling addresses at which sign bits are to be read (read addresses) so that sign bits are read from the memory 31 in the order of post-shuffling sign bits.

[Example Structure of Reception Device 12]

Figure 61:
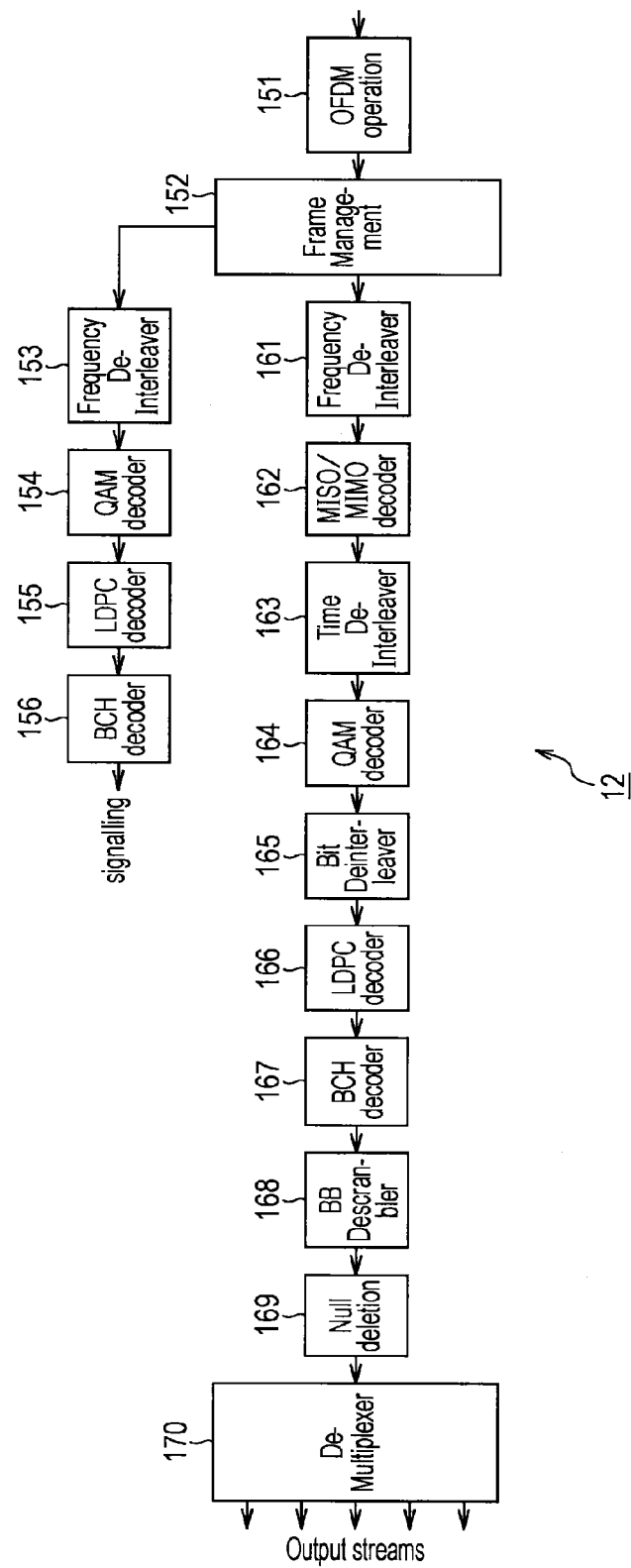
FIG. 61 is a block diagram showing an example structure of a reception device 12.

FIG. 61 is a block diagram showing an example structure of the reception device 12 shown in FIG. 7.

An OFDM operation unit 151 receives an OFDM signal from the transmission device 11 (FIG. 7), and performs signal processing on the OFDM signal. The data (symbols) obtained by the OFDM operation unit 151 performing the signal processing is supplied to a frame management unit 152.

The frame management unit 152 performs processing on a frame (frame interpretation) formed with the symbols supplied from the OFDM operation unit 151, and supplies the symbols of the resultant target data and the symbols of the resultant control data to frequency deinterleavers 161 and 153.

The frequency deinterleaver 153 performs frequency deinterleaving on each of the symbols supplied from the frame management unit 152, and supplies the results to a QAM decoder 154.

The QAM decoder 154 performs orthogonal demodulation by demapping (signal point location decoding) the symbols (the symbols located at signal points) supplied from the frequency deinterleaver 153, and supplies the resultant data (an LDPC code) to an LDPC decoder 155.

The LDPC decoder 155 performs LDPC decoding on the LDPC code supplied from the QAM decoder 154, and supplies the resultant LDPC target data (a BCH code in this case) to a BCH decoder 156.

The BCH decoder 156 performs BCH decoding on the LDPC target data supplied from the LDPC decoder 155, and outputs the resultant control data (signaling).

Meanwhile, the frequency deinterleaver 161 performs frequency deinterleaving on each of the symbols supplied from the frame management unit 152, and supplies the results to a MISO/MIMO decoder 162.

The MISO/MIMO decoder 162 performs space-time decoding on the data (symbols) supplied from the frequency deinterleaver 161, and supplies the results to a time deinterleaver 163.

The time deinterleaver 163 performs time deinterleaving on each symbol of the data (symbols) supplied from the MISO/MIMO decoder 162, and supplies the results to a QAM decoder 164.

The QAM decoder 164 performs orthogonal demodulation by demapping (signal point location decoding) the symbols (the symbols located at signal points) supplied from the time deinterleaver 163, and supplies the resultant data (symbols) to a bit deinterleaver 165.

The bit deinterleaver 165 performs bit deinterleaving on the data (symbols) supplied from the QAM decoder 164, and supplies the resultant LDPC code to an LDPC decoder 166.

The LDPC decoder 166 performs LDPC decoding on the LDPC code supplied from the bit deinterleaver 165, and supplies the resultant LDPC target data (a BCH code in this case) to a BCH decoder 167.

The BCH decoder 167 performs BCH decoding on the LDPC target data supplied from the LDPC decoder 155, and supplies the resultant data to a BB descrambler 168.

The BB descrambler 168 performs an inverse energy diffusing operation on the data supplied from the BCH decoder 167, and supplies the resultant data to a null deletion unit 169.

The null deletion unit 169 deletes the nulls inserted by the padder 112 shown in FIG. 8, from the data supplied from the BB descrambler 168, and supplies the results to a demultiplexer 170.

The demultiplexer 170 separates each of the one or more streams (target data) multiplexed on the data supplied from the null deletion unit 169, and outputs the streams as output streams.

Figure 62:
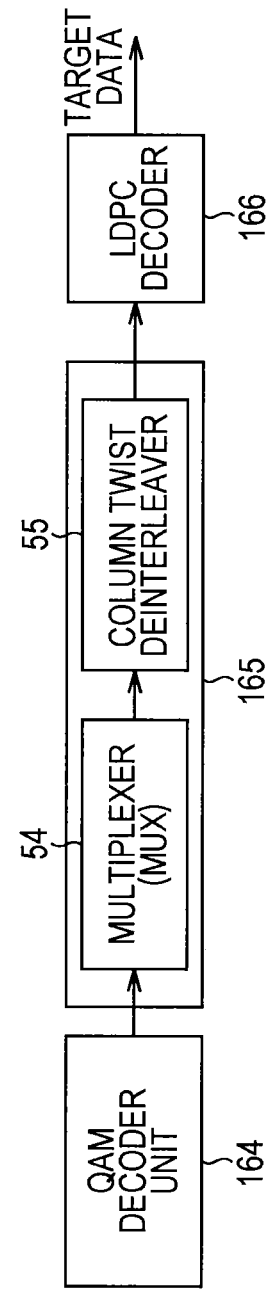
FIG. 62 is a block diagram showing an example structure of a bit deinterleaver 165.

FIG. 62 is a block diagram showing an example structure of the bit deinterleaver 165 shown in FIG. 61.

The bit deinterleaver 165 includes a multiplexer (MUX) 54 and a column twist deinterleaver 55, and performs (bit) deinterleaving on the symbol bits of the symbols supplied from the QAM decoder 164 (FIG. 61).

Specifically, the multiplexer 54 performs an inverse shuffling operation corresponding to the shuffling operation performed by the demultiplexer 25 shown in FIG. 9 (the opposite operation of the shuffling operation) on the symbol bits of the symbols supplied from the QAM decoder 164, or performs an inverse shuffling operation to return the sign bits (symbol bits) of an LDPC code shuffled by the shuffling operation to the original positions. The resultant LDPC code is supplied to the column twist deinterleaver 55.

The column twist deinterleaver 55 performs column twist deinterleaving corresponding to the column twist interleaving as the rearrangement operation performed by the column twist interleaver 24 shown in FIG. 9 (the opposite operation of the column twist interleaving) on the LDPC code supplied from the multiplexer 54, or performs column twist deinterleaving, for example, as an inverse rearrangement operation to return the sequence of the sign bits of the LDPC code rearranged by the column twist interleaving as the rearrangement operation to the original sequence.

Specifically, the column twist deinterleaver 55 writes the sign bits of the LDPC code on a memory for deinterleaving that has the same structure as the memory 31 shown in FIG. 24 and others, and further reads the sign bits to perform column twist deinterleaving.

The column twist deinterleaver 55 performs writing of the sign bits in the row direction of the memory for deinterleaving, by using write addresses that are the read addresses used at the time of reading of the sign bits from the memory 31. The reading of the sign bits is performed in the column direction of the memory for deinterleaving, by using read addresses that are the write addresses used at the time of the sign bits into the memory 31.

The LDPC code obtained as a result of the column twist deinterleaving is supplied from the column twist deinterleaver 55 to the LDPC decoder 166.

Here, the LDPC code supplied from the QAM decoder 164 to the bit deinterleaver 165 has been subjected to parity interleaving, column twist interleaving, and a shuffling operation in this order. At the bit deinterleaver 165, however, only the inverse shuffling operation corresponding to the shuffling operation and the column twist deinterleaving corresponding to the column twist interleaving are performed, and parity deinterleaving corresponding to the parity interleaving (the opposite operation of the parity interleaving) or parity deinterleaving to return the sequence of the sign bits of the LDPC code rearranged through the parity interleaving to the original sequence is not performed.

Accordingly, an LDPC code that has been subjected to the inverse shuffling operation and the column twist deinterleaving but has not been subjected to the parity deinterleaving is supplied from (the column twist deinterleaver 55 of) the bit deinterleaver 165 to the LDPC decoder 166.

The LDPC decoder 166 performs LDPC decoding on the LDPC code supplied from the bit deinterleaver 165 by using a transformed parity check matrix obtained by performing at least column replacement equivalent to the parity interleaving on the parity check matrix H used in the LDPC encoding by the LDPC encoder 115 shown in FIG. 8. The resultant data is output as a result of the decoding of the LDPC target data.

Figure 63:
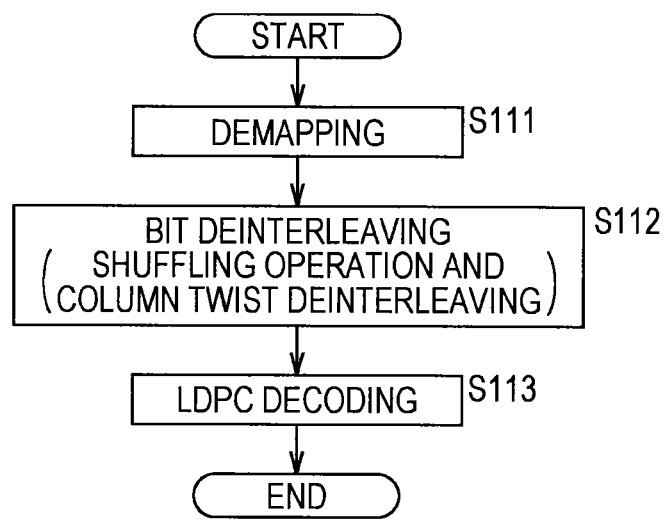
FIG. 63 is a flowchart for explaining operations to be performed by a QAM decoder 164, the bit deinterleaver 165, and a LDPC decoder 166.

FIG. 63 is a flowchart for explaining the operations to be performed by the QAM decoder 164, the bit deinterleaver 165, and the LDPC decoder 166 shown in FIG. 62.

In step S111, the QAM decoder 164 performs orthogonal demodulation by demapping the symbols supplied from the time deinterleaver 163 (the symbols mapped on signal points), and supplies the results to the bit deinterleaver 165. The operation then moves on to step S112.

In step S112, the bit deinterleaver 165 performs deinterleaving on the symbol bits of the symbols supplied from the QAM decoder 164 (bit deinterleaving), and the operation then moves on to step S113.

Specifically, in step S112, the multiplexer 54 in the bit deinterleaver 165 performs an inverse shuffling operation on the symbol bits of the symbols supplied from the QAM decoder 164, and supplies the sign bits of the resultant LDPC code to the column twist deinterleaver 55.

The column twist deinterleaver 55 performs column twist deinterleaving on the LDPC code supplied from the multiplexer 54, and supplies the resultant LDPC code to the LDPC decoder 166.

In step S113, the LDPC decoder 166 performs LDPC decoding on the LDPC code supplied from the column twist deinterleaver 55 by using a transformed parity check matrix obtained by performing at least column replacement equivalent to the parity interleaving on the parity check matrix H used in the LDPC encoding by the LDPC encoder 115 shown in FIG. 8. The resultant data is output as a result of the decoding of the LDPC target data to the BCH decoder 167.

In FIG. 62, for ease of explanation, the multiplexer 54 performing the inverse shuffling operation and the column twist deinterleaver 55 performing the column twist deinterleaving are formed separately from each other, as in the case illustrated in FIG. 9. However, the multiplexer 54 and the column twist deinterleaver 55 can be integrally formed.

In a case where the column twist interleaving is not performed at the bit interleaver 116 shown in FIG. 9, there is no need to provide the column twist deinterleaver 55 in the bit deinterleaver 165 shown in FIG. 62.

Next, the LDPC decoding to be performed at the LDPC decoder 166 shown in FIG. 61 is described in greater detail.

At the LDPC decoder 166 shown in FIG. 61, LDPC decoding of an LDPC code that has been supplied from the column twist deinterleaver 55, has been subjected to the inverse shuffling operation and the column twist deinterleaving, and has not been subjected to the parity deinterleaving is performed by using the transformed parity check matrix obtained by performing at least the column replacement equivalent to the parity interleaving on the parity check matrix H used in the LDPC code by the LDPC encoder 115 shown in FIG. 8, as described above.

LDPC decoding that can restrain the operating frequency to a value within a reasonably realistic range while reducing the circuit size by using a transformed parity check matrix has already been suggested (see Japanese Patent No. 4,224,777, for example).

In view of this, referring now to FIGS. 64 through 67, the already suggested LDPC decoding using a transformed parity check matrix is described.

Figure 64:
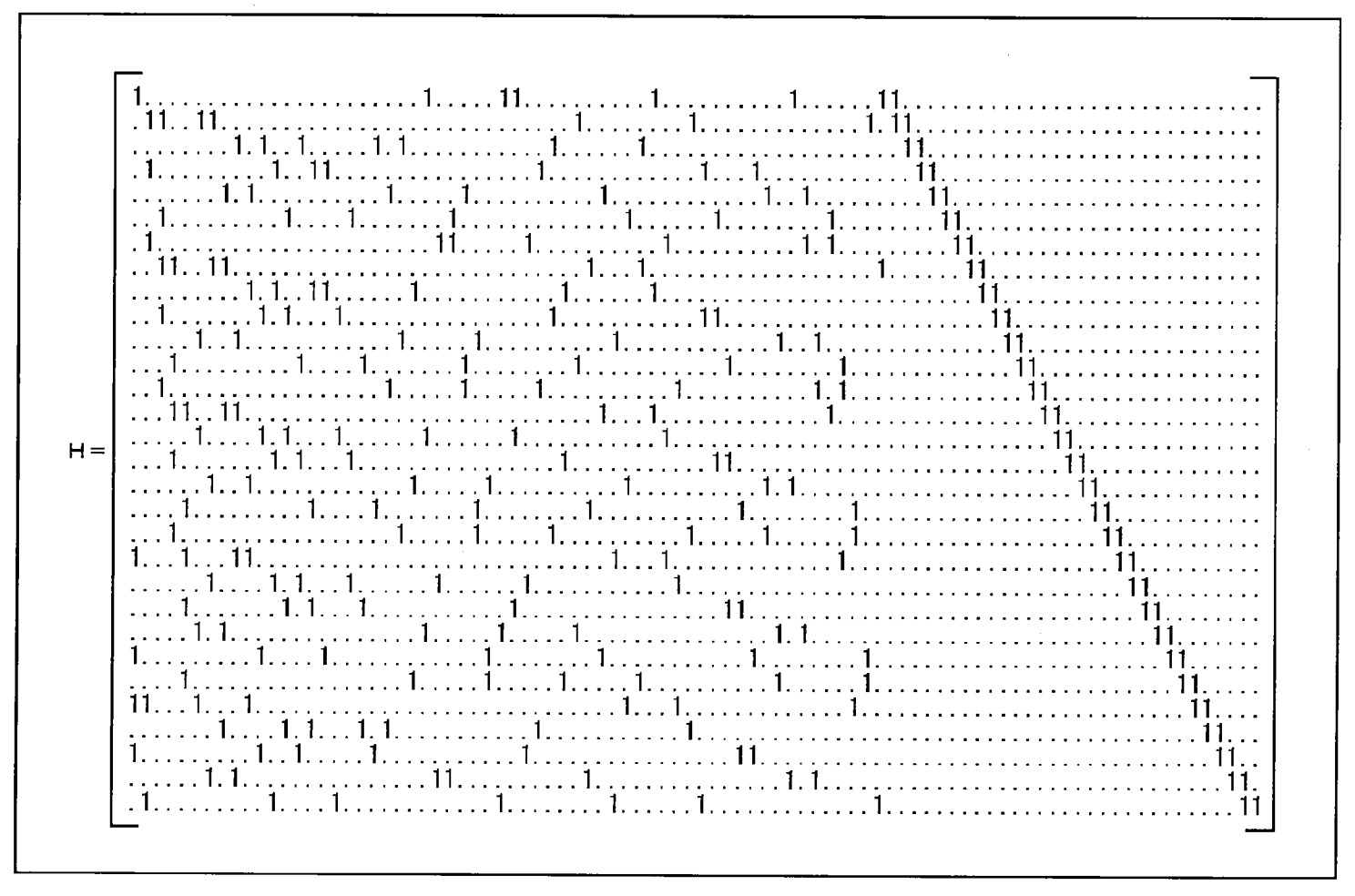

FIG. 64 shows an example of a parity check matrix H of an LDPC code that has a code length N of 90 and a code rate of 2/3.

In FIG. 64 (as in FIGS. 65 and 66, which will be described later), 0 is represented by a point (.)

In the parity check matrix H shown in FIG. 64, the parity matrix has a staircase structure.

Figure 65:
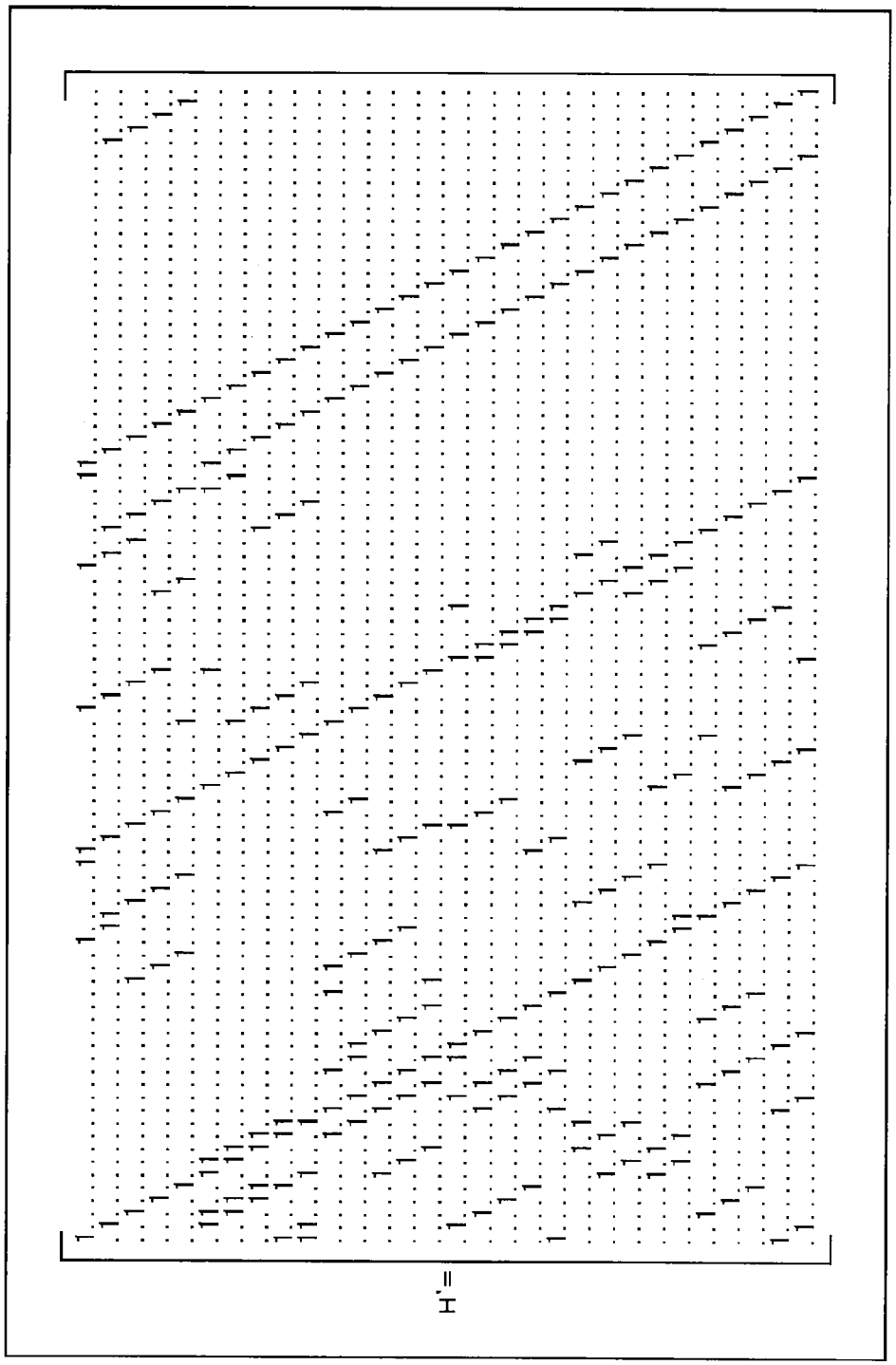
FIG. 65 is a diagram showing a matrix (a transformed parity check matrix) obtained by performing row replacement and column replacement on a parity check matrix.

FIG. 65 shows the parity check matrix H' obtained by performing row replacement shown in the expression (11) and the column replacement shown in the expression (12) on the parity check matrix H shown in FIG. 64.

Row replacement: the $(6s+t+1)$th row→the $(5t+s+1)$th row (11)

Column replacement: the $(6x+y+61)$th column→the $(5y+x+61)$th column (12)

In the expressions (11) and (12), s, t, x, and y are integers in the ranges expressed as $0 \le s < 5$, $0 \le t < 6$, $0 \le x < 5$, and $0 \le t < 6$, respectively.

By the row replacement shown in the expression (11), the 1st, 7th, 13rd, 19th, and 25th rows with the row numbers each leaving a remainder of 1 when divided by 6 are moved to the 1st, 2nd, 3rd, 4th, and 5th rows, respectively, and the 2nd, 8th, 14th, 20th, and 26th rows with the row numbers each leaving a remainder of 2 when divided by 6 are moved to the 6th, 7th, 8th, 9th, and 10th rows, respectively.

By the column replacement that is shown in the expression (12) and is performed on the 61st column and the columns thereafter (the parity matrix), the 61st, 67th, 73rd, 79th, and 85th columns with the column numbers each leaving a remainder of 1 when divided by 6 are moved to the 61st, 62nd, 63rd, 64th, and 65th columns, respectively, and the 62nd, 68th, 74th, 80th, and 86th columns with the column numbers each leaving a remainder of 2 when divided by 6 are moved to the 66th, 67th, 68th, 69th, and 70th columns, respectively.

The matrix obtained by performing the row and column replacement in this manner on the parity check matrix H shown in FIG. 64 is the parity check matrix H' shown in FIG. 65.

Here, the sequence of the sign bits of the LDPC code is not affected by the row replacement performed on the parity check matrix H.

The column replacement shown in the expression (12) is equivalent to the above described parity interleaving to interleave the $(K+qx+y+1)$th sign bit to the position of the $(K+Py+x+1)$th sign bit, where the information length K is 60, the unit column number P in the cyclic structure is 5, and the divisor q (M/P) of the parity length M (30 in this case) is 6.

When the parity check matrix (hereinafter referred to as the transformed parity check matrix, appropriately) H' shown in FIG. 65 is multiplied by the result of the same replacement as the replacement shown in the expression (12) performed on the LDPC code of the parity check matrix (hereinafter referred to as the original parity check matrix, appropriately) H shown in FIG. 64, a zero vector is output. Specifically, where c' represents the row vector obtained by performing the column replacement shown in the expression (12) on the row vector c as the LDPC code (one code word) of the original parity check matrix H, H'c'$^T$ is of course a zero vector, since Hc$^T$ is a zero vector by the nature of a parity check matrix.

In view of the above, the transformed parity check matrix H' shown in FIG. 65 is the parity check matrix of the LDPC code c' obtained by performing the column replacement shown in the expression (12) on the LDPC code c of the original parity check matrix H.

Accordingly, the column replacement shown in the expression (12) is performed on the LDPC code c of the original parity check matrix H, and the LDPC code c' obtained after the column replacement is decoded by using the transformed parity check matrix H' shown in FIG. 65 (LDPC decoding). The inverse replacement of the column replacement shown in the expression (12) is then performed on the decoding result. In this manner, the same decoding result as the result of decoding of the LDPC code of the original parity check matrix H with the use of the parity check matrix H can be obtained.

Figure 66:
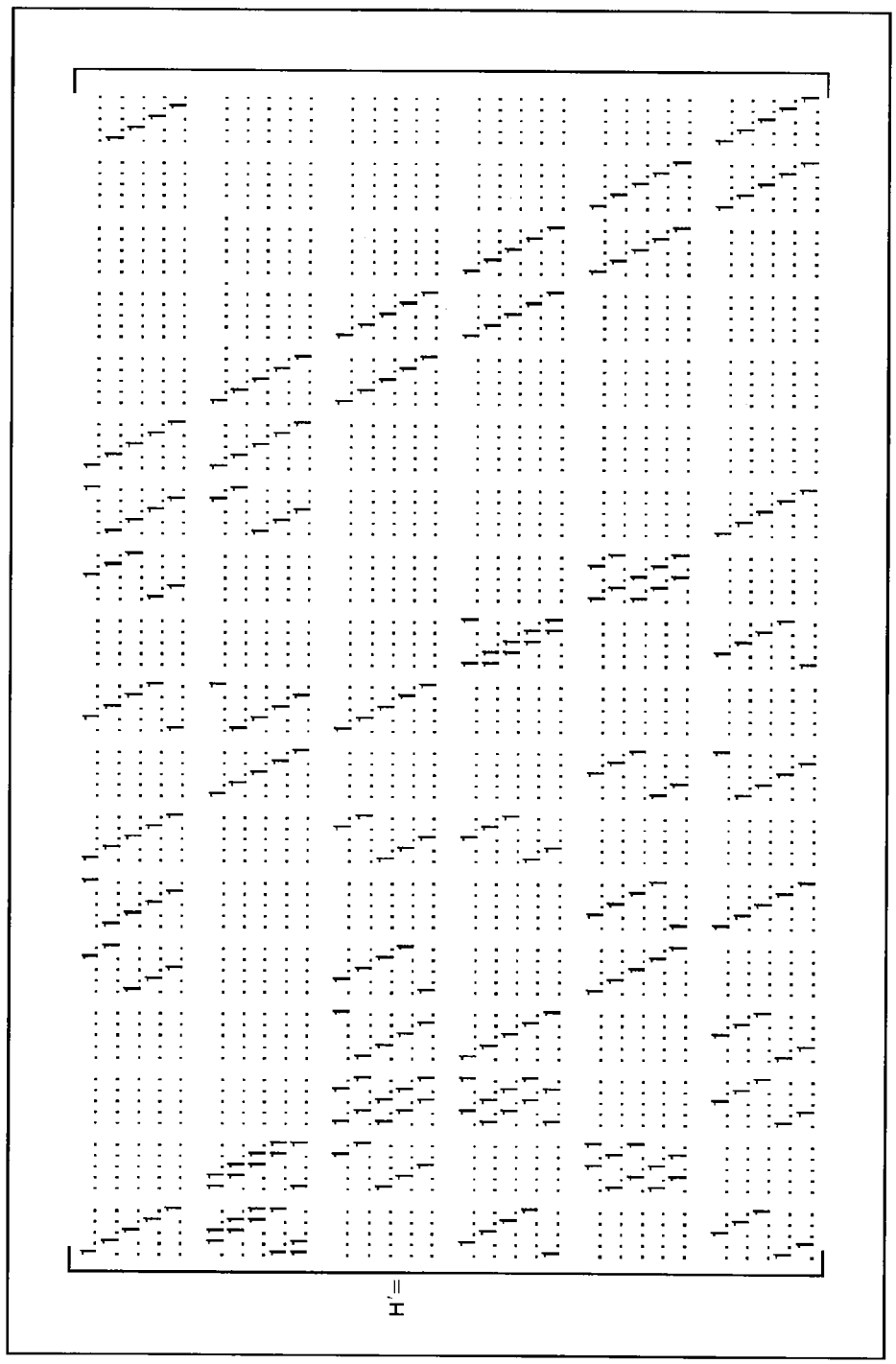
FIG. 66 is a diagram showing a transformed parity check matrix divided into 5×5 units.

FIG. 66 shows the transformed parity check matrix H' shown in FIG. 65 in a case where a space is inserted at intervals of a 5×5 unit matrix.

In FIG. 66, the transformed parity check matrix H' is depicted as a combination of 5×5 unit matrixes, matrixes in which one or more of the elements "1" of each unit matrix is changed to "0" (hereinafter referred to as quasi-unit matrixes, appropriately), matrixes formed by cyclically shifting unit matrixes or quasi-unit matrixes (hereinafter referred to as shift matrixes, appropriately), sums each obtained by adding two or more of a unit matrix, a quasi-unit matrix, and a shift matrix (hereinafter referred to as sum matrixes, appropriately), and 5×5 zero matrixes.

It can be said that the transformed parity check matrix H' shown in FIG. 66 is formed with 5×5 unit matrixes, quasi-unit matrixes, shift matrixes, sum matrixes, and zero matrixes. Those 5×5 matrixes constituting the transformed parity check matrix H' will be hereinafter referred to as constitutive matrixes, appropriately.

To decode an LDPC code of a parity check matrix expressed by a P×P constitutive matrix, an architecture that simultaneously performs P check node operations and P variable node operations can be used.

Figure 67:
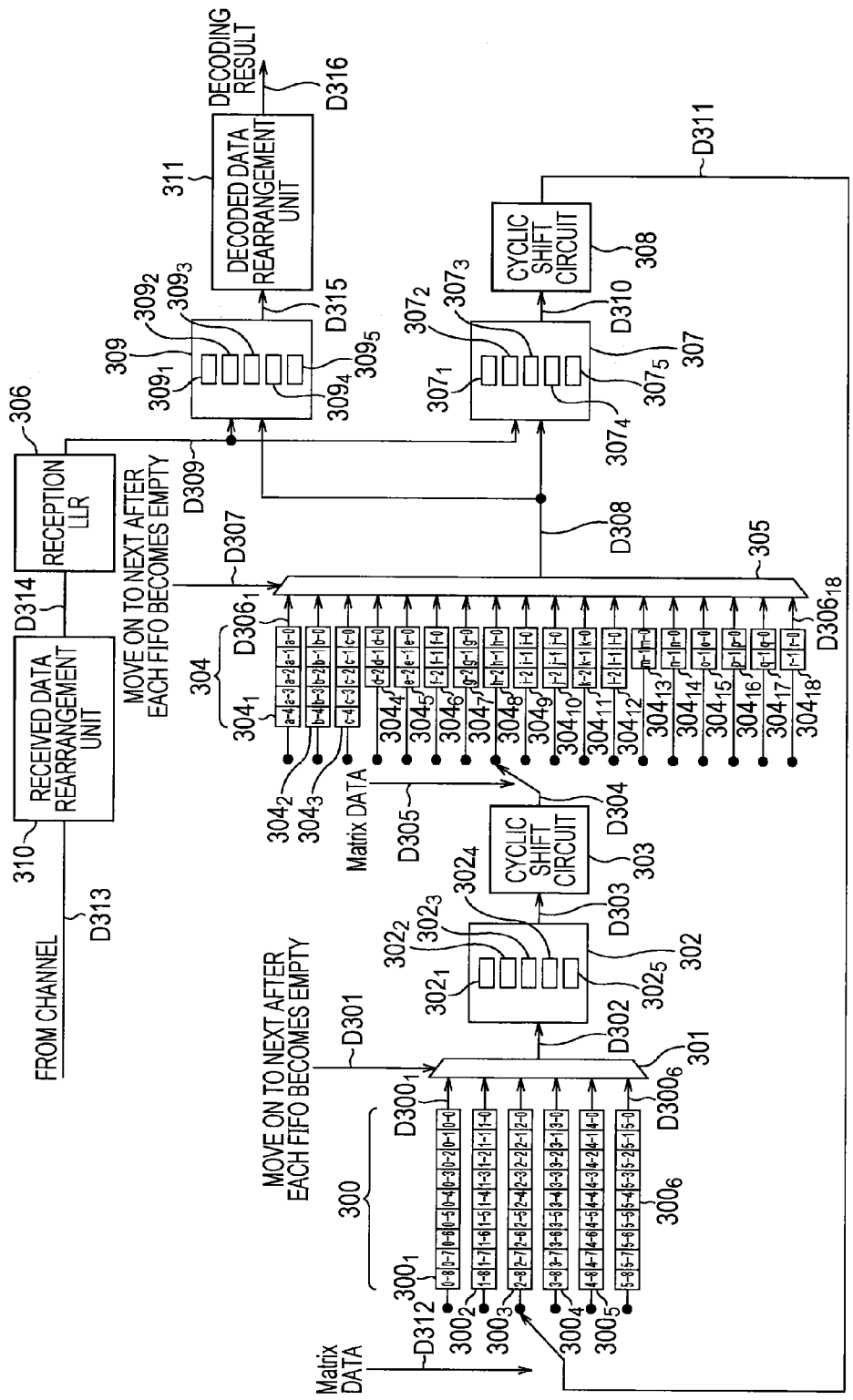
FIG. 67 is a block diagram showing an example structure of a decoding device that collectively performs P node calculations.

FIG. 67 is a block diagram showing an example structure of a decoding device that performs such decoding.

Specifically, FIG. 67 shows an example structure of a decoding device that decodes an LDPC code by using the transformed parity check matrix H' of FIG. 66 obtained by performing at least the column replacement shown in the expression (12) on the original parity check matrix H shown in FIG. 64.

The decoding device shown in FIG. 67 includes: an edge data storage memory 300 formed with six FIFOs $300_1$ through $300_6$; a selector 301 that selects the FIFOs $300_1$ through $300_6$; a check node calculation unit 302; two cyclic shift circuits 303 and 308; an edge data storage memory 304 formed with 18 FIFOs $304_1$ through $304_{18}$; a selector 305 that selects the FIFOs $304_1$ through $304_{18}$; a received data memory 306 that stores received data; a variable node calculation unit 307; a decoded word calculation unit 309; a received data rearrangement unit 310; and a decoded data rearrangement unit 311.

First, a method of storing data into the edge data storage memories 300 and 304 is described.

The edge data storage memory 300 is formed with the six FIFOs $300_1$ through $300_6$, six being the number obtained by dividing 30, which is the number of rows in the transformed parity check matrix H' of FIG. 66, by 5, which is the number of rows in each constitutive matrix. Each FIFO $300_y$ (y=1, 2, 6) includes several stages of storage areas, and messages corresponding to the five edges equivalent to the number of rows and the number of columns in each constitutive matrix can be simultaneously read from and written into the storage area in each stage. The number of stages of storage areas in a FIFO $300_y$ is 9, which is the maximum number of the elements 1 in the row direction (Hamming weight) in the transformed parity check matrix of FIG. 66.

The data corresponding to the positions of the elements "1" in the first through fifth rows in the transformed parity check matrix H' of FIG. 66 (messages $v_i$ from variable nodes) is stored into the FIFO $300_1$ in such a manner that the data is aligned in the horizontal direction in the respective rows (with "0" being ignored). Specifically, where (j, i) represents the jth row and the ith column, the data corresponding to the positions of the elements "1" in the 5×5 unit matrix of (1, 1) to (5, 5) in the transformed parity check matrix H' is stored into the storage area in the first stage in the FIFO $300_1$. The data corresponding to the positions of the elements "1" in the shift matrix of (1, 21) to (5, 25) (the shift matrix formed by cyclically shifting the 5×5 unit matrix rightward by 3) in the transformed parity check matrix H' is stored into the storage area in the second stage. Likewise, data associated with the transformed parity check matrix H' is stored into the storage areas in the third through eighth stages. The data corresponding to the positions of the elements "1" in the shift matrix of (1, 86) to (5, 90) (the shift matrix formed by cyclically shifting the 5×5 unit matrix leftward by 1, after the elements "1" in the first row in the 5×5 unit matrix are replaced with "0") in the transformed parity check matrix H' is stored into the storage area in the ninth stage.

The data corresponding the positions of the elements "1" in the sixth through tenth rows in the transformed parity check matrix H' of FIG. 66 is stored into the FIFO $300_2$. Specifically, the data corresponding to the positions of the elements "1" in a first shift matrix forming the sum matrix of (6, 1) to (10, 5) (the sum matrix that is the sum of the first shift matrix formed by cyclically shifting the 5×5 unit matrix rightward by 1, and a second shift matrix formed by cyclically shifting the 5×5 unit matrix rightward by 2) in the transformed parity check matrix H' is stored into the storage area in the first stage in the FIFO $300_2$. The data corresponding to the positions of the elements "1" in the second shift matrix forming the sum matrix of (6, 1) to (10, 5) in the transformed parity check matrix H' is stored into the storage area in the second stage.

Specifically, as for a constitutive matrix having a weight of 2 or greater, where the constitutive matrix is expressed by the sum of two or more of a P×P unit matrix having a weight of 1, a quasi-unit matrix in which one or more elements "1" in the unit matrix are changed to "0", and a shift matrix formed by cyclically shifting the unit matrix or the quasi-unit matrix, the data corresponding to the positions of the elements "1" in the unit matrix having the weight of 1, the quasi-unit matrix, or the shift matrix (the messages corresponding to the edges belonging to the unit matrix, the quasi-unit matrix, or the shift matrix) is stored at the same address (one FIFO among the FIFOs $300_1$ through $300_6$).

Likewise, data associated with the transformed parity check matrix H' is stored into the storage areas in the third through ninth stages.

Data associated with the transformed parity check matrix H' is also stored into the FIFOs $300_3$ through $300_6$ in the same manner as above.

The edge data storage memory 304 is formed with the 18 FIFOs $304_1$ through $304_{18}$, 18 being the number obtained by dividing 90, which is the number of columns in the transformed parity check matrix H', by 5, which is the number of columns in each constitutive matrix. Each FIFO $304_x$ (x=1, 2, . . . , 18) includes several stages of storage areas, and messages corresponding to the five edges equivalent to the number of rows and the number of columns in the transformed constitutive matrix H' can be simultaneously read from and written into the storage area in each stage.

The data corresponding to the positions of the elements "1" in the first through fifth columns in the transformed parity check matrix H' of FIG. 66 (messages $u_j$ from check nodes) is stored into the FIFO $304_1$ in such a manner that the data is aligned in the vertical direction in the respective columns (with "0" being ignored). Specifically, the data corresponding to the positions of the elements "1" in the 5×5 unit matrix of (1, 1) to (5, 5) in the transformed parity check matrix H' is stored into the storage area in the first stage in the FIFO $304_1$. The data corresponding to the positions of the elements "1" in a first shift matrix forming the sum matrix of (6, 1) to (10, 5) (the sum matrix that is the sum of the first shift matrix formed by cyclically shifting the 5×5 unit matrix rightward by 1, and a second shift matrix formed by cyclically shifting the 5×5 unit matrix rightward by 2) in the transformed parity check matrix H' is stored into the storage area in the second stage. The data corresponding to the positions of the elements "1" in the second shift matrix forming the sum matrix of (6, 1) to (10, 5) in the transformed parity check matrix H' is stored into the storage area in the third stage.

Specifically, as for a constitutive matrix having a weight of 2 or greater, where the constitutive matrix is expressed by the sum of two or more of a P×P unit matrix having a weight of 1, a quasi-unit matrix in which one or more elements "1" in the unit matrix are changed to "0", and a shift matrix formed by cyclically shifting the unit matrix or the quasi-unit matrix, the data corresponding to the positions of the elements "1" in the unit matrix having the weight of 1, the quasi-unit matrix, or the shift matrix (the messages corresponding to the edges belonging to the unit matrix, the quasi-unit matrix, or the shift matrix) is stored at the same address (one FIFO among the FIFOs $304_1$ through $304_{18}$).

Likewise, data associated with the transformed parity check matrix H' is stored into the storage areas in the fourth and fifth stages. The number of stages of storage areas in the FIFO $304_1$ is 5, which is the maximum number of the elements 1 in the row direction (Hamming weight) in the first through fifth columns in the transformed parity check matrix H'.

The FIFOs $304_2$ and $304_3$ also store data associated with the transformed parity check matrix H', and the length (the number of stages) of each of those FIFOs is 5. The FIFOs $304_4$ through $304_{12}$ also store data associated with the transformed parity check matrix H', and the length of each of those FIFOs is 3. The FIFOs $304_{13}$ through $304_{18}$ also store data associated with the transformed parity check matrix H', and the length of each of those FIFOs is 2.

Next, the operation of the decoding device shown in FIG. 67 is described.

The edge data storage memory 300 is formed with the six FIFOs $300_1$ through $300_6$, and selects a FIFO to store data from the FIFOs $300_1$ through $300_6$ in accordance with information (matrix data) D312 indicating which rows the five messages D311 supplied from the cyclic shift circuit 308 in the previous stage belong in the transformed parity check matrix H'. The five messages D311 are collectively and sequentially stored into the selected FIFO. When reading data, the edge data storage memory 300 sequentially reads five messages $D300_1$ from the FIFO $300_1$, and supplies the messages to the selector 301 in the next stage. After reading the messages from the FIFO $300_1$, the edge data storage memory 300 also sequentially reads messages from the FIFOs $300_2$ through $300_6$, and supplies the messages to the selector 301.

In accordance with a select signal D301, the selector 301 selects the five messages from the FIFO from which data is being currently read among the FIFOs $300_1$ through $300_6$, and supplies the selected five messages as messages D302 to the check node calculation unit 302.

The check node calculation unit 302 is formed with five check node calculators $302_1$ through $302_5$, performs check node calculations according to the equation (7) by using the messages D302 ($D302_1$ through $D302_5$) (the messages $v_i$ in the equation (7)) supplied through the selector 301, and supplies the five messages D303 ($D303_1$ through $D303_5$) (the messages $u_j$ in the equation (7)) obtained as a result of the check node calculations, to the cyclic shift circuit 303.

The cyclic shift circuit 303 cyclically shifts the five messages $D303_1$ through $D303_5$ determined by the check node calculation unit 302, based on information (matrix data) D305 indicating how many bits the base unit matrix in the transformed parity check matrix H' has been cyclically shifted to form the corresponding edges. The results are supplied as messages D304 to the edge data storage memory 304.

The edge data storage memory 304 is formed with the 18 FIFOs $304_1$ through $304_{18}$, and selects a FIFO to store data from the FIFOs $304_1$ through $304_{18}$ in accordance with information D305 indicating which rows the five messages D304 supplied from the cyclic shift circuit 303 in the previous stage belong in the transformed parity check matrix H'. The five messages D304 are collectively and sequentially stored into the selected FIFO. When reading data, the edge data storage memory 304 sequentially reads five messages $D306_1$ from the FIFO $304_1$, and supplies the messages to the selector 305 in the next stage. After reading the data from the FIFO $304_1$, the edge data storage memory 304 also sequentially reads messages from the FIFOs $304_2$ through $304_{18}$, and supplies the messages to the selector 305.

In accordance with a select signal D307, the selector 305 selects the five messages from the FIFO from which data is being currently read among the FIFOs $304_1$ through $304_{18}$, and supplies the selected messages as messages D308 to the variable node calculation unit 307 and the decoded word calculation unit 309.

Meanwhile, the received data rearrangement unit 310 rearranges an LDPC code D313 received through the channel 13 by performing the column replacement shown in the expression (12), and supplies received data D314 to the received data memory 306. The received data memory 306 calculates reception LLRs (log likelihood ratios) from the received data D314 supplied from the received data rearrangement unit 310, and stores the reception LLRs. Each set of five reception LLRs forms received values D309, and is supplied to the variable node calculation unit 307 and the decoded word calculation unit 309.

The variable node calculation unit 307 is formed with five variable node calculators $307_1$ through $307_5$, and performs variable node calculations according to the equation (1) by using the messages D308 ($D308_1$ through $D308_5$) (the messages $u_j$ in the equation (1)) supplied through the selector 305 and the five received values D309 (the received values $u_{0i}$ in the equation (1)) supplied from the received data memory 306. The messages D310 ($D310_1$ through $D310_5$) (the messages $v_i$ in the equation (1)) obtained as a result of the calculations are supplied to the cyclic shift circuit 308.

The cyclic shift circuit 308 cyclically shifts the messages $D310_1$ through $D310_5$ calculated by the variable node calculation unit 307, based on information indicating how many bits the base unit matrix in the transformed parity check matrix H' has been cyclically shifted to form the corresponding edges. The results are supplied as messages D311 to the edge data storage memory 300.

Every time the above operation is performed once, an LDPC code decoding operation can be performed. In the decoding device shown in FIG. 67, after an LDPC code is decoded a predetermined number of times, the decoded word calculation unit 309 and the decoded data rearrangement unit 311 determines and outputs the final decoding result.

Specifically, the decoded word calculation unit 309 is formed with five decoded word calculators $309_1$ through $309_5$, and calculates a decoding result (a decoded word) based on the equation (5) in the last stage of decoding operations, by using the five messages D308 ($D308_1$ through $D308_5$) (the messages $u_j$ in the equation (5)) output from the selector 305 and the five received values D309 (the received values $u_{0i}$ in the equation (5)) supplied from the received data memory 306. The resultant decoded data D315 is supplied to the decoded data rearrangement unit 311.

The decoded data rearrangement unit 311 performs the inverse replacement of the column replacement shown in the expression (12) on the decoded data D315 supplied from the decoded word calculation unit 309, to rearrange the sequence in the decoded data D315. The final decoding result D316 is then output.

As described above, the parity check matrix (the original parity check matrix) is subjected to row replacement and/or column replacement, and is thus transformed into a parity check matrix (a transformed parity check matrix) that can be expressed by a combination of P×P unit matrixes, quasi-unit matrixes each having one or more of the elements 1 changed to "0", shift matrixes each formed by cyclically shifting a unit matrix or a quasi-unit matrix, sum matrixes each formed by adding two or more of a unit matrix, a quasi-unit matrix, and a shift matrix, and P×P zero matrixes, or a combination of constitutive matrixes. Accordingly, an architecture that can simultaneously perform P check node calculations and P variable node calculations can be used in decoding an LDPC code. As P node calculations are simultaneously performed, the operating frequency is restrained to a value within a realistic range, and a large number of repetitive decoding operations can be performed.

Like the decoding device shown in FIG. 67, the LDPC decoder 166 of the reception device 12 shown in FIG. 61 is designed to perform LDPC decoding by simultaneously performing P check node calculations and P variable node calculations.

For ease of explanation, if the parity check matrix of the LDPC code output from the LDPC encoder 115 of the transmission device 11 shown in FIG. 8 is a parity check matrix H in which the parity matrix has a staircase structure as shown in FIG. 64, for example, the parity interleaver 23 of the transmission device 11 performs parity interleaving to interleave the (K+qx+y+1)th sign bit to the position of the (K+Py+x+1)th sign bit, where the information length K is 60, the unit column number P in the cyclic structure is 5, and the divisor q (=M/P) of the parity length M is 6.

This parity interleaving is equivalent to the column replacement shown in the expression (12) as described above. Therefore, the LDPC decoder 166 does not need to perform the column replacement shown in the expression (12).

Accordingly, the reception device 12 shown in FIG. 61 performs the same operation as the operation performed by the decoding device shown in FIG. 67, except that an LDPC code not subjected to parity deinterleaving or an LDPC code subjected to the column replacement shown in the expression

(12) is supplied from the column twist deinterleaver 55 to the LDPC decoder 166, and the LDPC decoder 166 does not perform the column replacement shown in the expression (12).

Figure 68:
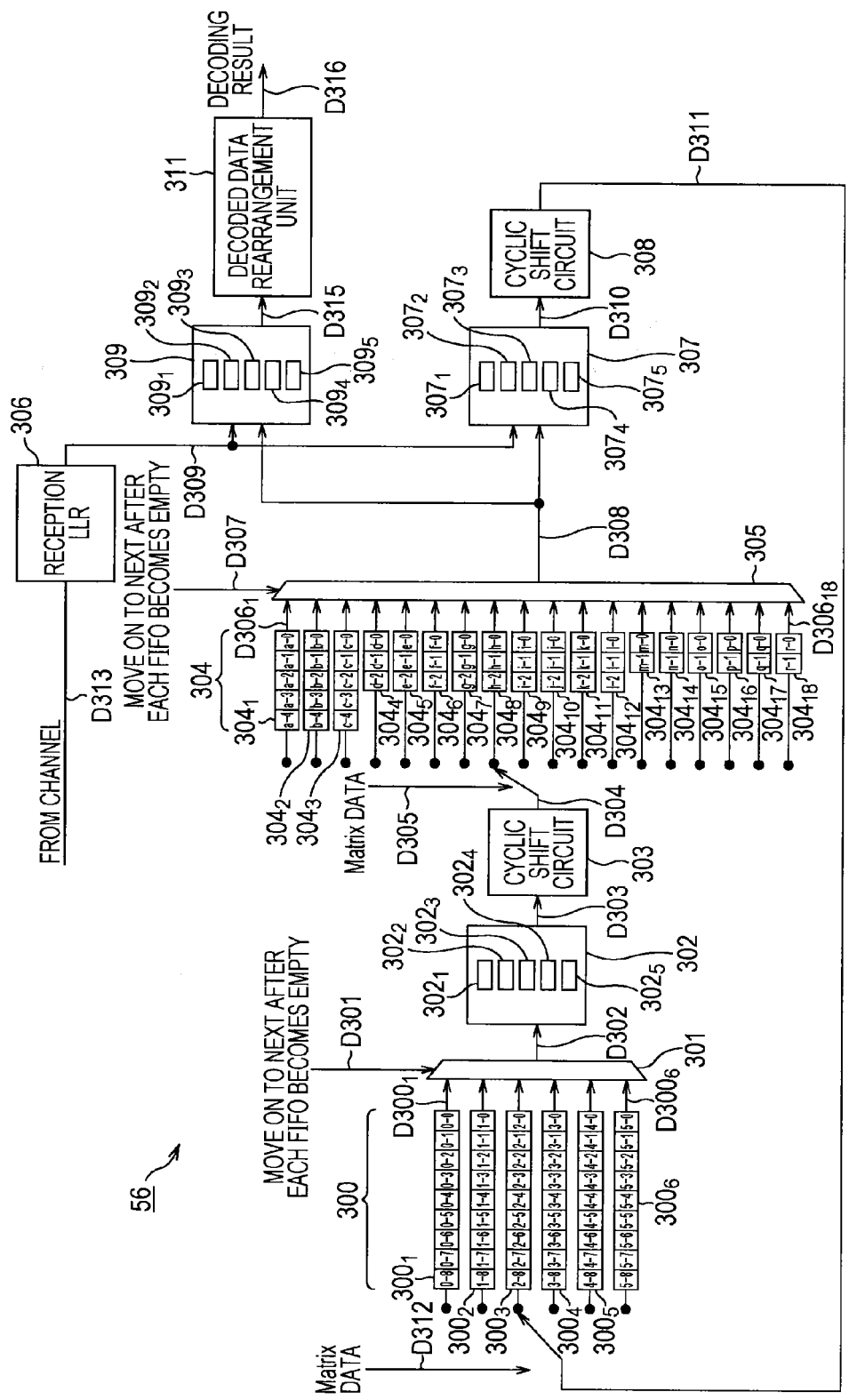
FIG. 68 is a block diagram showing an example structure of the LDPC decoder 166.

FIG. 68 shows an example structure of the LDPC decoder 166 shown in FIG. 61.

In FIG. 68, the LDPC decoder 166 has the same structure as the decoding device shown in FIG. 67, except that the received data rearrangement unit 310 shown in FIG. 67 is not provided. The LDPC decoder 166 performs the same operation as the decoding device shown in FIG. 67, except for not performing the column replacement shown in the expression (12). Therefore, explanation of them is not repeated herein.

Not requiring the received data rearrangement unit 310 as described above, the LDPC decoder 166 can be made smaller in size than the decoding device shown in FIG. 67.

In FIGS. 64 through 68, the code length N of each LDPC code is 90, the information length K is 60, the unit column number (the number of rows and the number of columns in each constitutive matrix) P in the cyclic structure is 5, and the divisor q (=M/P) of the parity length M is 6, for ease of explanation. However, the code length N, the information length K, the unit column number P in the cyclic structure, and the divisor q (=M/P) are not limited to the above mentioned respective values.

Specifically, in the transmission device 11 shown in FIG. 8, the LDPC encoder 115 outputs an LDPC code in which the code length N is 64800, 16200, or the like, the information length K is N−Pq (=N−M), the unit column number P in the cyclic structure is 360, and the divisor q is M/P. The LDPC decoder 166 shown in FIG. 68 can also be used when performing LDPC decoding on such an LDPC code by simultaneously performing P check node calculations and P variable node calculations.

Figure 69:
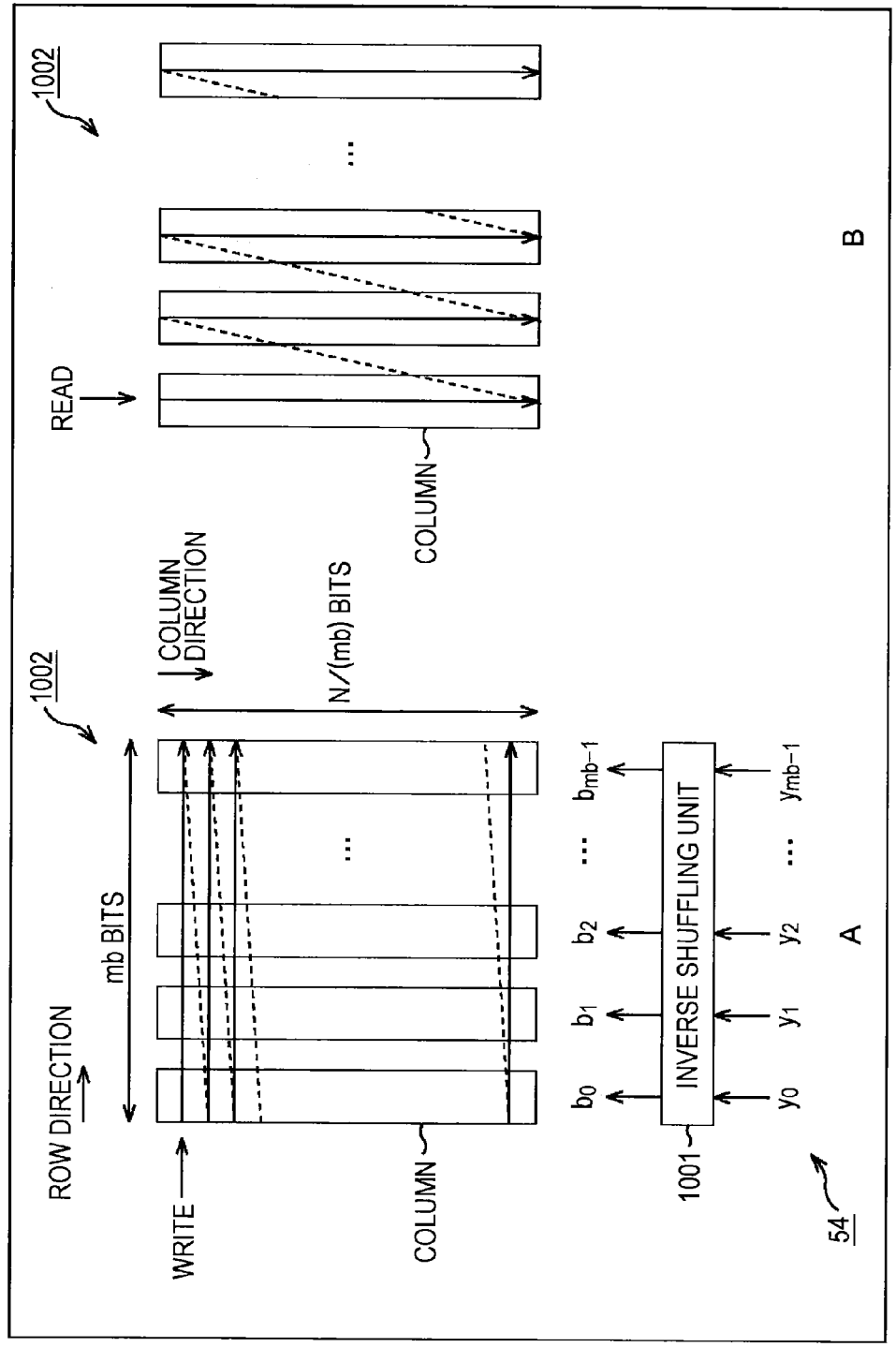
FIG. 69 is a diagram for explaining the operation of a multiplexer 54 of the bit deinterleaver 165.

FIG. 69 is a diagram for explaining the operation of the multiplexer 54 of the bit deinterleaver 165 shown in FIG. 62.

Specifically, A of FIG. 69 shows an example functional structure of the multiplexer 54.

The multiplexer 54 includes an inverse shuffling unit 1001 and a memory 1002.

The multiplexer 54 performs an inverse shuffling operation corresponding to the shuffling operation performed by the demultiplexer 25 of the transmission device 11 (the opposite operation of the shuffling operation) on the symbol bits of the symbols supplied from the QAM decoder 164 in the previous stage, or performs an inverse shuffling operation to return the sign bits (symbol bits) of an LDPC code shuffled by the shuffling operation to the original positions. The resultant LDPC code is supplied to the column twist deinterleaver 55 in the next stage.

Specifically, in the multiplexer 54, b (successive) symbols are set as a unit, and the symbol bits $y_0, y_1, \ldots,$ and $y_{mb-1}$ of mb bits of the b symbols are supplied to the inverse shuffling unit 1001.

The inverse shuffling unit 1001 performs inverse shuffling to return the symbol bits $y_0$ through $y_{mb-1}$ of the mb bits to the sequence of the sign bits $b_0, b_1, \ldots,$ and $b_{mb-1}$ of the original mb bits (the sequence of the sign bits $b_0$ through $b_{mb-1}$ seen prior to the shuffling at the shuffling unit 32 of the demultiplexer 25 in the transmission device 11). The resultant sign bits $b_0$ through $b_{mb-1}$ of the mb bits are then output.

Like the memory 31 of the demultiplexer 25 in the transmission device 11, the memory 1002 has a storage capacity to store mb bits in the row (horizontal) direction and N/(mb) bits in the column (vertical) direction. That is, the memory 1002 is formed with mb columns to store N/(mb) bits.

In the memory 1002, the sign bits of an LDPC code output from the inverse shuffling unit 1001 are written in the direction in which sign bits are read from the memory 31 of the demultiplexer 25 in the transmission device 11, and the sign bits written in the memory 1002 are read in the direction in which sign bits are written into the memory 31.

Specifically, in the multiplexer 54 of the reception device 12, writing of the sign bits of an LDPC code output from the inverse shuffling unit 1001 in the row direction by mb bits is started in the first row in the memory 1002, and is sequentially performed in the lower rows, as shown in A of FIG. 69.

When the writing of the sign bits equivalent to the length of one code is completed, the multiplexer 54 reads the sign bits from the memory 1002 in the column direction, and supplies the sign bits to the column twist deinterleaver 55 in the next stage.

B of FIG. 69 is a diagram showing reading of the sign bits from the memory 1002.

In the multiplexer 54, reading of the sign bits of an LDPC code in the direction from the top toward the bottom (in the column direction) of the columns forming the memory 1002 is performed on the columns in the direction from left to right.

Figure 70:
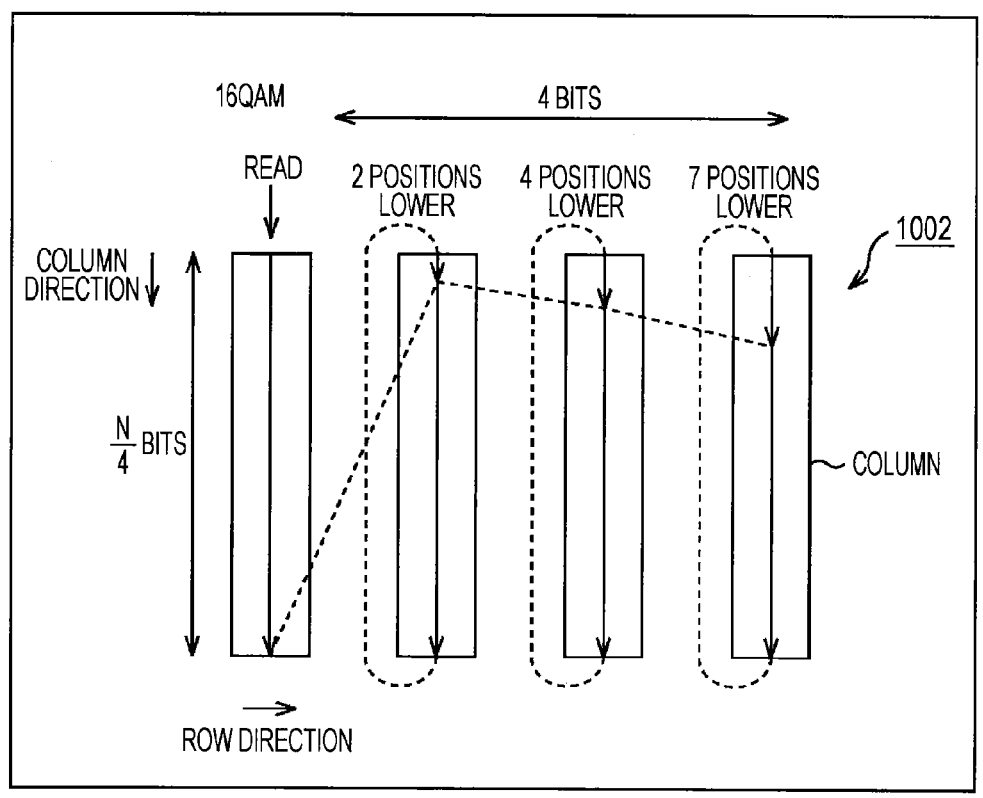
FIG. 70 is a diagram for explaining the operation of a column twist deinterleaver 55.

FIG. 70 is a diagram for explaining the operation of the column twist deinterleaver 55 of the bit deinterleaver 165 shown in FIG. 62.

Specifically, FIG. 70 shows an example structure of the memory 1002 of the multiplexer 54.

The memory 1002 has a storage capacity to store mb bits in the column (vertical) direction and N/(mb) bits in the row (horizontal) direction, and is formed with mb columns.

The column twist deinterleaver 55 performs column twist deinterleaving on the memory 1002 by writing the sign bits of an LDPC code in the row direction and controlling the read start positions in which the sign bits are read in the column direction.

Specifically, the column twist deinterleaver 55 performs an inverse rearrangement operation to return the sequence of sign bits rearranged by the column twist interleaving to the original sequence, by appropriately varying the read start positions in which reading of sign bits is started among the columns.

Here, FIG. 70 shows an example structure of the memory 1002 in a case where the modulation method is 16QAM, and the multiple number b is 1 as described above with reference to FIG. 24. Accordingly, the number m of bits in one symbol is 4, and the memory 1002 is formed with four (=mb) columns.

Instead of the multiplexer 54, the column twist deinterleaver 55 performs writing of the sign bits of an LDPC code output from the shuffling unit 1001 in the row direction, starting from the first row toward the lower rows in the memory 1002.

After completing the writing of sign bits equivalent to the length of one code, the column twist deinterleaver 55 performs reading of the sign bits in the direction from the top toward the bottom of the memory 1002 (in the column direction), on the columns in the direction from left to right.

The column twist deinterleaver 55 starts reading sign bits from the memory 1002 in the sign bit read start positions that are the write start positions in which the column twist interleaver 24 in the transmission device 11 starts writing sign bits.

Specifically, where the address of the top position (the uppermost position) in each column is 0, the addresses of the respective positions in the column direction are represented by integers in ascending order, the modulation method is 16QAM, and the multiple number b is 1, the column twist deinterleaver 55 sets the read start position in the position at the address 0 in the leftmost column, sets the read start position in the position at the address 2 in the second column (from the left), sets the read start position in the position at the address 4 in the third column, and sets the read start position in the position at the address 7 in the fourth column.

In each column in which the read start position is not the position at the address 0, the reading operation returns to the top (the position at the address 0) after the sign bit reading has been performed in the lowermost position, and the reading is then continued until reaching the position immediately before the read start position. After that, the reading is performed on the next (right) column.

As the above described column twist deinterleaving is performed, the sequence of sign bits rearranged by the column twist interleaving is returned to the original sequence.

Figure 71:
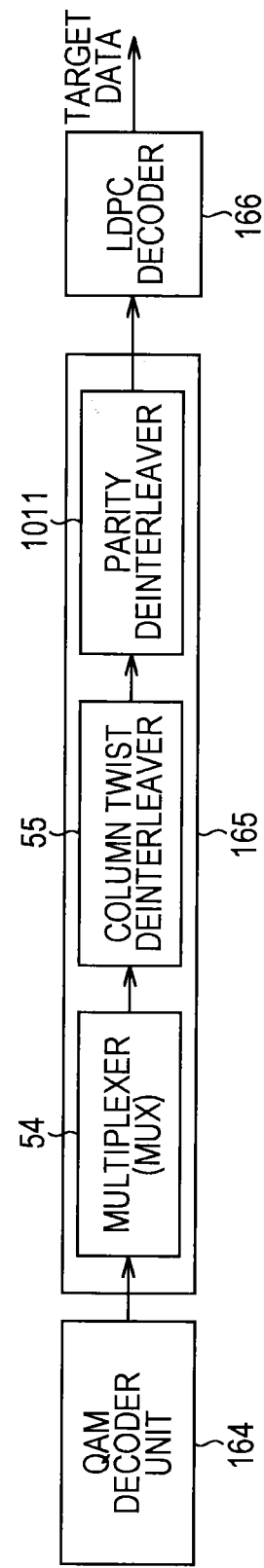
FIG. 71 is a block diagram showing another example structure of the bit deinterleaver 165.

FIG. 71 is a block diagram showing another example structure of the bit deinterleaver 165 shown in FIG. 61.

In the drawing, the components equivalent to those in FIG. 62 are denoted by the same reference numerals as those used in FIG. 62, and explanation thereof is not repeated herein.

Specifically, the bit deinterleaver 165 shown in FIG. 71 has the same structure of that shown in FIG. 62, except that a parity deinterleaver 1011 is added.

In FIG. 71, the bit deinterleaver 165 includes a multiplexer (MUX) 54, a column twist deinterleaver 55, and the parity deinterleaver 1011, and performs bit deinterleaving on the sign bits of an LDPC code supplied from the QAM decoder 164.

Specifically, the multiplexer 54 performs an inverse shuffling operation corresponding to the shuffling operation performed by the demultiplexer 25 of the transmission device 11 (the opposite operation of the shuffling operation) on the LDPC code supplied from the QAM decoder 164, or performs an inverse shuffling operation to return the positions of the sign bits shuffled by the shuffling operation to the original positions. The resultant LDPC code is supplied to the column twist deinterleaver 55.

The column twist deinterleaver 55 performs column twist deinterleaving corresponding to the column twist interleaving as the rearrangement operation performed by the column twist interleaver 24 of the transmission device 11 on the LDPC code supplied from the multiplexer 54.

The LDPC code obtained as a result of the column twist deinterleaving is supplied from the column twist deinterleaver 55 to the parity deinterleaver 1011.

The parity deinterleaver 1011 performs parity deinterleaving corresponding to the parity interleaving performed by the parity interleaver 23 of the transmission device 11 (the opposite operation of the parity interleaving) on the sign bits subjected to the column twist deinterleaving at the column twist deinterleaver 55, or performs parity deinterleaving to return the sequence of the sign bits of the LDPC code shuffled by the parity interleaving to the original sequence.

The LDPC code obtained as a result of the parity deinterleaving is supplied from the parity deinterleaver 1011 to the LDPC decoder 166.

Accordingly, in the bit deinterleaver 165 shown in FIG. 71, an LDPC code subjected to the inverse shuffling operation, the column twist deinterleaving, and the parity deinterleaving, or an LDPC code obtained by performing LDPC encoding in accordance with the parity check matrix H is supplied to the LDPC decoder 166.

The LDPC decoder 166 performs LDPC decoding on the LDPC code supplied from the bit deinterleaver 165 by using parity check matrix H used in the LDPC encoding by the LDPC encoder 115 of the transmission device 11 or a transformed parity check matrix obtained by performing at least column replacement equivalent to the parity interleaving on the parity check matrix H. The resultant data is output as a result of the decoding of the LDPC target data.

In FIG. 71, an LDPC code obtained by performing LDPC encoding in accordance with the parity check matrix H is supplied from (the parity deinterleaver 1011 of) the bit deinterleaver 165 to the LDPC decoder 166. Therefore, in a case where the LDPC decoding of the LDPC code is performed by using the parity check matrix H used in the LDPC encoding by the LDPC encoder 115 of the transmission device 11, the LDPC decoder 166 can be formed with a decoding device that performs LDPC decoding by a full serial decoding method for sequentially calculating messages (check node messages and variable node messages) one node at a time, or a decoding device that performs LDPC decoding by a full parallel decoding method for calculating messages simultaneously (in parallel) for all the nodes.

In a case where the LDPC decoding of the LDPC code is performed at the LDPC decoder 166 using a transformed parity check matrix obtained by performing at least the column replacement equivalent to the parity interleaving on the parity check matrix H used in the LDPC encoding by the LDPC encoder 115 of the transmission device 11, the LDPC decoder 166 is a decoding device of an architecture that simultaneously performs P (or a divisor of P other than 1) check node calculations and P variable node calculations, and can be formed with a decoding device (FIG. 67) that includes the received data rearrangement unit 310 that rearranges the sign bits of the LDPC code by performing the same column replacement as the column replacement for obtaining the transformed parity check matrix on the LDPC code.

In FIG. 71, the multiplexer 54 performing the inverse shuffling operation, the column twist deinterleaver 55 performing the column twist deinterleaving, and the parity deinterleaver 1011 performing the parity deinterleaving are formed separately from one another, for ease of explanation. However, two or more of the multiplexer 54, the column twist deinterleaver 55, and the parity deinterleaver 1011 can be integrally formed, like the parity interleaver 23, the column twist interleaver 24, and the demultiplexer 25 of the transmission device 11.

[Example Structure of a Reception System]

Figure 72:
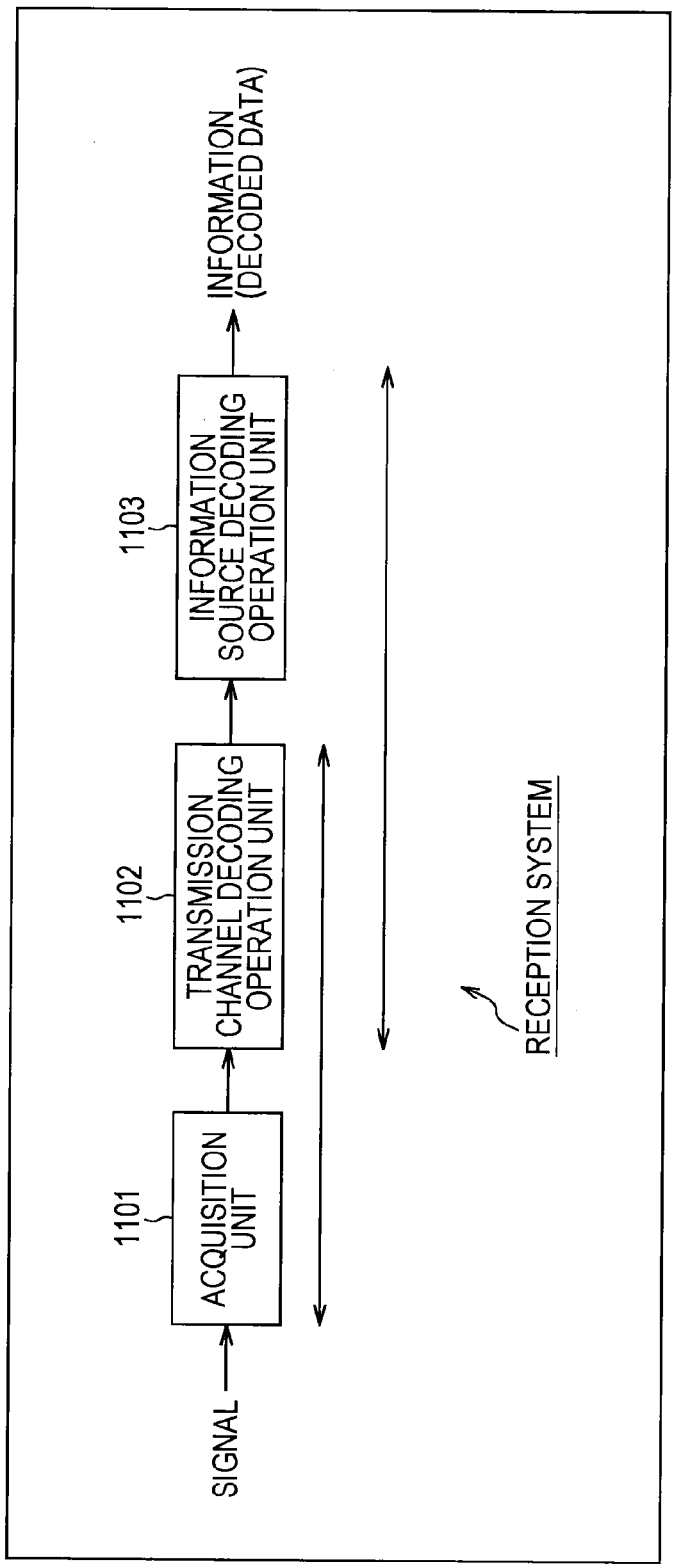
FIG. 72 is a block diagram showing a first example structure of a reception system to which the reception device 12 can be applied.

FIG. 72 is a block diagram showing a first example structure of a reception system to which the reception device 12 can be applied.

In FIG. 72, the reception system includes an acquisition unit 1101, a transmission channel decoding operation unit 1102, and an information source decoding operation unit 1103.

The acquisition unit 1101 acquires a signal containing an LDPC code obtained by performing at least LDPC encoding on LDPC target data such as image data and audio data of a show via a transmission channel (a communication channel) (not shown) of a network such as digital terrestrial broadcasting, digital satellite broadcasting, a CATV network, or the Internet. The signal is then supplied to the transmission channel decoding operation unit 1102.

In a case where the signal to be obtained by the acquisition unit 1101 is broadcast by a broadcast station via ground waves, satellite waves, or a CATV (Cable Television) network, for example, the acquisition unit 1101 is formed with a tuner, a STB (Set Top Box), or the like. In a case where the signal to be acquired by the acquisition unit 1101 is transmitted by multicasting as in IPTV (Internet Protocol Television) from a web server, for example, the acquisition unit 1101 is formed with a network I/F (Interface) such as a NIC (Network Interface Card).

The transmission channel decoding operation unit 1102 is equivalent to the reception device 12. The transmission channel decoding operation unit 1102 performs a transmission channel decoding operation on the signal acquired by the acquisition unit 1101 via a transmission channel. The transmission channel decoding operation includes at least an operation to correct errors that occur in the transmission channel. The resultant signal is supplied to the information source decoding operation unit 1103.

Specifically, the signal acquired by the acquisition unit 1101 via a transmission channel is a signal obtained by performing at least error correction encoding to correct errors that occur in the transmission channel, and the transmission channel decoding operation unit 1102 performs the transmission channel decoding operation such as an error correction operation on the signal.

Here, the error correction encoding may be LDPC encoding or BCH encoding, for example. In this example, at least LDPC encoding is performed as the error correction encoding.

There are cases where the transmission channel decoding operation includes demodulation of a modulated signal or the like.

The information source decoding operation unit 1103 performs an information source decoding operation on the signal subjected to the transmission channel decoding operation. The information source decoding operation includes at least an operation to decompress compressed information into the original information.

Specifically, there are cases where the signal acquired by the acquisition unit 1101 via a transmission channel has been subjected to compression encoding to compress information to reduce the data amount of image and audio data and the like as the information. In such a case, the information source decoding operation unit 1103 performs the information source decoding operation such as an operation to decompress compressed information into the original information (a decompression operation), on the signal subjected to the transmission channel decoding operation.

In a case where the signal acquired by the acquisition unit 1101 via a transmission channel has not been subjected to compression encoding, the information source decoding operation unit 1103 does not perform the operation to decompress compressed information into the original information.

Here, the decompression operation may be MPEG decoding, for example. There are cases where the transmission channel decoding operation includes descrambling and the like as well as the decompression operation.

In the reception system having the above described structure, compression encoding such as MPEG encoding is performed on data such as images and sound at the acquisition unit 1101. Further, the signal subjected to error correction encoding such as LDPC encoding is acquired via a transmission channel, and is supplied to the transmission channel decoding operation unit 1102.

At the transmission channel decoding operation unit 1102, the same operation as that performed by the reception device 12, for example, is performed as a transmission channel decoding operation on the signal supplied from the acquisition unit 1101, and the resultant signal is supplied to the information source decoding operation unit 1103.

At the information source decoding operation unit 1103, an information source decoding operation such as MPEG decoding is performed on the signal supplied from the transmission channel decoding operation unit 1102, and the resultant image or sound is output.

The reception system having the above structure as shown in FIG. 72 can be applied to a television tuner or the like that receives television broadcasts as digital broadcasting.

It should be noted that the acquisition unit 1101, the transmission channel decoding operation unit 1102, and the information source decoding operation unit 1103 can be formed as devices (hardware (IC (Integrated Circuits) or the like) or software modules) independent of one another.

As for the acquisition unit 1101, the transmission channel decoding operation unit 1102, and the information source decoding operation unit 1103, a set of the acquisition unit 1101 and the transmission channel decoding operation unit 1102, a set of the transmission channel decoding operation unit 1102 and the information source decoding operation unit 1103, or a set of the acquisition unit 1101, the transmission channel decoding operation unit 1102, and the information source decoding operation unit 1103 can be formed as a single independent device.

Figure 73:
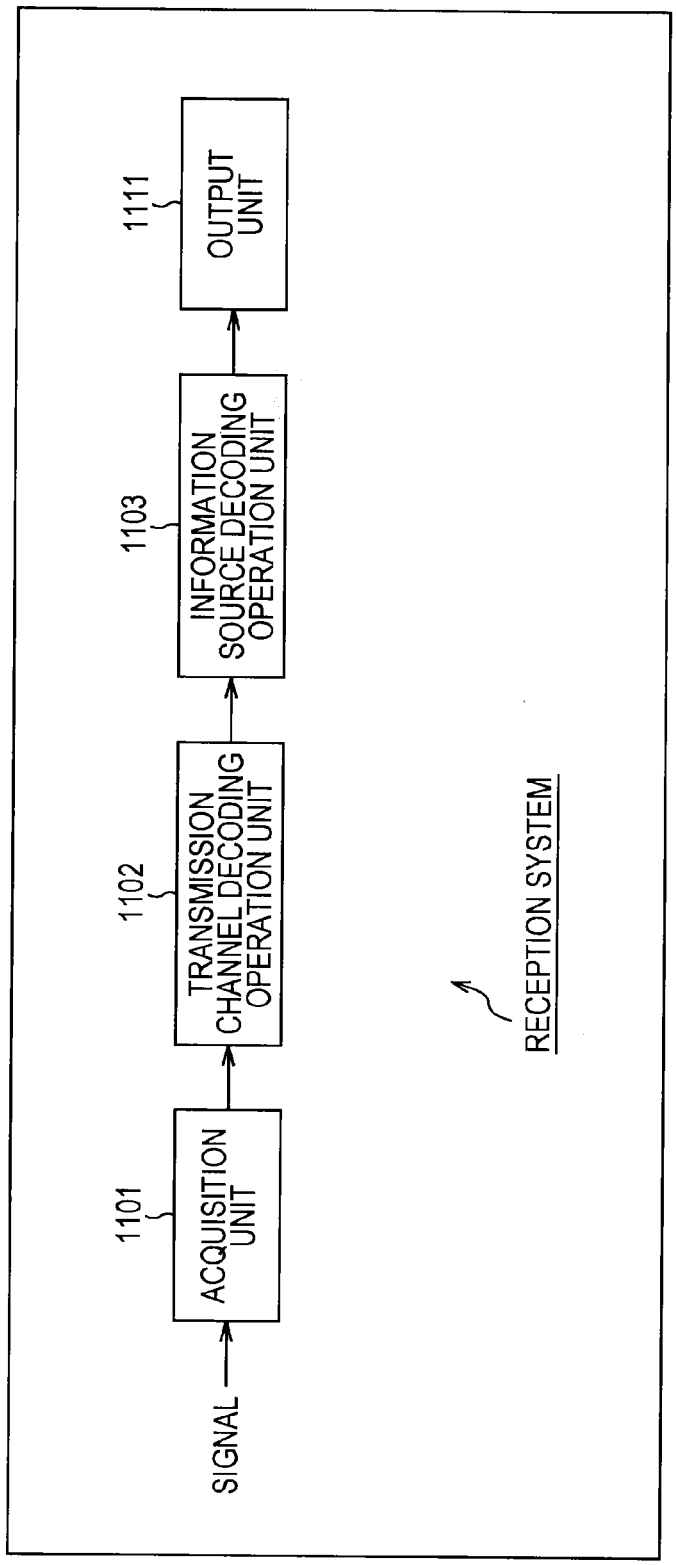
FIG. 73 is a block diagram showing a second example structure of a reception system to which the reception device 12 can be applied.

FIG. 73 is a block diagram showing a second example structure of a reception system to which the reception device 12 can be applied.

In the drawing, the components equivalent to those in FIG. 72 are denoted by the same reference numerals as those used in FIG. 72, and explanation thereof is not repeated herein.

The reception system shown in FIG. 73 is the same as that of FIG. 72 in including the acquisition unit 1101, the transmission channel decoding operation unit 1102, and the information source decoding operation unit 1103, but differs from that of FIG. 72 in further including an output unit 1111.

The output unit 1111 may be a display device that displays images or a speaker that outputs sound, for example, and outputs images or sound as the signal output from the information source decoding operation unit 1103. That is, the output unit 1111 displays images or outputs sound.

The reception system having the above structure as shown in FIG. 73 can be applied to a television set (a television receiver) that receives television broadcasts as digital broadcasting, or to a radio receiver that receives radio broadcasts.

In a case where the signal acquired by the acquisition unit 1101 has not been subjected to compression encoding, the signal output from the transmission channel decoding operation unit 1102 is supplied to the output unit 1111.

Figure 74:
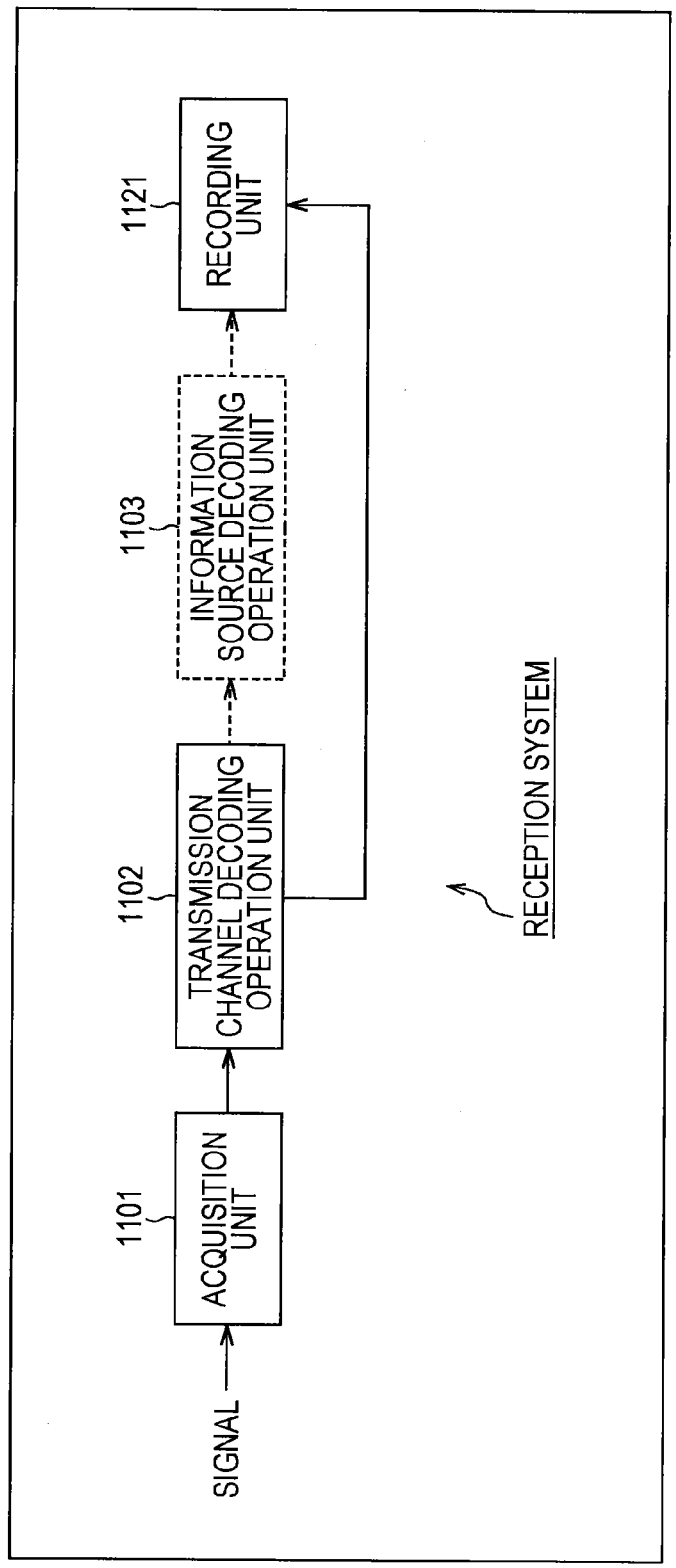
FIG. 74 is a block diagram showing a third example structure of a reception system to which the reception device 12 can be applied.

FIG. 74 is a block diagram showing a third example structure of a reception system to which the reception device 12 can be applied.

In the drawing, the components equivalent to those in FIG. 72 are denoted by the same reference numerals as those used in FIG. 72, and explanation thereof is not repeated herein.

The reception system shown in FIG. 74 is the same as that of FIG. 72 in including the acquisition unit 1101 and the transmission channel decoding operation unit 1102.

However, the reception system shown in FIG. 74 differs from that of FIG. 72 in that the information source decoding operation unit 1103 is not provided but a recording unit 1121 is newly added.

The recording unit 1121 records (stores) the signal (such as a TS packet of TS of MPEG) output from the transmission channel decoding operation unit 1102 on a recording (storage) medium such as an optical disk, a hard disk (a magnetic disk), or a flash memory.

The reception system having the above structure as shown in FIG. 74 can be applied to a recorder that records television broadcasts.

In FIG. 74, the reception system may further include the information source decoding operation unit 1103, and the signal subjected to an information source decoding operation by the information source decoding operation unit 1103, or an image or sound obtained as a result of decoding, can be recorded by the recording unit 1121.

[One Embodiment of Computer]

The above described series of operations can be performed with hardware, and can also be performed with software. Where the series of operations are performed with software, the program that forms the software is installed into a general-purpose computer or the like.

Figure 75:
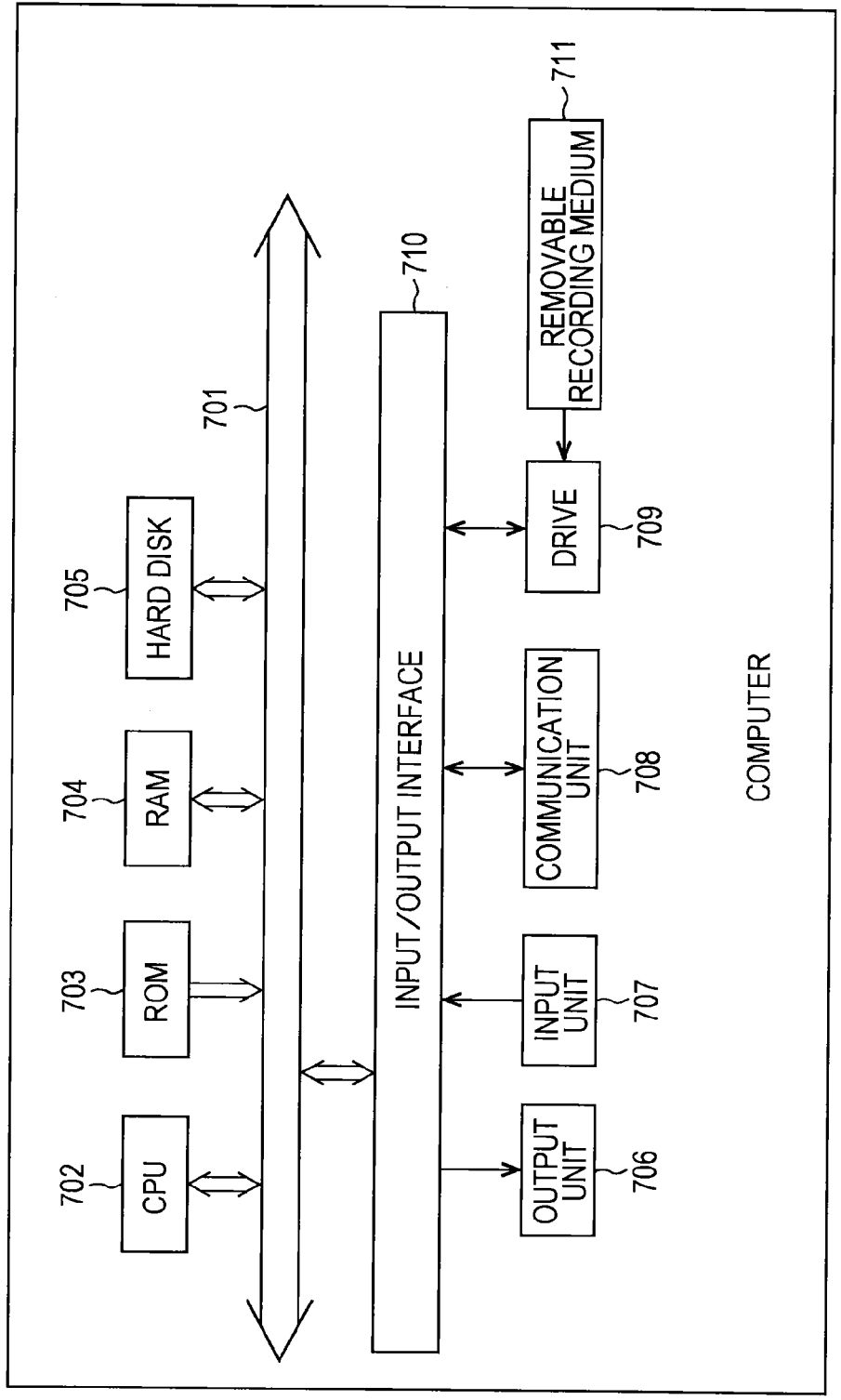
FIG. 75 is a block diagram showing an example structure of an embodiment of a computer to which the present technique is applied.

FIG. 75 shows an example structure of an embodiment of a computer into which the program for performing the above described series of operations is installed.

The program can be recorded beforehand in a hard disk 705 or a ROM 703 provided as a recording medium in the computer.

Alternatively, the program can be temporarily or permanently stored (recorded) in a removable recording medium 711 such as a flexible disk, a CD-ROM (Compact Disc Read Only Memory), an MO (Magneto Optical) disk, a DVD (Digital Versatile Disc), a magnetic disk, or a semiconductor memory. Such a removable recording medium 711 can be provided as so-called packaged software.

Instead of being installed from the above described removable recording medium 711 into the computer, the program can be wirelessly transferred from a download site to the computer via an artificial satellite for digital satellite broadcasting, or be transferred through a cable to the computer via a network such as a LAN (Local Area Network) or the Internet. In the computer, a communication unit 708 receives the program transferred in such a manner, and the program can be installed into an internal hard disk 705.

The computer includes a CPU (Central Processing Unit) 702. An input/output interface 710 is connected to the CPU 702 via a bus 701, and, when an instruction is input by a user operating an input unit 707 formed with a keyboard, a mouse, a microphone, or the like via the input/output interface 710, the CPU 702 executes a program stored in the ROM (Read Only Memory) 703 in accordance with the instruction. Alternatively, the CPU 702 loads a program that is stored in the hard disk 705, a program that is transferred from a satellite or a network, is received by the communication unit 708, and is installed into the hard disk 705, or a program that is read from the removable recording medium 711 mounted on a drive 709 and is installed into the hard disk 705, into a RAM (Random Access Memory) 704, and then executes the program. By doing so, the CPU 702 performs the operations according to the above described flowcharts, or performs the operations using the structures illustrated in the above described block diagrams. Where necessary, the CPU 702 outputs the operation results from an output unit 706 formed with an LCD (Liquid Crystal Display) or a speaker or the like, or transmits the operation results from the communication unit 708, via the input/output interface 710, for example, and further stores the operation results into the hard disk 705.

In this specification, the processing steps written in the program for causing a computer to perform various operations are not necessarily carried out in chronological order in accordance with the sequence described as the flowcharts, but include procedures to be carried out in parallel or independently of one another (such as parallel procedures or object-based procedures).

The program may be executed by one computer, or may be executed in a distributive manner by more than one computer. Further, the program may be transferred to a remote computer, and be executed therein.

It should be noted that embodiments of the present technique are not limited to the above described embodiments, and various modifications may be made to them without departing from the scope of the present technique.

That is, the above described (the check matrix initial value tables of) LDPC codes and the like to be used in digital broadcasting for portable terminals can be used in digital broadcasting for fixed terminals.

The present technique may also be embodied in the structures described below.

[1]

A data processing device including:

an encoding unit that performs LDPC encoding to generate an LDPC code having a code length of 16200 bits and a code rate of 8/15 based on a parity check matrix for LDPC codes; and a shuffling unit that replaces sign bits of the LDPC code encoded by the encoding unit with symbol bits of a symbol corresponding to one of 256 signal points defined by 256QAM, the LDPC code encoded by the encoding unit including information bits and parity bits, the parity check matrix including an information matrix portion corresponding to the information bits and a parity matrix portion corresponding to the parity bits, the information matrix portion being represented by a check matrix initial value table, the check matrix initial value table being a table that shows positions of elements "1" of the information matrix portion at intervals of 360 columns, and contains 32 384 430 591 1296 1976 1999 2137 2175 3638 4214 4304 4486 4662 4999 5174 5700 6969 7115 7138 7189

1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 6640 6762 6786 6859 7043 7418 7431 7554

14 178 675 823 890 930 1209 1311 2898 4339 4600 5203 6485 6549 6970 7208 7218 7298 7454 7457 7462

4075 4188 7313 7553

5145 6018 7148 7507

3198 4858 6983 7033

3170 5126 5625 6901

2839 6093 7071 7450

11 3735 5413

2497 5400 7238

2067 5172 5714

1889 7173 7329

1795 2773 3499

2695 2944 6735

321 4625 5897

1690 6122 6816

5013 6839 7358

1601 6849 7415

2180 7389 7543

2121 6838 7054

1948 3109 5046

272 1015 7464 the shuffling unit replacing a bit b0 with a bit y2, a bit b1 with a bit y6, a bit b2 with a bit y1, a bit b3 with a bit y0, a bit b4 with a bit y7, a bit b5 with a bit y5, a bit b6 with a bit y3, and a bit b7 with a bit y4, where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i.

[2]

A data processing method including:
an encoding step of performing LDPC encoding to generate an LDPC code having a code length of 16200 bits and a code rate of 8/15 based on a parity check matrix for LDPC codes; and
a shuffling step of replacing sign bits of the LDPC code encoded in the encoding step with symbol bits of a symbol corresponding to one of 256 signal points defined by 256QAM,
the LDPC code encoded in the encoding step including information bits and parity bits,
the parity check matrix including an information matrix portion corresponding to the information bits and a parity matrix portion corresponding to the parity bits,
the information matrix portion being represented by a check matrix initial value table,
the check matrix initial value table being a table that shows positions of elements "1" of the information matrix portion at intervals of 360 columns, and contains 32 384 430 591 1296 1976 1999 2137 2175 3638 4214 4304 4486 4662 4999 5174 5700 6969 7115 7138 7189
   1788 1881 1910 2724 4504 4928 4973 5616 5686 5718 5846 6523 6893 6994 7074 7100 7277 7399 7476 7480 7537
   2791 2824 2927 4196 4298 4800 4948 5361 5401 5688 5818 5862 5969 6029 6244 6645 6962 7203 7302 7454 7534
   574 1461 1826 2056 2069 2387 2794 3349 3366 4951 5826 5834 5903 6640 6762 6786 6859 7043 7418 7431 7554
   14 178 675 823 890 930 1209 1311 2898 4339 4600 5203 6485 6549 6970 7208 7218 7298 7454 7457 7462
   4075 4188 7313 7553
   5145 6018 7148 7507
   3198 4858 6983 7033
   3170 5126 5625 6901
   2839 6093 7071 7450
   11 3735 5413
   2497 5400 7238
   2067 5172 5714
   1889 7173 7329
   1795 2773 3499
   2695 2944 6735
   3221 4625 5897
   1690 6122 6816
   5013 6839 7358
   1601 6849 7415
   2180 7389 7543
   2121 6838 7054
   1948 3109 5046
   272 1015 7464 the shuffling step including replacing
a bit b0 with a bit y2,
a bit b1 with a bit y6,
a bit b2 with a bit y1,
a bit b3 with a bit y0,
a bit b4 with a bit y7,
a bit b5 with a bit y5,
a bit b6 with a bit y3, and
a bit b7 with a bit y4,
where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i.

[3]

A data processing device including:
an inverse shuffling unit that replaces symbol bits of a symbol corresponding to one of 256 signal points defined by 256QAM with sign bits of an LDPC code having a code length of 16200 bits and a code rate of 8/15; and
a decoding unit that decodes the LDPC code based on a parity check matrix for LDPC codes after the LDPC code is shuffled by the inverse shuffling unit,
the inverse shuffling unit replacing
a bit y2 with a bit b0,
a bit y6 with a bit b1,
a bit y1 with a bit b2,
a bit y0 with a bit b3,
a bit y7 with a bit b4,
a bit y5 with a bit b5,
a bit y3 with a bit b6, and
a bit y4 with a bit b7,
where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i,
the LDPC code including information bits and parity bits,
the parity check matrix including an information matrix portion corresponding to the information bits and a parity matrix portion corresponding to the parity bits,
the information matrix portion being represented by a check matrix initial value table,
the check matrix initial value table being a table that shows positions of elements "1" of the information matrix portion at intervals of 360 columns, and contains 32 384 430 591 1296 1976 1999 2137 2175 3638 4214 4304 4486 4662 4999 5174 5700 6969 7115 7138 7189
   1788 1881 1910 2724 4504 4928 4973 5616 5686 5718 5846 6523 6893 6994 7074 7100 7277 7399 7476 7480 7537
   2791 2824 2927 4196 4298 4800 4948 5361 5401 5688 5818 5862 5969 6029 6244 6645 6962 7203 7302 7454 7534
   574 1461 1826 2056 2069 2387 2794 3349 3366 4951 5826 5834 5903 6640 6762 6786 6859 7043 7418 7431 7554
   14 178 675 823 890 930 1209 1311 2898 4339 4600 5203 6485 6549 6970 7208 7218 7298 7454 7457 7462
   4075 4188 7313 7553
   5145 6018 7148 7507
   3198 4858 6983 7033
   3170 5126 5625 6901
   2839 6093 7071 7450
   11 3735 5413
   2497 5400 7238
   2067 5172 5714
   1889 7173 7329
   1795 2773 3499
   2695 2944 6735
   3221 4625 5897
   1690 6122 6816
   5013 6839 7358
   1601 6849 7415
   2180 7389 7543
   2121 6838 7054
   1948 3109 5046
   272 1015 7464.

[4]
A data processing method including:
an inverse shuffling step of replacing symbol bits of a symbol corresponding to one of 256 signal points defined by 256QAM with sign bits of an LDPC code having a code length of 16200 bits and a code rate of 8/15; and
a decoding step of decoding the LDPC code based on a parity check matrix for LDPC codes after the LDPC code is shuffled in the inverse shuffling step,
the inverse shuffling step including replacing
a bit y2 with a bit b0,
a bit y6 with a bit b1,
a bit y1 with a bit b2,
a bit y0 with a bit b3,
a bit y7 with a bit b4,
a bit y5 with a bit b5,
a bit y3 with a bit b6, and
a bit y4 with a bit b7,
where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i,
the LDPC code including information bits and parity bits,
the parity check matrix including an information matrix portion corresponding to the information bits and a parity matrix portion corresponding to the parity bits,
the information matrix portion being represented by a check matrix initial value table,
the check matrix initial value table being a table that shows positions of elements "1" of the information matrix portion at intervals of 360 columns, and contains
32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

[5]
A data processing device including:
an encoding unit that performs LDPC encoding to generate an LDPC code having a code length of 16200 bits and a code rate of 4/15 based on a parity check matrix for LDPC codes; and
a shuffling unit that replaces sign bits of the LDPC code encoded by the encoding unit with symbol bits of a symbol corresponding to one of 256 signal points defined by 256QAM,
the LDPC code encoded by the encoding unit including information bits and parity bits,
the parity check matrix including an information matrix portion corresponding to the information bits and a parity matrix portion corresponding to the parity bits,
the information matrix portion being represented by a check matrix initial value table,
the check matrix initial value table being a table that shows positions of elements "1" of the information matrix portion at intervals of 360 columns, and contains
1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480
the shuffling unit replacing
a bit b0 with a bit y4,
a bit b1 with a bit y0,
a bit b2 with a bit y6,
a bit b3 with a bit y1,
a bit b4 with a bit y3,
a bit b5 with a bit y7,
a bit b6 with a bit y5, and
a bit b7 with a bit y2,
where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i.

[6]
A data processing method including:
an encoding step of performing LDPC encoding to generate an LDPC code having a code length of 16200 bits and a code rate of 4/15 based on a parity check matrix for LDPC codes; and
a shuffling step of replacing sign bits of the LDPC code encoded in the encoding step with symbol bits of a symbol corresponding to one of 256 signal points defined by 256QAM,
the LDPC code encoded in the encoding step including information bits and parity bits, the parity check matrix including an information matrix portion corresponding to the information bits and a parity matrix portion corresponding to the parity bits, the information matrix portion being represented by a check matrix initial value table, the check matrix initial value table being a table that shows positions of elements "1" of the information matrix portion at intervals of 360 columns, and contains 1953 2331 2545 2623 4653 5012 5700 6458 6875 7605 7694 7881 8416 8758 9181 9555 9578 9932 10068 11479 11699

514 784 2059 2129 2386 2454 3396 5184 6624 6825 7533 7861 9116 9473 9601 10432 11011 11159 11378 11528 11598

483 1303 1735 2291 3302 3648 4222 4522 5511 6626 6804 7404 7752 7982 8108 8930 9151 9793 9876 10786 11879

1956 7572 9020 9971

13 1578 7445 8373

6805 6857 8615 11179

7983 8022 10017 11748

4939 8861 10444 11661

2278 3733 6265 10009

4494 7974 10649

8909 11030 11696

3131 9964 10480.

the shuffling step including replacing a bit b0 with a bit y4,
a bit b1 with a bit y0,
a bit b2 with a bit y6,
a bit b3 with a bit y1,
a bit b4 with a bit y3,
a bit b5 with a bit y7,
a bit b6 with a bit y5, and
a bit b7 with a bit y2, where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i.

[7]
A data processing device including:

an inverse shuffling unit that replaces symbol bits of a symbol corresponding to one of 256 signal points defined by 256QAM with sign bits of an LDPC code having a code length of 16200 bits and a code rate of 4/15; and a decoding unit that decodes the LDPC code based on a parity check matrix for LDPC codes after the LDPC code is shuffled by the inverse shuffling unit, the inverse shuffling unit replacing a bit y4 with a bit b0,
a bit y0 with a bit b1,
a bit y6 with a bit b2,
a bit y1 with a bit b3,
a bit y3 with a bit b4,
a bit y7 with a bit b5,
a bit y5 with a bit b6, and
a bit y2 with a bit b7, where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i, the LDPC code including information bits and parity bits, the parity check matrix including an information matrix portion corresponding to the information bits and a parity matrix portion corresponding to the parity bits, the information matrix portion being represented by a check matrix initial value table, the check matrix initial value table being a table that shows positions of elements "1" of the information matrix portion at intervals of 360 columns, and contains 1953 2331 2545 2623 4653 5012 5700 6458 6875 7605 7694 7881 8416 8758 9181 9555 9578 9932 10068 11479 11699

514 784 2059 2129 2386 2454 3396 5184 6624 6825 7533 7861 9116 9473 9601 10432 11011 11159 11378 11528 11598

483 1303 1735 2291 3302 3648 4222 4522 5511 6626 6804 7404 7752 7982 8108 8930 9151 9793 9876 10786 11879

1956 7572 9020 9971

13 1578 7445 8373

6805 6857 8615 11179

7983 8022 10017 11748

4939 8861 10444 11661

2278 3733 6265 10009

4494 7974 10649

8909 11030 11696

3131 9964 10480.

[8]
A data processing method including:

an inverse shuffling step of replacing symbol bits of a symbol corresponding to one of 256 signal points defined by 256QAM with sign bits of an LDPC code having a code length of 16200 bits and a code rate of 4/15; and a decoding step of decoding the LDPC code based on a parity check matrix for LDPC codes after the LDPC code is shuffled in the inverse shuffling step, the inverse shuffling step including replacing a bit y4 with a bit b0,
a bit y0 with a bit b1,
a bit y6 with a bit b2,
a bit y1 with a bit b3,
a bit y3 with a bit b4,
a bit y7 with a bit b5,
a bit y5 with a bit b6, and
a bit y2 with a bit b7, where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i, the LDPC code including information bits and parity bits, the parity check matrix including an information matrix portion corresponding to the information bits and a parity matrix portion corresponding to the parity bits, the information matrix portion being represented by a check matrix initial value table, the check matrix initial value table being a table that shows positions of elements "1" of the information matrix portion at intervals of 360 columns, and contains 1953 2331 2545 2623 4653 5012 5700 6458 6875 7605 7694 7881 8416 8758 9181 9555 9578 9932 10068 11479 11699

514 784 2059 2129 2386 2454 3396 5184 6624 6825 7533 7861 9116 9473 9601 10432 11011 11159 11378 11528 11598

483 1303 1735 2291 3302 3648 4222 4522 5511 6626 6804 7404 7752 7982 8108 8930 9151 9793 9876 10786 11879

1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480.

[9]

A data processing device including:

an encoding unit that performs LDPC encoding to generate an LDPC code having a code length of 16200 bits and a code rate of 7/15 based on a parity check matrix for LDPC codes; and a shuffling unit that replaces sign bits of the LDPC code encoded by the encoding unit with symbol bits of a symbol corresponding to one of 256 signal points defined by 256QAM, the LDPC code encoded by the encoding unit including information bits and parity bits, the parity check matrix including an information matrix portion corresponding to the information bits and a parity matrix portion corresponding to the parity bits, the information matrix portion being represented by a check matrix initial value table, the check matrix initial value table being a table that shows positions of elements "1" of the information matrix portion at intervals of 360 columns, and contains 3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
  56 1955 3000 8242
  1809 4094 7991 8489
  2220 6455 7849 8548
  1006 2576 3247 6976
  2177 6048 7795 8295
  1413 2595 7446 8594
  2101 3714 7541 8531
  10 5961 7484
  3144 4636 5282
  5708 5875 8390
  3322 5223 7975
  197 4653 8283
  598 5393 8624
  906 7249 7542
  1223 2148 8195
  976 2001 5005 the shuffling unit replacing
a bit b0 with a bit y2,
a bit b1 with a bit y6,
a bit b2 with a bit y4,
a bit b3 with a bit y1,
a bit b4 with a bit y5,
a bit b5 with a bit y0,
a bit b6 with a bit y7, and
a bit b7 with a bit y3, where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i.

[10]

A data processing method including:

an encoding step of performing LDPC encoding to generate an LDPC code having a code length of 16200 bits and a code rate of 7/15 based on a parity check matrix for LDPC codes; and a shuffling step of replacing sign bits of the LDPC code encoded in the encoding step with symbol bits of a symbol corresponding to one of 256 signal points defined by 256QAM, the LDPC code encoded in the encoding step including information bits and parity bits, the parity check matrix including an information matrix portion corresponding to the information bits and a parity matrix portion corresponding to the parity bits, the information matrix portion being represented by a check matrix initial value table, the check matrix initial value table being a table that shows positions of elements "1" of the information matrix portion at intervals of 360 columns, and contains 3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
  56 1955 3000 8242
  1809 4094 7991 8489
  2220 6455 7849 8548
  1006 2576 3247 6976
  2177 6048 7795 8295
  1413 2595 7446 8594
  2101 3714 7541 8531
  10 5961 7484
  3144 4636 5282
  5708 5875 8390
  3322 5223 7975
  197 4653 8283
  598 5393 8624
  906 7249 7542
  1223 2148 8195
  976 2001 5005 the shuffling step including replacing
a bit b0 with a bit y2,
a bit b1 with a bit y6,
a bit b2 with a bit y4,
a bit b3 with a bit y1,
a bit b4 with a bit y5,
a bit b5 with a bit y0,
a bit b6 with a bit y7, and
a bit b7 with a bit y3, where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i.

[11]

A data processing device including:

an inverse shuffling unit that replaces symbol bits of a symbol corresponding to one of 256 signal points defined by 256QAM with sign bits of an LDPC code having a code length of 16200 bits and a code rate of 7/15; and a decoding unit that decodes the LDPC code based on a parity check matrix for LDPC codes after the LDPC code is shuffled by the inverse shuffling unit, the inverse shuffling unit replacing a bit y2 with a bit b0,
a bit y6 with a bit b1,
a bit y4 with a bit b2,
a bit y1 with a bit b3,
a bit y5 with a bit b4,
a bit y0 with a bit b5,
a bit y7 with a bit b6, and
a bit y3 with a bit b7, where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i, the LDPC code including information bits and parity bits, the parity check matrix including an information matrix portion corresponding to the information bits and a parity matrix portion corresponding to the parity bits, the information matrix portion being represented by a check matrix initial value table, the check matrix initial value table being a table that shows positions of elements "1" of the information matrix portion at intervals of 360 columns, and contains 3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
   56 1955 3000 8242
   1809 4094 7991 8489
   2220 6455 7849 8548
   1006 2576 3247 6976
   2177 6048 7795 8295
   1413 2595 7446 8594
   2101 3714 7541 8531
   10 5961 7484
   3144 4636 5282
   5708 5875 8390
   3322 5223 7975
   197 4653 8283
   598 5393 8624
   906 7249 7542
   1223 2148 8195
   976 2001 5005.

[12]

A data processing method including:

an inverse shuffling step of replacing symbol bits of a symbol corresponding to one of 256 signal points defined by 256QAM with sign bits of an LDPC code having a code length of 16200 bits and a code rate of 7/15; and a decoding step of decoding the LDPC code based on a parity check matrix for LDPC codes after the LDPC code is shuffled in the inverse shuffling step, the inverse shuffling step including replacing a bit y2 with a bit b0,
a bit y6 with a bit b1,
a bit y4 with a bit b2,
a bit y1 with a bit b3,
a bit y5 with a bit b4,
a bit y0 with a bit b5,
a bit y7 with a bit b6, and
a bit y3 with a bit b7, where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i, the LDPC code including information bits and parity bits, the parity check matrix including an information matrix portion corresponding to the information bits and a parity matrix portion corresponding to the parity bits, the information matrix portion being represented by a check matrix initial value table, the check matrix initial value table being a table that shows positions of elements "1" of the information matrix portion at intervals of 360 columns, and contains 3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
   56 1955 3000 8242
   1809 4094 7991 8489
   2220 6455 7849 8548
   1006 2576 3247 6976
   2177 6048 7795 8295
   1413 2595 7446 8594
   2101 3714 7541 8531
   10 5961 7484
   3144 4636 5282
   5708 5875 8390
   3322 5223 7975
   197 4653 8283
   598 5393 8624
   906 7249 7542
   1223 2148 8195
   976 2001 5005.

REFERENCE SIGNS LIST

11 Transmission device, 12 Reception device, 23 Parity interleaver, 24 Column twist interleaver, 25 Demultiplexer, 31 Memory, 32 Shuffling unit, 54 Multiplexer, 55 Column twist interleaver, 111 Mode adaptation/multiplexer unit, 112 Padder, 113 BB scrambler, 114 BCH encoder, 115 LDPC encoder, 116 Bit interleaver, 117 QAM encoder, 118 Time interleaver, 119 MISO/MIMO encoder, 120 Frequency interleaver, 121 BCH encoder, 122 LDPC encoder, 123 QAM encoder, 124 Frequency interleaver, 131 Frame builder/resource allocation unit, 132 OFDM generation unit, 151 OFDM operation unit, 152 Frame management unit, 153 Frequency deinterleaver, 154 QAM decoder, 155 LDPC decoder, 156 BCH decoder, 161 Frequency deinterleaver, 162 MISO/MIMO decoder, 163 Time deinterleaver, 164 QAM decoder, 165 Bit deinterleaver, 166 LDPC decoder, 167 BCH decoder, 168 BB descrambler, 169 Null deletion unit, 170 Demultiplexer, 300 Edge data storage memory, 301 Selector, 302 Check node calculation unit, 303 Cyclic shift circuit, 304 Edge data storage memory, 305 Selector, 306 Received data memory, 307 Variable node calculation unit, 308 Cyclic shift circuit, 309 Decoded word calculation unit, 310 Received data rearrangement unit, 311 Decoded data rearrangement unit, 601 Encoding operation unit, 602 Storage unit, 611 Code rate setting unit, 612 Initial value table read unit, 613 Check matrix generation unit, 614 Information bit read unit, 615 Encoding parity calculation unit, 616 Control unit, 701 Bus, 702 CPU, 703 ROM, 704 RAM, 705 Hard disk, 706 Output unit, 707 Input unit, 708 Communication unit, 709 Drive, 710 Input/output interface, 711 Removable recording medium, 1001 Inverse shuffling unit, 1002 Memory, 1011 Parity deinterleaver, 1101 Acquisition unit, 1101 Transmission channel decoding operation unit, 1103 Information source decoding operation unit, 1111 Output unit, 1121 Recording unit

The invention claimed is:

1. A data processing device comprising:
an encoding unit configured to perform LDPC encoding to generate an LDPC code having a code length of 16200 bits and a code rate of 8/15 based on a parity check matrix for LDPC codes; and
a shuffling unit configured to replace sign bits of the LDPC code encoded by the encoding unit with symbol bits of a symbol corresponding to one of 256 signal points defined by 256QAM,
the LDPC code encoded by the encoding unit including information bits and parity bits,
the parity check matrix including an information matrix portion corresponding to the information bits and a parity matrix portion corresponding to the parity bits,
the information matrix portion being represented by a check matrix initial value table,
the check matrix initial value table being a table that shows positions of elements "1" of the information matrix portion at intervals of 360 columns, and contains
32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464
the shuffling unit replacing
a bit b0 with a bit y2,
a bit b1 with a bit y6,
a bit b2 with a bit y1,
a bit b3 with a bit y0,
a bit b4 with a bit y7,
a bit b5 with a bit y5,
a bit b6 with a bit y3, and
a bit b7 with a bit y4,
where eight sign bits that are stored in eight storage units each having a storage capacity of 16200/8 bits and are read from the respective storage units by one bit each are assigned to one symbol, the (#1+1)th bit counted from the uppermost bit among the eight sign bits is expressed as a bit b#i, and the (#i+1)th bit counted from the uppermost bit among eight symbol bits of the one symbol is expressed as a bit y#i.

2. A data processing method comprising:
an encoding step of performing LDPC encoding to generate an LDPC code having a code length of 16200 bits and a code rate of 8/15 based on a parity check matrix for LDPC codes; and
a shuffling step of replacing sign bits of the LDPC code encoded in the encoding step with symbol bits of a symbol corresponding to one of 256 signal points defined by 256QAM,
the LDPC code encoded in the encoding step including information bits and parity bits,
the parity check matrix including an information matrix portion corresponding to the information bits and a parity matrix portion corresponding to the parity bits,
the information matrix portion being represented by a check matrix initial value table,
the check matrix initial value table being a table that shows positions of elements "1" of the information matrix portion at intervals of 360 columns, and contains
32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464
the shuffling step including replacing
a bit b0 with a bit y2,
a bit b1 with a bit y6,
a bit b2 with a bit y1,
a bit b3 with a bit y0,
a bit b4 with a bit y7,
a bit b5 with a bit y5,
a bit b6 with a bit y3, and
a bit b7 with a bit y4,
where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i.

3. A data processing device comprising:
an inverse shuffling unit configured to replace symbol bits of a symbol corresponding to one of 256 signal points defined by 256QAM with sign bits of an LDPC code having a code length of 16200 bits and a code rate of 8/15; and
a decoding unit configured to decode the LDPC code based on a parity check matrix for LDPC codes after the LDPC code is shuffled by the inverse shuffling unit,
the inverse shuffling unit replacing
a bit y2 with a bit b0,
a bit y6 with a bit b1,
a bit y1 with a bit b2,
a bit y0 with a bit b3,
a bit y7 with a bit b4,
a bit y5 with a bit b5,
a bit y3 with a bit b6, and
a bit y4 with a bit b7,
where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i,
the LDPC code including information bits and parity bits,
the parity check matrix including an information matrix portion corresponding to the information bits and a parity matrix portion corresponding to the parity bits,
the information matrix portion being represented by a check matrix initial value table,
the check matrix initial value table being a table that shows positions of elements "1" of the information matrix portion at intervals of 360 columns, and contains
32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

4. A data processing method comprising:
an inverse shuffling step of replacing symbol bits of a symbol corresponding to one of 256 signal points defined by 256QAM with sign bits of an LDPC code having a code length of 16200 bits and a code rate of 8/15; and
a decoding step of decoding the LDPC code based on a parity check matrix for LDPC codes after the LDPC code is shuffled in the inverse shuffling step,
the inverse shuffling step including replacing
a bit y2 with a bit b0,
a bit y6 with a bit b1,
a bit y1 with a bit b2,
a bit y0 with a bit b3,
a bit y7 with a bit b4,
a bit y5 with a bit b5,
a bit y3 with a bit b6, and
a bit y4 with a bit b7,
where eight sign bits that are stored in eight storage units each having a storage capacity of 16200/8 bits and are read from the respective storage units by one bit each are assigned to one symbol, the (#i+1)th bit counted from the uppermost bit among the eight sign bits is expressed as a bit b#i, and the (#i+1)th bit counted from the uppermost bit among eight symbol bits of the one symbol is expressed as a bit y#i,
the LDPC code including information bits and parity bits, the parity check matrix including an information matrix portion corresponding to the information bits and a parity matrix portion corresponding to the parity bits, the information matrix portion being represented by a check matrix initial value table, the check matrix initial value table being a table that shows positions of elements "1" of the information matrix portion at intervals of 360 columns, and contains 32 384 430 591 1296 1976 1999 2137 2175 3638 4214 4304 4486 4662 4999 5174 5700 6969 7115 7138 7189

1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 6640 6762 6786 6859 7043 7418 7431 7554

14 178 675 823 890 930 1209 1311 2898 4339 4600 5203 6485 6549 6970 7208 7218 7298 7454 7457 7462

4075 4188 7313 7553

5145 6018 7148 7507

3198 4858 6983 7033

3170 5126 5625 6901

2839 6093 7071 7450

11 3735 5413

2497 5400 7238

2067 5172 5714

1889 7173 7329

1795 2773 3499

2695 2944 6735

3221 4625 5897

1690 6122 6816

5013 6839 7358

1601 6849 7415

2180 7389 7543

2121 6838 7054

1948 3109 5046

272 1015 7464.

\* \* \* \* \*